US006045710A

United States Patent [19]

Silverbrook

[11] Patent Number: 6,045,710

[45] Date of Patent: Apr. 4, 2000

[54] SELF-ALIGNED CONSTRUCTION AND MANUFACTURING PROCESS FOR MONOLITHIC PRINT HEADS

[76] Inventor: Kia Silverbrook, 214 Catherine Street, Leichhardt NSW 2040, Australia

[21] Appl. No.: 08/750,605

[22] PCT Filed: Apr. 9, 1996

[86] PCT No.: PCT/US96/04873

§ 371 Date: Dec. 4, 1996

§ 102(e) Date: Dec. 4, 1996

[87] PCT Pub. No.: WO96/32285

PCT Pub. Date: Oct. 17, 1996

[30] Foreign Application Priority Data

Apr. 12, 1995 [AU] Australia .................................. PN2349

[51] Int. Cl.[7] .............................. H01L 21/00; B44C 1/22

[52] U.S. Cl. .................................. 216/2; 216/39; 216/62; 216/87

[58] Field of Search .................................. 216/2, 27, 39, 216/41, 56, 62, 87; 347/47, 54

[56] References Cited

U.S. PATENT DOCUMENTS

| | | | |
|---|---|---|---|
| 1,941,001 | 12/1933 | Hansell . | |
| 3,373,437 | 3/1968 | Sweet et al. . | |
| 3,416,153 | 12/1968 | Hertz et al. . | |
| 3,765,969 | 10/1973 | Kragness et al. . | |
| 3,946,398 | 3/1976 | Kyser et al. . | |
| 4,047,184 | 9/1977 | Bassous et al. | 216/27 X |
| 4,164,745 | 8/1979 | Cielo et al. . | |
| 4,166,277 | 8/1979 | Cielo et al. . | |
| 4,275,290 | 6/1981 | Cielo et al. . | |
| 4,293,865 | 10/1981 | Jinnai et al. . | |
| 4,312,009 | 1/1982 | Lange . | |
| 4,455,192 | 6/1984 | Tamai | 216/27 |
| 4,490,728 | 12/1984 | Vaught et al. . | |
| 4,580,158 | 4/1986 | Macheboeuf . | |
| 4,710,780 | 12/1987 | Saito et al. . | |
| 4,728,392 | 3/1988 | Miura et al. | 216/27 |
| 4,737,803 | 4/1988 | Fujimura et al. . | |
| 4,748,458 | 5/1988 | Inoue et al. . | |
| 4,751,532 | 6/1988 | Fujimura et al. . | |
| 4,751,533 | 6/1988 | Saito et al. . | |
| 4,752,783 | 6/1988 | Saito et al. . | |
| 5,141,596 | 8/1992 | Hawkins et al. . | |
| 5,277,754 | 1/1994 | Hadimioglu et al. . | |
| 5,277,755 | 1/1994 | O'Neill . | |
| 5,278,585 | 1/1994 | Karz et al. . | |
| 5,371,527 | 12/1994 | Miller et al. . | |

FOREIGN PATENT DOCUMENTS

| | | |
|---|---|---|
| 0 498 292 A3 | 8/1992 | European Pat. Off. . |
| 0 600 712 A2 | 6/1994 | European Pat. Off. . |
| 29 48 808 | 7/1980 | Germany . |
| 2 007 162 | 5/1979 | United Kingdom . |
| WO 90/14233 | 11/1990 | WIPO . |

*Primary Examiner*—William Powell
*Attorney, Agent, or Firm*—Milton S. Sales

[57] ABSTRACT

A manufacturing process for printing heads which operate using the coincident forces drop on demand printing principles. The print head integrates many nozzles into a single monolithic silicon structure. Semiconductor processing methods such as photolithography and chemical etching are used to simultaneously fabricate a multitude of nozzles into the monolithic head. The nozzles are etched through the silicon substrate, allowing two dimensional arrays of nozzles for color printing. The manufacturing process can be based on existing CMOS, nMOS and bipolar semiconductor manufacturing processes, allowing fabrication in existing semiconductor fabrication facilities. Drive transistors, shift registers, and fault tolerance circuitry can be fabricated on the same wafer as the nozzles. The manufacturing process uses anisotropic wet etching using KOH on a (110) wafer to form ink channels with vertical side-walls. Nozzle barrels are formed using the same etching process, using boron as an etch stop. The etching follows the crystallographic planes of the silicon, which result in highly accurate and consistent etch angles using simple etching equipment. Wafer alignment to the (110) crystallographic plane is only required to be to the standard ±1°.

17 Claims, 31 Drawing Sheets

SELF-ALIGNED CONSTRUCTION AND MANUFACTURING PROCESS FOR MONOLITHIC PRINT HEADS

CROSS REFERENCE TO RELATED APPLICATIONS

Reference is made to my commonly assigned, co-pending U.S. Pat. applications: Ser. No. 08/701,021 entitled CMOS PROCESS COMPATIBLE FABRICATION OF PRINT HEADS filed Aug. 21, 1996; Ser. No. 08/733,711 entitled CONSTRUCTION AND MANUFACTURING PROCESS FOR DROP ON DEMAND PRINT HEADS WITH NOZZLE HEATERS filed Oct. 17, 1996; Ser. No. 08/734,822 entitled A MODULAR PRINT HEAD ASSEMBLY filed Oct. 22, 1996; Ser. No. 08/736,537 entitled PRINT HEAD CONSTRUCTIONS FOR REDUCED ELECTROSTATIC INTERACTION BETWEEN PRINTED DROPLETS filed Oct. 24, 1996; Ser. No. 08/750,320 entitled NOZZLE DUPLICATION FOR FAULT TOLERANCE IN INTEGRATED PRINTING HEADS and Ser. No. 08/750,312 entitled HIGH CAPACITY COMPRESSED DOCUMENT IMAGE STORAGE FOR DIGITAL COLOR PRINTERS both filed Nov. 26, 1996; Ser. No. 08/753,718 entitled NOZZLE PLACEMENT IN MONOLITHIC DROP-ON-DEMAND PRINT BEADS and Ser. No. 08/750,606 entitled A COLOR VIDEO PRINTER AND A PHOTO CD SYSTEM WITH INTEGRATED PRINTER both filed on Nov. 27, 1996; Ser. No. 08/750,438 entitled A LIQUID INK PRINTING APPARATUS AND SYSTEM, Ser. No. 08/750,599 entitled COINCIDENT DROP SELECTION, DROP SEPARATION PRINTING METHOD AND SYSTEM, Ser. No. 08/750,435 entitled MONOLITHIC PRINT HEAD STRUCTURE AND A MANUFACTURING PROCESS THEREFOR USING ANISTROPIC WET ETCHING, Ser. No. 08/750,436 entitled POWER SUPPLY CONNECTION FOR MONOLITHIC PRINT HEADS, Ser. No. 08/750,437 entitled MODULAR DIGITAL PRINTING, Ser. No. 08/750,439 entitled A HIGH SPEED DIGITAL FABRIC PRINTER, Ser. No. 08/750,763 entitled A COLOR PHOTOCOPIER USING A DROP ON DEMAND INK JET PRINTING SYSTEM, Ser. No. 08/765,756 entitled PHOTOGRAPH PROCESSING AND COPYING SYSTEMS, Ser. No. 08/750,646 entitled FAX MACHINE WITH CONCURRENT DROP SELECTION AND DROP SEPARATION INK JET PRINTING, Ser. No. 08/759,774 entitled FAULT TOLERANCE IN HIGH VOLUME PRINTING PRESSES, Ser. No. 08/750,429 entitled INTEGRATED DRIVE CIRCUITRY IN DROP ON DEMAND PRINT HEADS, Ser. No. 08/750,433 entitled HEATER POWER COMPENSATION FOR TEMPERATURE IN THERMAL PRINTING SYSTEMS, Ser. No. 08/750,640 entitled HEATER POWER COMPENSATION FOR THERMAL LAG IN THERMAL PRINTING SYSTEMS, Ser. No. 08/750,650 entitled DATA DISTRIBUTION IN MONOLITHIC PRINT HEADS, and Ser. No. 08/750,642 entitled PRESSURIZABLE LIQUID INK CARTRIDGE FOR COINCIDENT FORCES PRINTERS all filed Dec. 3, 1996; Ser. No. 08/750,647 entitled MONOLITHIC PRINTING HEADS AND MANUFACTURING PROCESSES THEREFOR, Ser. No. 08/750,604 entitled INTEGRATED FOUR COLOR PRINT HEADS, Ser. No. 08/682,603 entitled A COLOR PLOTTER USING CONCURRENT DROP SELECTION AND DROP SEPARATION INK JET PRINTING TECHNOLOGY, Ser. No. 08/750,603 entitled A NOTEBOOK COMPUTER WITH INTEGRATED CONCURRENT DROP SELECTION AND DROP SEPARATION COLOR PRINTING SYSTEM, Ser. No. 08/765,130 entitled INTEGRATED FAULT TOLERANCE IN PRINTING MECHANISMS; Ser. No. 08/750,431 entitled BLOCK FAULT TOLERANCE IN INTEGRATED PRINTING HEADS, Ser. No. 08/750,607 entitled FOUR LEVEL INK SET FOR BI-LEVEL COLOR PRINTING, Ser. No. 08/750,430 entitled A NOZZLE CLEARING PROCEDURE FOR LIQUID INK PRINTING, Ser. No. 08/750,600 entitled METHOD AND APPARATUS FOR ACCURATE CONTROL OF TEMPERATURE PULSES IN PRINTING HEADS, Ser. No. 08/750,608 entitled A PORTABLE PRINTER USING A CONCURRENT DROP SELECTION AND DROP SEPARATION PRINTING SYSTEM, and Ser. No. 08/750,602 entitled IMPROVEMENTS IN IMAGE HALFTONING all filed Dec. 4, 1996; Ser. No. 08/765,127 entitled PRINTING METHOD AND APPARATUS EMPLOYING ELECTROSTATIC DROP SEPARATION, Ser. No. 08/750,643 entitled COLOR OFFICE PRINTER WITH A HIGH CAPACITY DIGITAL PAGE IMAGE STORE, and Ser. No. 08/765,035 entitled HEATER POWER COMPENSATION FOR PRINTING LOAD IN THERMAL PRINTING SYSTEMS all filed Dec. 5, 1996; Ser. No. 08/765,036 entitled APPARATUS FOR PRINTING MULTIPLE DROP SIZES AND FABRICATION THEREOF, Ser. No. 08/765,017 entitled HEATER STRUCTURE AND FABRICATION PROCESS FOR MONOLITHIC PRINT HEADS, Ser. No. 08/750,772 entitled DETECTION OF FAULTY ACTUATORS IN PRINTING HEADS, Ser. No. 08/765,037 entitled PAGE IMAGE AND FAULT TOLERANCE CONTROL APPARATUS FOR PRINTING SYSTEMS all filed Dec. 9, 1996; and Ser. No. 08/765,038 entitled CONSTRUCTIONS AND MANUFACTURING PROCESSES FOR THERMALLY ACTIVATED PRINT HEADS filed Dec. 10, 1996.

FIELD OF THE INVENTION

The present invention is in the field of computer controlled printing devices. In particular, the field is constructions and manufacturing processes for thermally activated drop on demand (DOD) printing heads which integrate multiple nozzles on a single substrate.

BACKGROUND OF THE INVENTION

Many different types of digitally controlled printing systems have been invented, and many types are currently in production. These printing systems use a variety of actuation mechanisms, a variety of marking materials, and a variety of recording media. Examples of digital printing systems in current use include: laser electrophotographic printers; LED electrophotographic printers; dot matrix impact printers; thermal paper printers; film recorders; thermal wax printers; dye diffusion thermal transfer printers; and ink jet printers. However, at present, such electronic printing systems have not significantly replaced mechanical printing presses, even though this conventional method requires very expensive setup and is seldom commercially viable unless a few thousand copies of a particular page are to be printed. Thus, there is a need for improved digitally controlled printing systems, for example, being able to produce high quality color images at a high-speed and low cost, using standard paper.

Inkjet printing has become recognized as a prominent contender in the digitally controlled, electronic printing arena because, e.g., of its non-impact, low-noise characteristics, its use of plain paper and its avoidance of toner transfers and fixing.

Many types of ink jet printing mechanisms have been invented. These can be categorized as either continuous ink jet (CIJ) or drop on demand (DOD) ink jet. Continuous ink jet printing dates back to at least 1929: Hansell, U.S. Pat. No. 1,941,001.

Sweet et al U.S. Pat. No. 3,373,437, 1967, discloses an array of continuous ink jet nozzles where ink drops to be printed are selectively charged and deflected towards the recording medium. This technique is known as binary deflection CIJ, and is used by several manufacturers, including Elmjet and Scitex.

Hertz et al U.S. Pat. No. 3,416,153, 1966, discloses a method of achieving variable optical density of printed spots in CIJ printing using the electrostatic dispersion of a charged drop stream to modulate the number of droplets which pass through a small aperture. This technique is used in ink jet printers manufactured by Iris Graphics.

Kyser et al U.S. Pat. No. 3,946,398, 1970, discloses a DOD ink jet printer which applies a high voltage to a piezoelectric crystal, causing the crystal to bend, applying pressure on an ink reservoir and jetting drops on demand. Many types of piezoelectric drop on demand printers have subsequently been invented, which utilize piezoelectric crystals in bend mode, push mode, shear mode, and squeeze mode. Piezoelectric DOD printers have achieved commercial success using hot melt inks (for example, Tektronix and Dataproducts printers), and at image resolutions up to 720 dpi for home and office printers (Seiko Epson). Piezoelectric DOD printers have an advantage in being able to use a wide range of inks. However, piezoelectric printing mechanisms usually require complex high voltage drive circuitry and bulky piezoelectric crystal arrays, which are disadvantageous in regard to manufacturability and performance.

Endo et al GB Pat. No. 2,007,162, 1979, discloses an electrothermal DOD ink jet printer which applies a power pulse to an electrothermal transducer (heater) which is in thermal contact with ink in a nozzle. The heater rapidly heats water based ink to a high temperature, whereupon a small quantity of ink rapidly evaporates, forming a bubble. The formation of these bubbles results in a pressure wave which cause drops of ink to be ejected from small apertures along the edge of the heater substrate. This technology is known as Bubblejet™ (trademark of Canon K.K. of Japan), and is used in a wide range of printing systems from Canon, Xerox, and other manufacturers.

Vaught et al U.S. Pat. No. 4,490,728, 1982, discloses an electrothermal drop ejection system which also operates by bubble formation. In this system, drops are ejected in a direction normal to the plane of the heater substrate, through nozzles formed in an aperture plate positioned above the heater. This system is known as Thermal Ink Jet, and is manufactured by Hewlett-Packard. In this document, the term Thermal Ink Jet is used to refer to both the Hewlett-Packard system and systems commonly known as Bubblejet™.

Thermal Ink Jet printing typically requires approximately 20 $\mu$J over a period of approximately 2 $\mu$s to eject each drop. The 10 Watt active power consumption of each heater is disadvantageous in itself and also necessitates special inks, complicates the driver electronics and precipitates deterioration of heater elements.

Other ink jet printing systems have also been described in technical literature, but are not currently used on a commercial basis. For example, U.S. Pat. No. 4,275,290 discloses a system wherein the coincident address of predetermined print head nozzles with heat pulses and hydrostatic pressure, allows ink to flow freely to spacer-separated paper, passing beneath the print head. U.S. Pat. Nos. 4,737,803; 4,737,803 and 4,748,458 disclose ink jet recording systems wherein the coincident address of ink in print head nozzles with heat pulses and an electrostatically attractive field cause ejection of ink drops to a print sheet.

Each of the above-described inkjet printing systems has advantages and disadvantages. However, there remains a widely recognized need for an improved ink jet printing approach, providing advantages for example, as to cost, speed, quality, reliability, power usage, simplicity of construction and operation, durability and consumables.

SUMMARY OF THE INVENTION

My concurrently filed applications, entitled "Liquid Ink Printing Apparatus and System" and "Coincident Drop-Selection, Drop-Separation Printing Method and System" describe new methods and apparatus that afford significant improvements toward overcoming the prior art problems discussed above. Those inventions offer important advantages, e.g., in regard to drop size and placement accuracy, as to printing speeds attainable, as to power usage, as to durability and operative thermal stresses encountered and as to other printer performance characteristics, as well as in regard to manufacturability and the characteristics of useful inks. One important purpose of the present invention is to further enhance the structures and methods described in those applications and thereby contribute to the advancement of printing technology.

Thus, one important object of the invention is to provide improved manufacturing process construction for thermally activated drop on demand printing heads.

In one aspect the invention constitutes a process for manufacturing a thermally activated drop on demand printing head comprising the steps of doping a print head substrate with an etch stopping material in a manner defining a plurality of undoped nozzle regions and etching said substrate to form a plurality of nozzle passages defined by the doped substrate material.

In another aspect the invention constitutes a drop on demand print head comprising a silicon substrate having a plurality of spaced nozzle passages defined at least, in part, by surrounding substrate material having an etch stopping material doped therein.

A further preferred aspect of the invention is that the substrate is composed of single crystal silicon.

A further preferred aspect of the invention is that the substrate is a single crystal silicon wafer of (110) crystallographic orientation.

A further preferred aspect of the invention is that the surface layer is composed of silicon dioxide.

A further preferred aspect of the invention is that the nozzle tip hole is fabricated with a radius less than 50 microns.

A further preferred aspect of the invention is that the ink channels are etched exposing {111} crystallographic planes of the substrate.

A further preferred aspect of the invention is that the etchant used for the anisotropic etching includes potassium hydroxide.

A further preferred aspect of the invention is that the etch stop comprises boron doping of the silicon substrate.

A further preferred aspect of the invention is that drive circuitry is fabricated on the same substrate as the nozzles.

BRIEF DESCRIPTION OF THE DRAWINGS

FIG. 1(*b*) shows a cross section of one variety of nozzle tip in accordance with the invention.

FIG. 3(*b*) shows successive meniscus positions during drop selection and separation.

FIG. 3(*c*) shows the temperatures at various points during a drop selection cycle.

FIG. 3(*d*) shows measured surface tension versus temperature curves for various ink additives.

FIG. 3(*e*) shows the power pulses which are applied to the nozzle heater to generate the temperature curves of FIG. 3(*c*)

FIG. 10(*b*) is a detail enlargement of the region around three of the nozzles shown in FIG. 10(*a*).

FIGS. 11(*b*), 11(*d*), 11(*f*), 11(*h*), and 11(*j*) are plots of the meniscus shape at various instants for various nozzle barrel geometries.

DETAILED DESCRIPTION OF THE PREFERRED EMBODIMENT

Figure 1A:
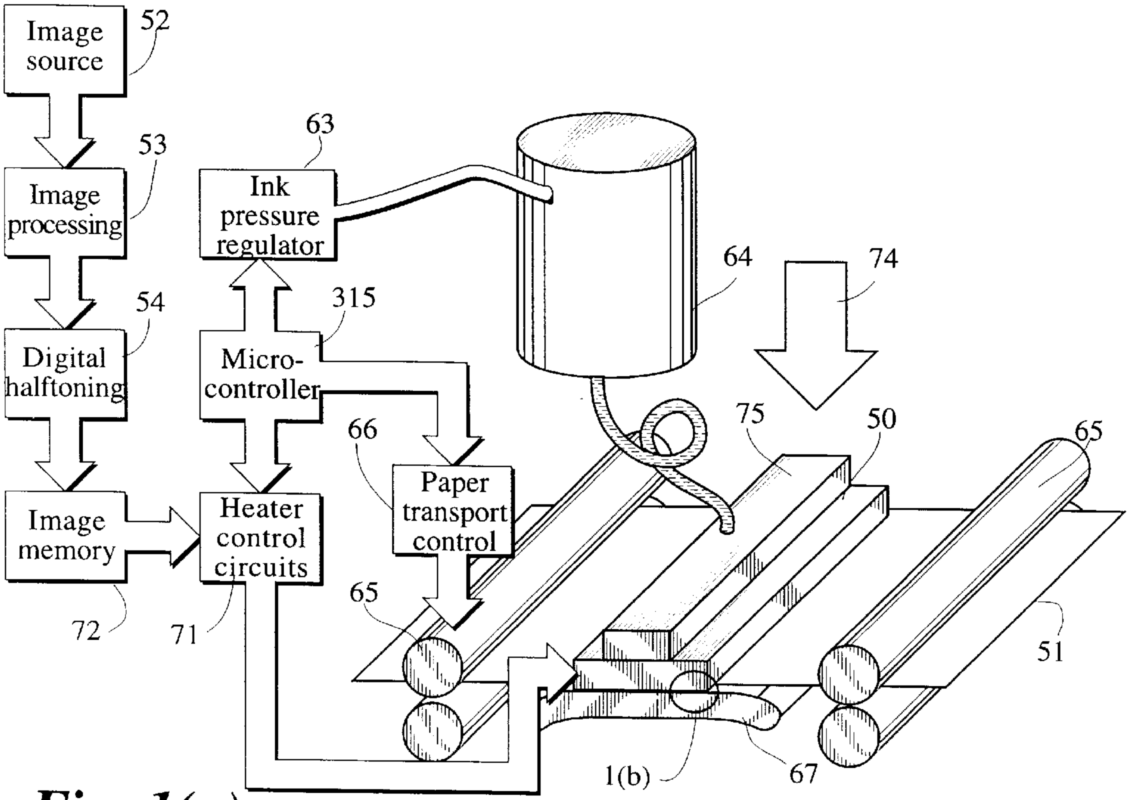
FIG. 1(*a*) shows a simplified block schematic diagram of one exemplary printing apparatus according to the present invention.

In one general aspect, the invention constitutes a drop-on-demand printing mechanism wherein the means of selecting drops to be printed produces a difference in position between selected drops and drops which are not selected, but which is insufficient to cause the ink drops to overcome the ink surface tension and separate from the body of ink, and wherein an alternative means is provided to cause separation of the selected drops from the body of ink.

The separation of drop selection means from drop separation means significantly reduces the energy required to select which ink drops are to be printed. Only the drop selection means must be driven by individual signals to each nozzle. The drop separation means can be a field or condition applied simultaneously to all nozzles.

The drop selection means may be chosen from, but is not limited to, the following list:

1) Electrothermal reduction of surface tension of pressurized ink
2) Electrothermal bubble generation, with insufficient bubble volume to cause drop ejection
3) Piezoelectric, with insufficient volume change to cause drop ejection
4) Electrostatic attraction with one electrode per nozzle The drop separation means may be chosen from, but is not limited to, the following list:

1) Proximity (recording medium in close proximity to print head)
2) Proximity with oscillating ink pressure
3) Electrostatic attraction
4) Magnetic attraction The table "DOD printing technology targets" shows some desirable characteristics of drop on demand printing technology. The table also lists some methods by which some embodiments described herein, or in other of my related application, provide improvements over the prior art.

| Target | Method of achieving improvement over prior art |
|---|---|
| High speed operation | Practical, low cost, pagewidth printing heads with more than 10,000 nozzles. Monolithic A4 pagewidth print heads can be manufactured using standard 300 mm (12") silicon wafers |
| High image quality | High resolution (800 dpi is sufficient for most applications), six color process to reduce image noise |
| Full color operation | Halftoned process color at 800 dpi using stochastic screening |
| Ink flexibility | Low operating ink temperature and no requirement for bubble formation |
| Low power requirements | Low power operation results from drop selection means not being required to fully eject drop |
| Low cost | Monolithic print head without aperture plate, high manufacturing yield, small number of electrical connections, use of modified existing CMOS manufacturing facilities |
| High manufacturing yield | Integrated fault tolerance in printing head |
| High reliability | Integrated fault tolerance in printing head. Elimination of cavitation and kogation. Reduction of thermal shock. |
| Small number of electrical connections | Shift registers, control logic, and drive circuitry can be integrated on a monolithic print head using standard CMOS processes |
| Use of existing VLSI manufacturing facilities | CMOS compatibility. This can be achieved because the heater drive power is less is than 1% of Thermal Ink Jet heater drive power |
| Electronic collation | A new page compression system which can achieve 100:1 compression with insignificant image degradation, resulting in a compressed data rate low enough to allow real-time printing of any combination of thousands of pages stored on a low cost magnetic disk drive. |

In thermal ink jet (TIJ) and piezoelectric ink jet systems, a drop velocity of approximately 10 meters per second is preferred to ensure that the selected ink drops overcome ink surface tension, separate from the body of the ink, and strike the recording medium. These systems have a very low efficiency of conversion of electrical energy into drop kinetic energy. The efficiency of TIJ systems is approximately 0.02%). This means that the drive circuits for TIJ print heads must switch high currents. The drive circuits for piezoelectric ink jet heads must either switch high voltages, or drive highly capacitive loads. The total power consumption of pagewidth TIJ printheads is also very high. An 800 dpi A4 full color pagewidth TIJ print head printing a four color black image in one second would consume approximately 6 kW of electrical power, most of which is converted to waste heat. The difficulties of removal of this amount of heat precludes the production of low cost, high speed, high resolution compact pagewidth TIJ systems.

One important feature of embodiments of the invention is a means of significantly reducing the energy required to select which ink drops are to be printed. This is achieved by separating the means for selecting ink drops from the means for ensuring that selected drops separate from the body of ink and form dots on the recording medium. Only the drop selection means must be driven by individual signals to each nozzle. The drop separation means can be a field or condition applied simultaneously to all nozzles.

The table "Drop selection means" shows some of the possible means for selecting drops in accordance with the invention. The drop selection means is only required to create sufficient change in the position of selected drops that the drop separation means can discriminate between selected and unselected drops.

| Method | Advantage | Limitation |
|---|---|---|
| 1. Electrothermal reduction of surface tension of pressurized ink | Low temperature increase and low drop selection energy. Can be used with many ink types. Simple fabrication. CMOS drive circuits can be fabricated on same substrate | Requires ink pressure regulating mechanism. Ink surface tension must reduce substantially as temperature increases |
| 2. Electrothermal reduction of ink viscosity, combined with oscillating ink pressure | Medium drop selection energy, suitable for hot melt and oil based inks. Simple fabrication. CMOS drive circuits can be fabricated on same substrate | Requires ink pressure oscillation mechanism. Ink must have a large decrease in viscosity as temperature increases |
| 3. Electrothermal bubble generation, with insufficient bubble volume to cause drop ejection | Well know.n technology, simple fabrication, bipolar drive circuits can be fabricated on same substrate | High drop selection energy, requires water based ink, problems with kogation, cavitation, thermal stress |
| 4. Piezoelectric, with insufficient volume change to cause drop ejection | Many types of ink base can be used | High manufacturing cost incompatible with integrated circuit processes, high drive voltage, mechanical complexity, bulky |
| 5. Electrostatic attraction with one electrode per nozzle | Simple electrode fabrication | Nozzle pitch must be relatively large. Crosstalk between adjacent electric fields. Requires high voltage drive circuits |

Other drop selection means may also be used.

The preferred drop selection means for water based inks is method 1: "Electrothermal reduction of surface tension of pressurized ink". This drop selection means provides many advantages over other systems, including; low power operation (approximately 1% of TIJ), compatibility with CMOS VLSI chip fabrication, low voltage operation (approx. 10 V), high nozzle density, low temperature operation, and wide range of suitable ink formulations. The ink must exhibit a reduction in surface tension with increasing temperature.

The preferred drop selection means for hot melt or oil based inks is method 2: "Electrothermal reduction of ink viscosity, combined with oscillating ink pressure". This drop selection means is particularly suited for use with inks which exhibit a large reduction of viscosity with increasing temperature, but only a small reduction in surface tension. This occurs particularly with non-polar ink carriers with relatively high molecular weight. This is especially applicable to hot melt and oil based inks.

The, table "Drop separation means" shows some of the possible methods for separating selected drops from the body of ink, and ensuring that the selected drops form dots on the printing medium. The drop separation means discriminates between selected drops and unselected drops to ensure that unselected drops do not form dots on the printing medium.

| Means | Advantage | Limitation |
|---|---|---|
| 1. Electrostatic attraction | Can print on rough surfaces, simple implementation | Requires high voltage power supply |
| 2. AC electric field | Higher field strength is possible than electrostatic, operating margins can be increased, ink pressure reduced, and dust accumulation is reduced | Requires high voltage AC power supply synchronized to drop ejection phase. Multiple drop phase operation is difficult |
| 3. Proximity (print head in close proximity to, but not touching, recording medium) | Very small spot sizes can be achieved. Very low power dissipation. High drop position accuracy | Requires print medium to be very close to print head surface, not suitable for rough print media, usually requires transfer roller or belt |
| 4. Transfer Proximity (print head is in close proximity to a transfer roller or belt | Very small spot sizes can be achieved, very low power dissipation, high accuracy, can print on rough paper | Not compact due to size of transfer roller or transfer belt. |
| 5. Proximity with oscillating ink pressure | Useful for hot melt inks using viscosity reduction drop selection method, reduces possibility of nozzle clogging, can use pigments instead of dyes | Requires print medium to be very close to print head surface, not suitable for rough print media. Requires ink pressure oscillation apparatus |
| 6. Magnetic attraction | Can print on rough surfaces. Low power if permanent magnets are used | Requires uniform high magnetic field strength, requires magnetic ink |

Other drop separation means may also be used.

The preferred drop separation means depends upon the intended use. For most applications, method 1: "Electrostatic attraction", or method 2: "AC electric field" are most appropriate. For applications where smooth coated paper or film is used, and very high speed is not essential, method 3: "Proximity" may be appropriate. For high speed, high quality systems, method 4: "Transfer proximity" can be used. Method 6: "Magnetic attraction" is appropriate for portable printing systems where the print medium is too rough for proximity printing, and the high voltages required for electrostatic drop separation are undesirable. There is no clear 'best' drop separation means which is applicable to all circumstances.

Further details of various types of printing systems according to the present invention are described in the following Australian patent specifications filed on 12 Apr. 1995, the disclosure of which are hereby incorporated by reference:

'A Liquid ink Fault Tolerant printing mechanism' (Filing no.: PN2308);

'Electrothermal drop selection in printing' (Filing no.: PN2309);

'Drop separation in printing by print media proximity' (Filing no.: PN2310);

'Drop size adjustment in Proximity printing by varying head to media distance' (Filing no.: PN2311);

'Augmenting Proximity printing with acoustic ink waves' (Filing no.: PN2312);

'Electrostatic drop separation in printing' (Filing no.: PN2313);

'Multiple simultaneous drop sizes in Proximity printing' (Filing no.: PN2321);

'Self cooling operation in thermally activated print heads' (Filing no.: PN2322); and 'Thermal Viscosity Reduction printing' (Filing no.: PN2323).

Figure 1B:
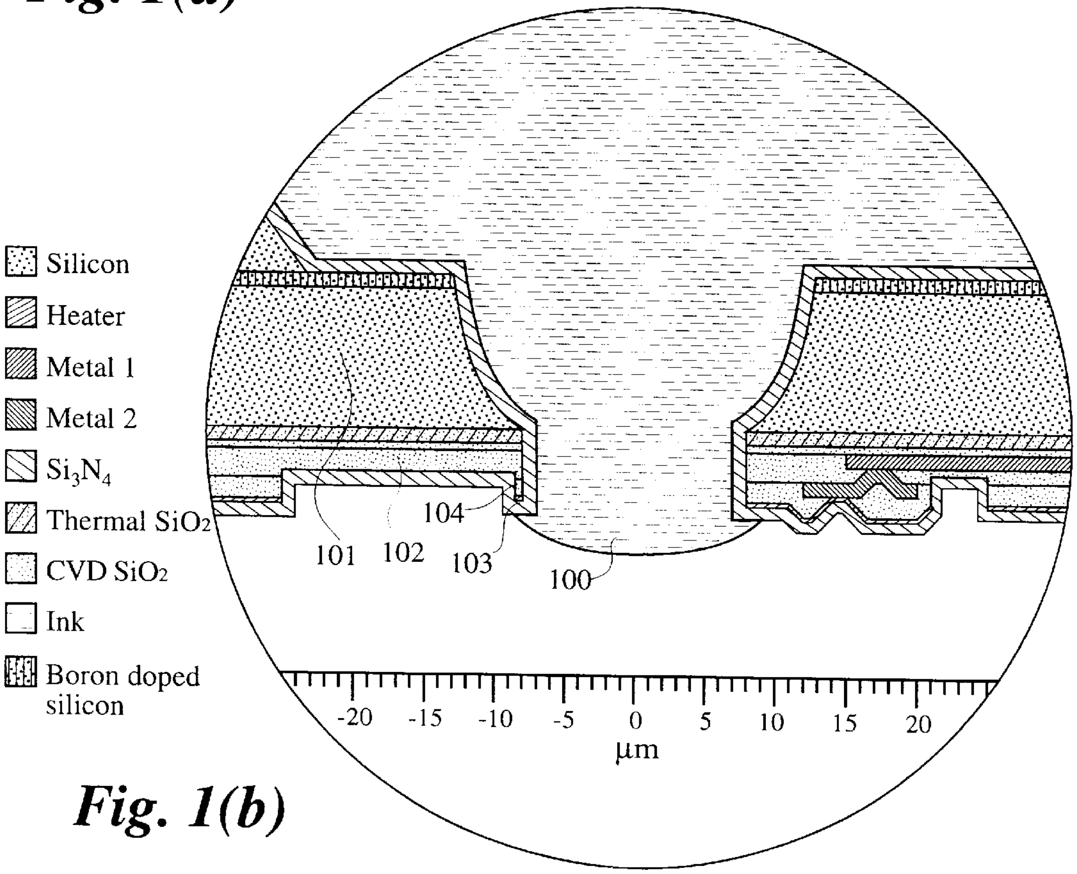
Figure 2A:
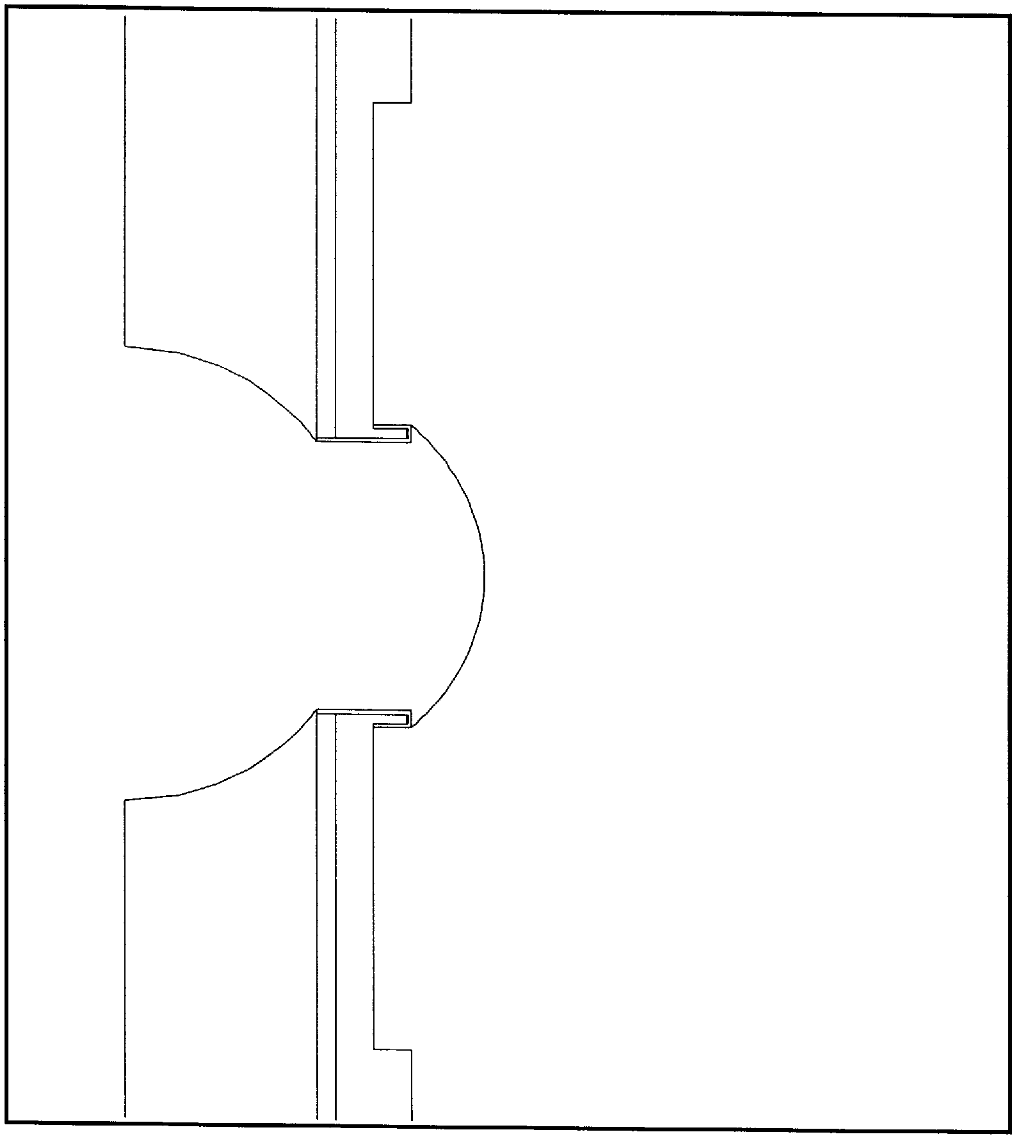
FIGS. 2(*a*) to 2(*f*) show fluid dynamic simulations of drop selection.
Figure 2B:
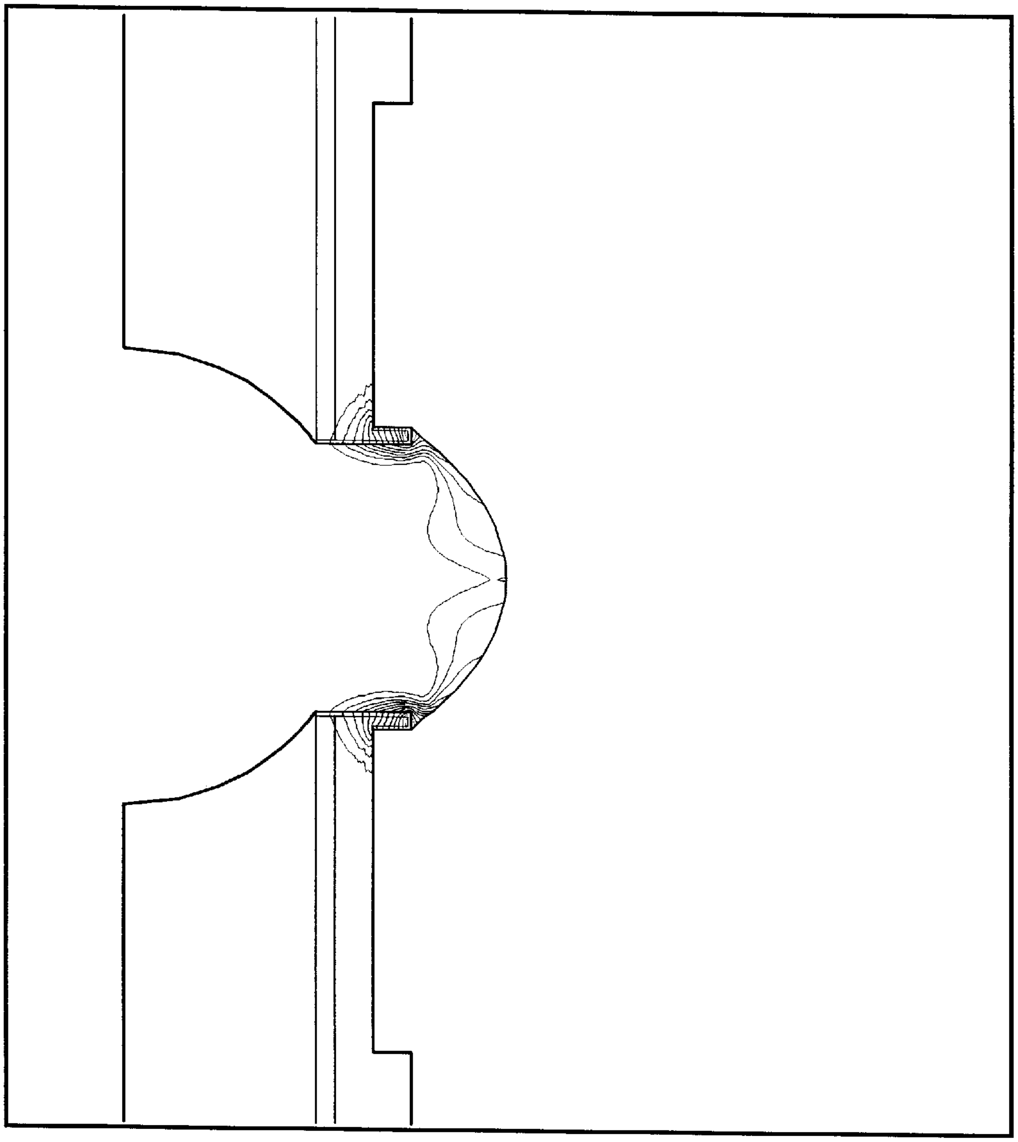
Figure 2C:
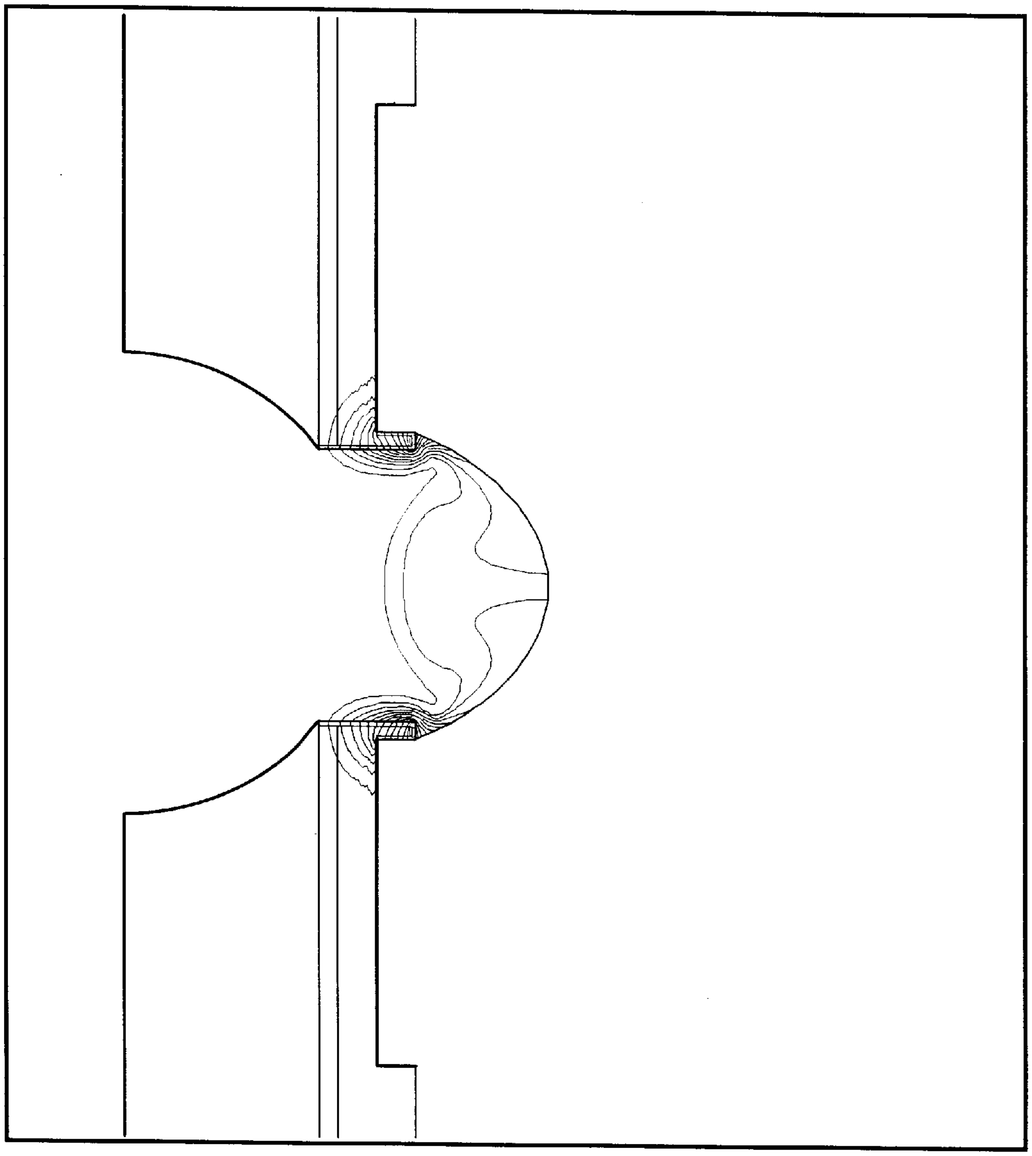
Figure 2D:
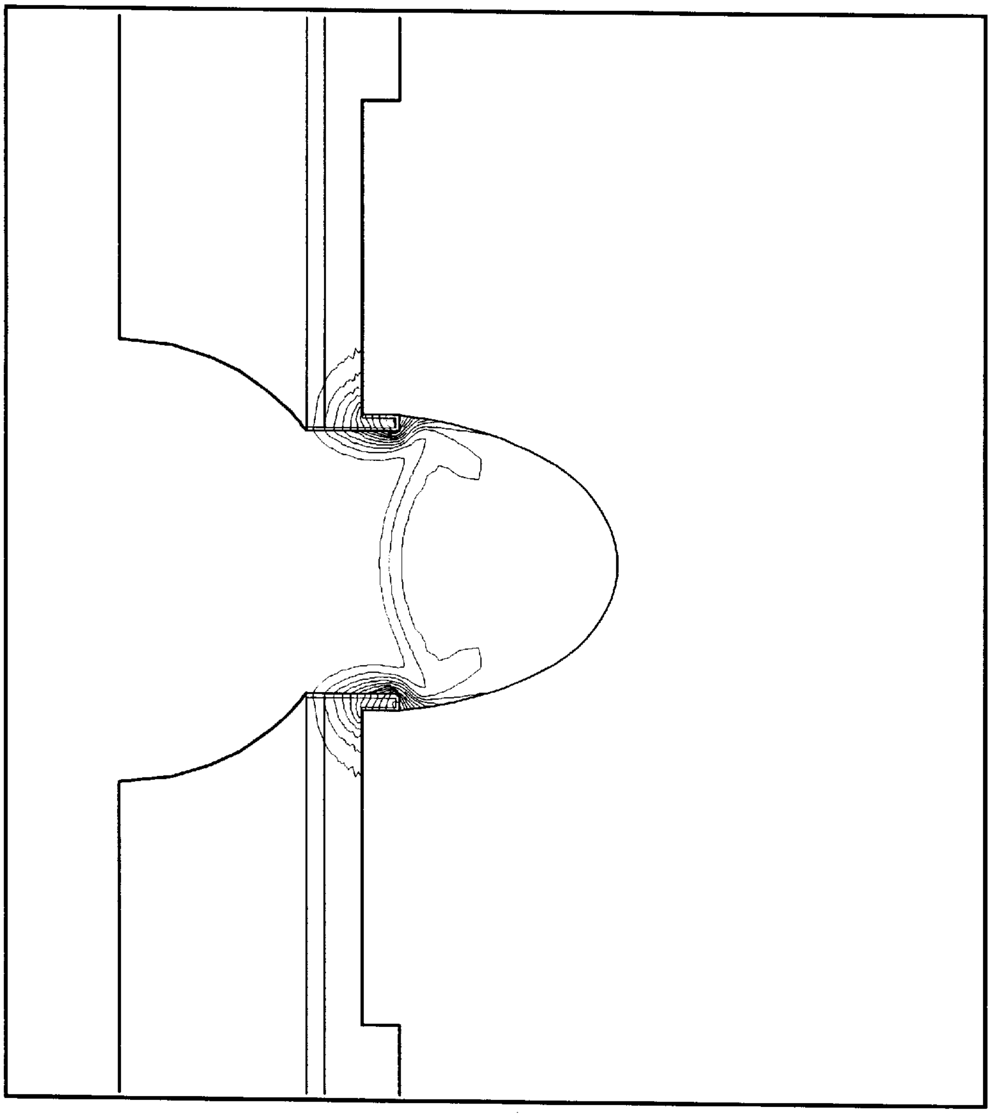
Figure 2E:
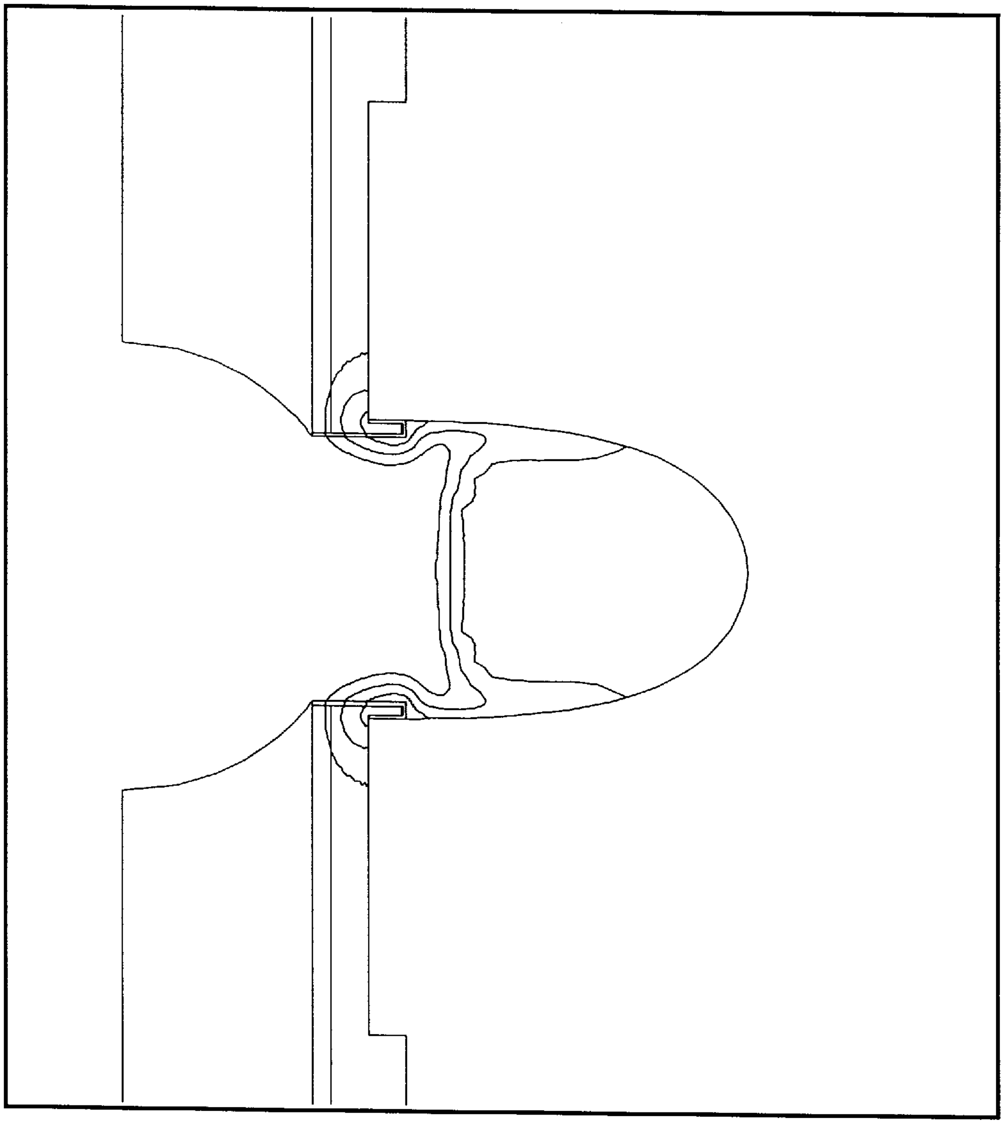
Figure 2F:
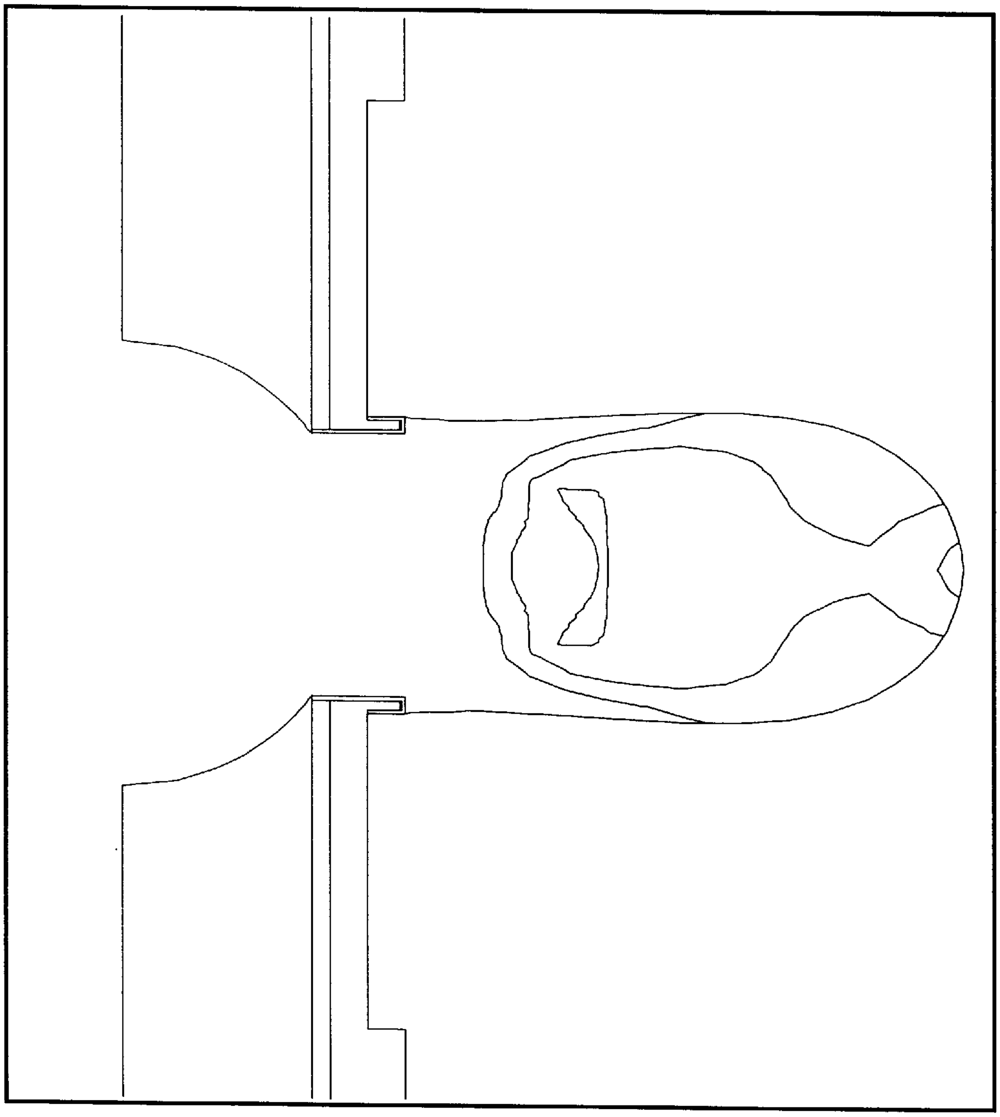
Figure 3A:
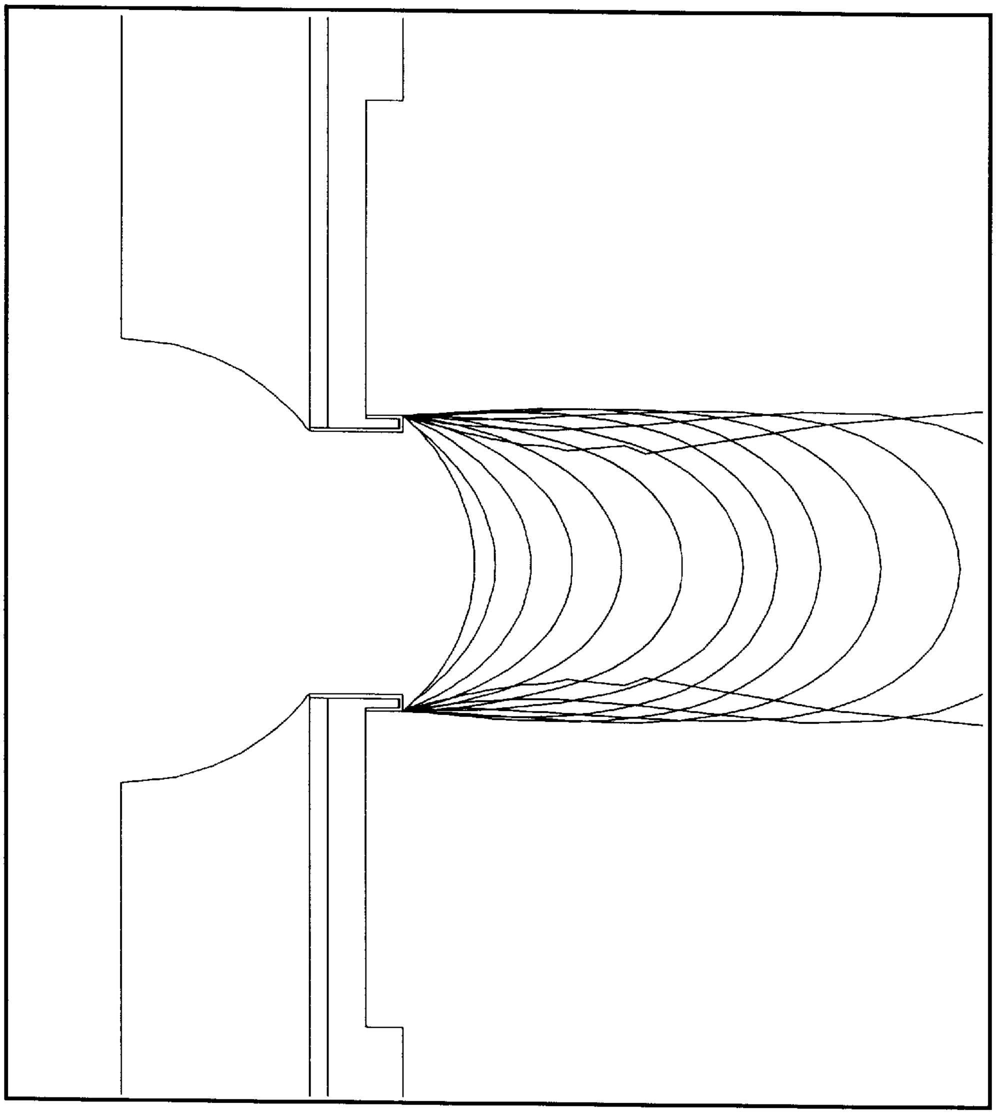
FIG. 3(*a*) shows a finite element fluid dynamic simulation of a nozzle in operation according to an embodiment of the invention.
Figure 3B:
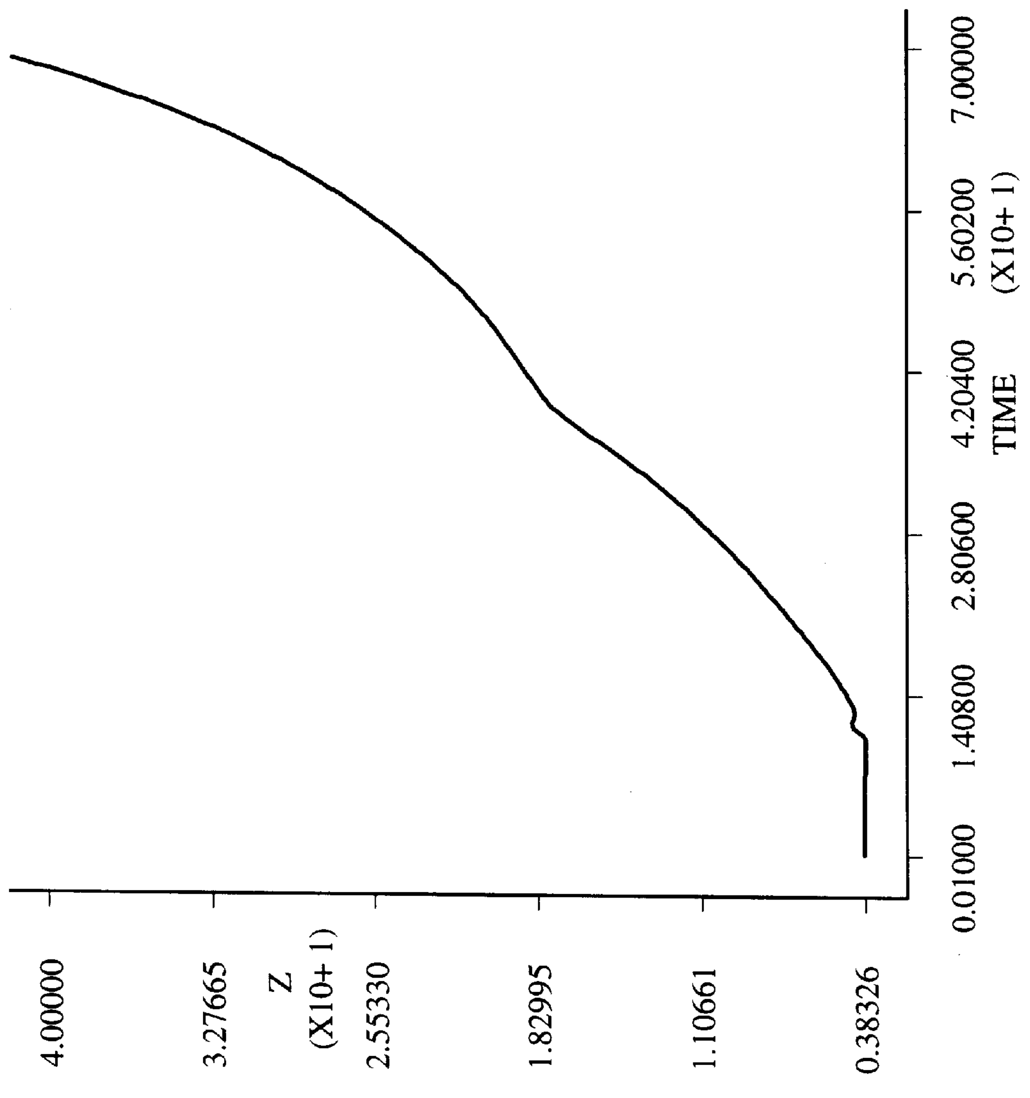
Figure 3C:
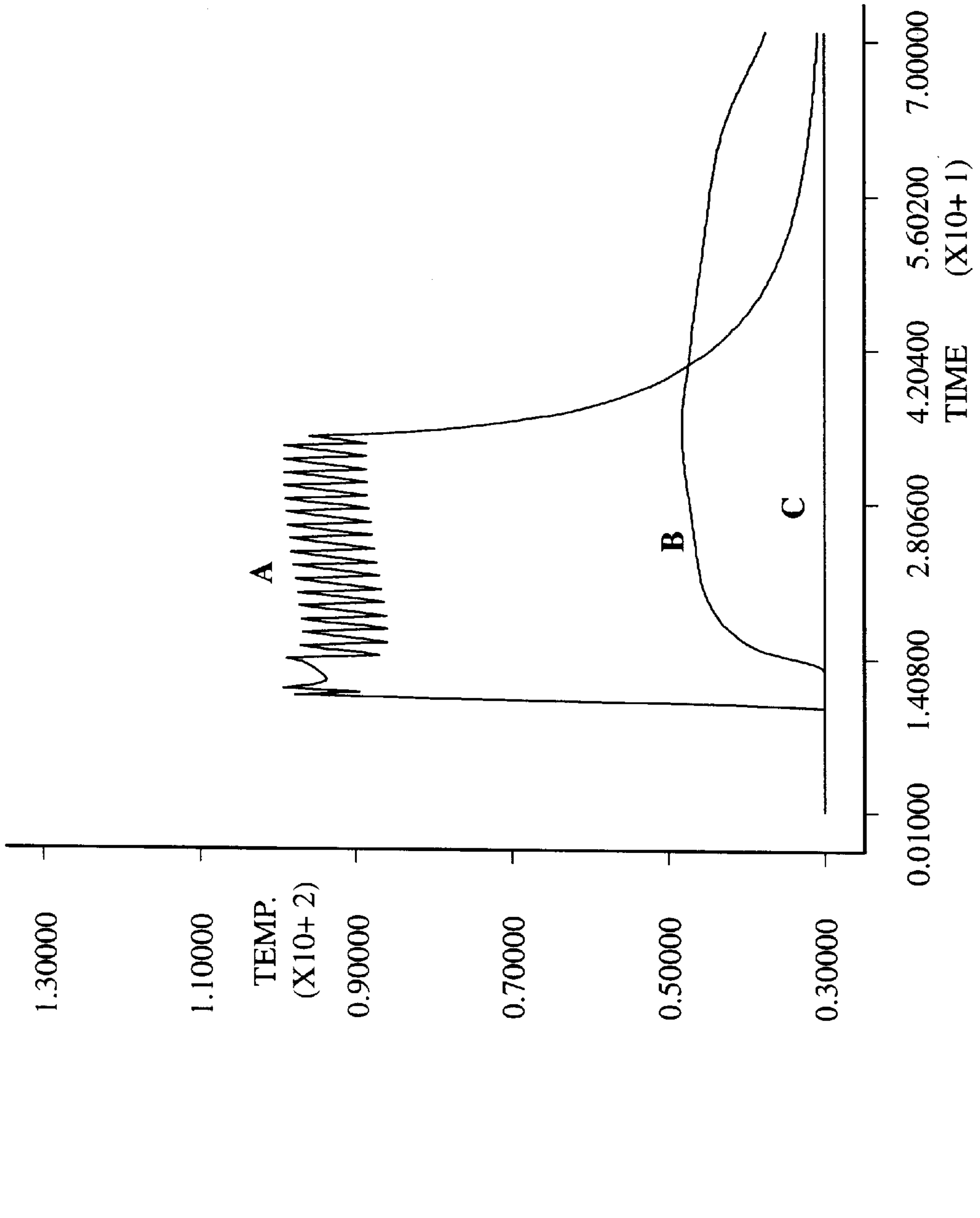
Figure 3D:
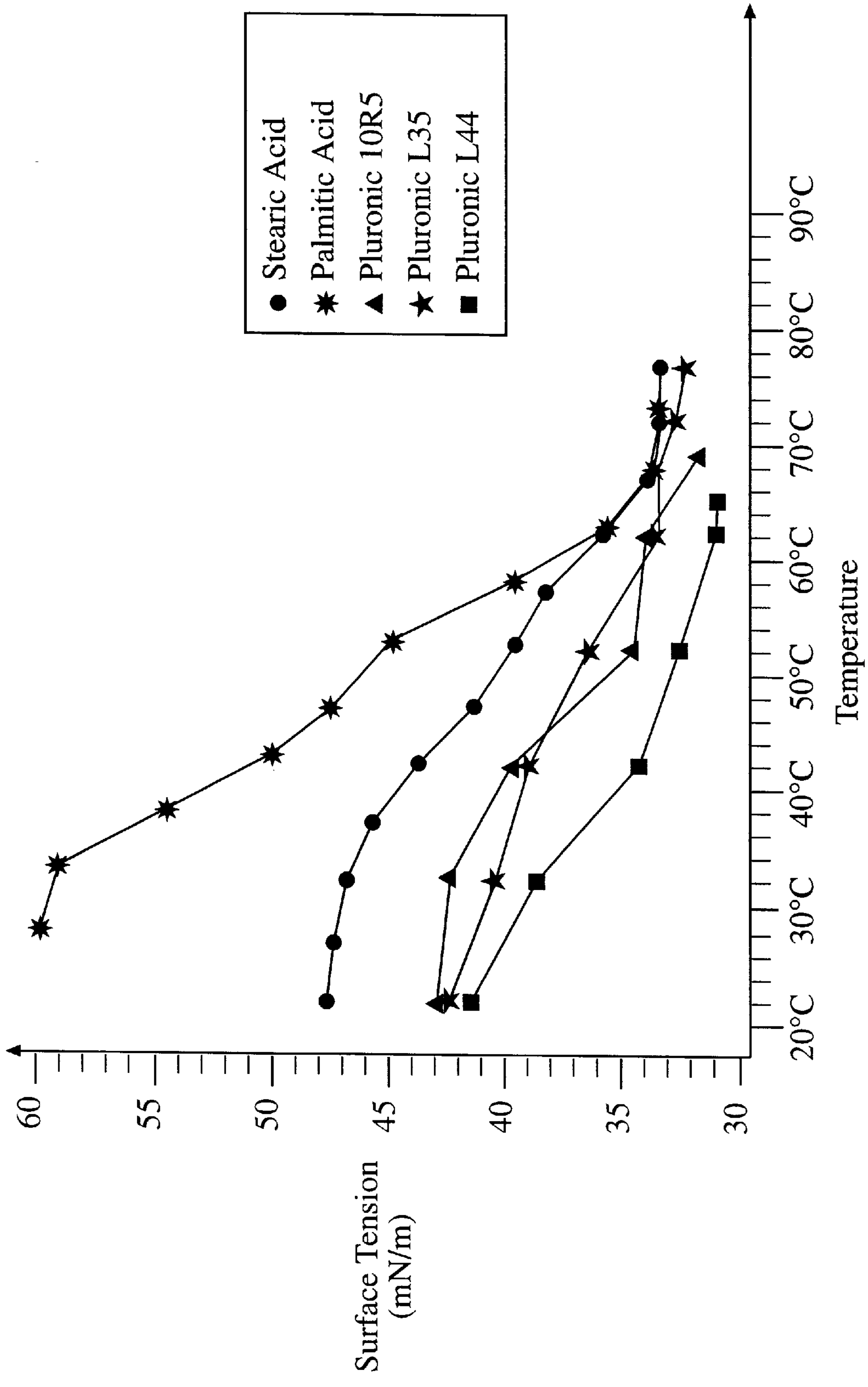
Figure 3E:
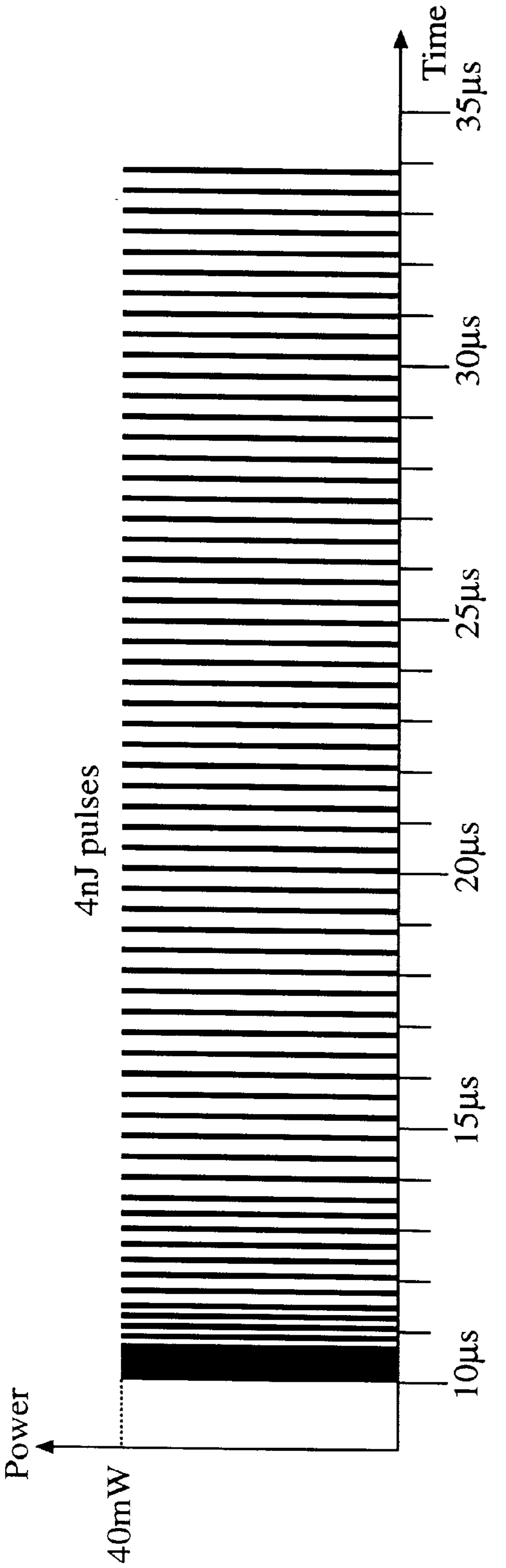

A simplified schematic diagram of one preferred printing system according to the invention appears in FIG. 1(*a*).

An image source 52 may be raster image data from a scanner or computer, or outline image data in the form of a page description language (PDL), or other forms of digital image representation. This image data is converted to a pixel-mapped page image by the image processing system 53. This may be a raster image processor (RIP) in the case of PDL image data, or may be pixel image manipulation in the case of raster image data. Continuous tone data produced by the image processing unit 53 is halftoned. Halftoning is performed by the Digital Halftoning unit 54. Halftoned bitmap image data is stored in the image memory 72. Depending upon the printer and system configuration, the image memory 72 may be a full page memory, or a band memory. Heater control circuits 71 read data from the image memory 72 and apply time-varying electrical pulses to the nozzle heaters (103 in FIG. 1(*b*)) that are part of the print head 50. These pulses are applied at an appropriate time, and to the appropriate nozzle, so that selected drops will form spots on the recording medium 51 in the appropriate position designated by the data in the image memory 72.

The recording medium 51 is moved relative to the head 50 by a paper transport system 65, which is electronically controlled by a paper transport control system 66, which in turn is controlled by a microcontroller 315. The paper transport system shown in FIG. 1(*a*) is schematic only, and many different mechanical configurations are possible. In the case of pagewidth print heads, it is most convenient to move the recording medium 51 past a stationary head 50. However, in the case of scanning print systems, it is usually most convenient to move the head 50 along one axis (the sub-scanning direction) and the recording medium 51 along the orthogonal axis (the main scanning direction), in a relative raster motion. The microcontroller 315 may also control the ink pressure regulator 63 and the heater control circuits 71.

For printing using surface tension reduction, ink is contained in an ink reservoir 64 under pressure. In the quiescent state (with no ink drop ejected), the ink pressure is insufficient to overcome the ink surface tension and eject a drop. A constant ink pressure can be achieved by applying pressure to the ink reservoir 64 under the control of an ink pressure regulator 63. Alternatively, for larger printing systems, the ink pressure can be very accurately generated and controlled by situating the top surface of the ink in the reservoir 64 an appropriate distance above the head 50. This ink level can be regulated by a simple float valve (not shown).

For printing using viscosity reduction, ink is contained in an ink reservoir 64 under pressure, and the ink pressure is caused to oscillate. The means of producing this oscillation may be a piezoelectric actuator mounted in the ink channels (not shown).

When properly arranged with the drop separation means, selected drops proceed to form spots on the recording medium 51, while unselected drops remain part of the body of ink.

The ink is distributed to the back surface of the head 50 by an ink channel device 75. The ink preferably flows through slots and/or holes etched through the silicon substrate of the head 50 to the front surface, where the nozzles and actuators are situated. In the case of thermal selection, the nozzle actuators are electrothermal heaters.

In some types of printers according to the invention, an external field 74 is required to ensure that the selected drop separates from the body of the ink and moves towards the recording medium 51. A convenient external field 74 is a constant electric field, as the ink is easily made to be electrically conductive. In this case, the paper guide or platen 67 can be made of electrically conductive material and used as one electrode generating the electric field. The other electrode can be the head 50 itself. Another embodiment uses proximity of the print medium as a means of discriminating between selected drops and unselected drops.

For small drop sizes gravitational force on the ink drop is very small; approximately $10^{-4}$ of the surface tension forces, so gravity can be ignored in most cases. This allows the print head 50 and recording medium 51 to be oriented in any direction in relation to the local gravitational field. This is an important requirement for portable printers.

FIG. 1(*b*) is a detail enlargement of a cross section of a single microscopic nozzle tip embodiment of the invention, fabricated using a modified CMOS process. The nozzle is etched in a substrate 101, which may be silicon, glass, metal, or any other suitable material. If substrates which are not semiconductor materials are used, a semiconducting material (such as amorphous silicon) may be deposited on the substrate, and integrated drive transistors and data distribution circuitry may be formed in the surface semiconducting layer. Single crystal silicon (SCS) substrates have several advantages, including:

1) High performance drive transistors and other circuitry can be fabricated in SCS;
2) Print heads can be fabricated in existing facilities (fabs) using standard VLSI processing equipment;
3) SCS has high mechanical strength and rigidity; and
4) SCS has a high thermal conductivity.

In this example, the nozzle is of cylindrical form, with the heater 103 forming an annulus. The nozzle tip 104 is formed from silicon dioxide layers 102 deposited during the fabrication of the CMOS drive circuitry. The nozzle tip is passivated with silicon nitride. The protruding nozzle tip controls the contact point of the pressurized ink 100 on the print head surface. The print head surface is also hydrophobized to prevent accidental spread of ink across the front of the print head.

Many other configurations of nozzles are possible, and nozzle embodiments of the invention may vary in shape, dimensions, and materials used. Monolithic nozzles etched from the substrate upon which the heater and drive electronics are formed have the advantage of not requiring an orifice plate. The elimination of the orifice plate has significant cost savings in manufacture and assembly. Recent methods for eliminating orifice plates include the use of 'vortex' actuators such as those described in Domoto et al U.S. Pat. No. 4,580,158, 1986, assigned to Xerox, and Miller et al U.S. Pat. No. 5,371,527, 1994 assigned to Hewlett-Packard. These, however are complex to actuate, and difficult to fabricate. The preferred method for elimination of orifice plates for print heads of the invention is incorporation of the orifice into the actuator substrate.

This type of nozzle may be used for print heads using various techniques for drop separation.

Operation with Electrostatic Drop Separation

As a first example, operation using thermal reduction of surface tension and electrostatic drop separation is shown in FIG. 2.

FIG. 2 shows the results of energy transport and fluid dynamic simulations performed using FIDAP, a commercial fluid dynamic simulation software package available from Fluid Dynamics Inc., of Illinois, USA. This simulation is of a thermal drop selection nozzle embodiment with a diameter of 8 μm, at an ambient temperature of 30° C. The total energy applied to the heater is 276 nJ, applied as 69 pulses of 4 nJ each. The ink pressure is 10 kPa above ambient air pressure, and the ink viscosity at 30° C. is 1.84 cPs. The ink is water based, and includes a sol of 0.1% palmitic acid to achieve an enhanced decrease in surface tension with increasing temperature. A cross section of the nozzle tip from the central axis of the nozzle to a radial distance of 40 μm is shown. Heat flow in the various materials of the nozzle, including silicon, silicon nitride, amorphous silicon dioxide, crystalline silicon dioxide, and water based ink are simulated using the respective densities, heat capacities, and thermal conductivities of the materials. The time step of the simulation is 0.1 μs.

FIG. 2(*a*) shows a quiescent state, just before the heater is actuated. An equilibrium is created whereby no ink escapes the nozzle in the quiescent state by ensuring that the ink pressure plus external electrostatic field is insufficient to overcome the surface tension of the ink at the ambient temperature. In the quiescent state, the meniscus of the ink does not protrude significantly from the print head surface, so the electrostatic field is not significantly concentrated at the meniscus.

FIG. 2(*b*) shows thermal contours at 5° C. intervals 5 μs after the start of the heater energizing pulse. When the heater is energized, the ink in contact with the nozzle tip is rapidly heated. The reduction in surface tension causes the heated portion of the meniscus to rapidly expand relative to the cool ink meniscus. This drives a convective flow which rapidly transports this heat over part of the free surface of the ink at the nozzle tip. It is necessary for the heat to be distributed over the ink surface, and not just where the ink is in contact with the heater. This is because viscous drag against the solid heater prevents the ink directly in contact with the heater from moving.

FIG. 2(*c*) shows thermal contours at 5° C. intervals 10 μs after the start of the heater energizing pulse. The increase in temperature causes a decrease in surface tension, disturbing the equilibrium of forces. As the entire meniscus has been heated, the ink begins to flow.

FIG. 2(*d*) shows thermal contours at 5° C. intervals 20 μs after the start of the heater energizing pulse. The ink pressure has caused the ink to flow to a new meniscus position, which protrudes from the print head. The electrostatic field becomes concentrated by the protruding conductive ink drop.

FIG. 2(*e*) shows thermal contours at 5° C. intervals 30 μs after the start of the heater energizing pulse, which is also 6 μs after the end of the heater pulse, as the heater pulse duration is 24 μs. The nozzle tip has rapidly cooled due to conduction through the oxide layers, and conduction into the flowing ink. The nozzle tip is effectively 'water cooled' by the ink. Electrostatic attraction causes the ink drop to begin to accelerate towards the recording medium. Were the heater pulse significantly shorter (less than 16 μs in this case) the ink would not accelerate towards the print medium, but would instead return to the nozzle.

FIG. 2(*f*) shows thermal contours at 5° C. 26 μs after the end of the heater pulse. The temperature at the nozzle tip is now less than 5° C. above ambient temperature. This causes an increase in surface tension around the nozzle tip. When the rate at which the ink is drawn from the nozzle exceeds the viscously limited rate of ink flow through the nozzle, the ink in the region of the nozzle tip 'necks', and the selected drop separates from the body of ink. The selected drop then travels to the recording medium under the influence of the external electrostatic field. The meniscus of the ink at the nozzle tip then returns to its quiescent position, ready for the next heat pulse to select the next ink drop. One ink drop is selected, separated and forms a spot on the recording medium for each heat pulse. As the heat pulses are electrically controlled, drop on demand ink jet operation can be achieved.

FIG. 3(*a*) shows successive meniscus positions during the drop selection cycle at 5 μs intervals, starting at the beginning of the heater energizing pulse.

FIG. 3(*b*) is a graph of meniscus position versus time, showing the movement of the point at the centre of the meniscus. The heater pulse starts 10 μs into the simulation.

FIG. 3(*c*) shows the resultant curve of temperature with respect to time at various points in the nozzle. The vertical axis of the graph is temperature, in units of 100° C. The horizontal axis of the graph is time, in units of 10 μs. The temperature curve shown in FIG. 3(*b*) was calculated by FIDAP, using 0.1 μs time steps. The local ambient temperature is 30 degrees C. Temperature histories at three points are shown:

A—Nozzle tip: This shows the temperature history at the circle of contact between the passivation layer, the ink, and air.

B—Meniscus midpoint: This is at a circle on the ink meniscus midway between the nozzle tip and the centre of the meniscus.

C—Chip surface: This is at a point on the print head surface 20 μm from the centre of the nozzle. The temperature only rises a few degrees. This indicates that active circuitry can be located very close to the nozzles without experiencing performance or lifetime degradation due to elevated temperatures.

FIG. 3(*e*) shows the power applied to the heater. Optimum operation requires a sharp rise in temperature at the start of the heater pulse, a maintenance of the temperature a little below the boiling point of the ink for the duration of the pulse, and a rapid fall in temperature at the end of the pulse. To achieve this, the average energy applied to the heater is varied over the duration of the pulse. In this case, the variation is achieved by pulse frequency modulation of 0.1 μs sub-pulses, each with an energy of 4 nJ. The peak power applied to the heater is 40 mW, and the average power over the duration of the heater pulse is 11.5 mW. The sub-pulse frequency in this case is 5 Mhz. This can readily be varied without significantly affecting the operation of the print head. A higher sub-pulse frequency allows finer control over the power applied to the heater. A sub-pulse frequency of 13.5 Mhz is suitable, as this frequency is also suitable for minimizing the effect of radio frequency interference (RFI).

Ink

FIG. 3(*d*) shows the measured effect of temperature on the surface tension of various aqueous preparations containing the following additives:

1) 0.1% sol of Stearic Acid 2) 0.1% sol of Palmitic acid 3) 0.1% solution of Pluronic 10R5 (trade mark of BASF)

4) 0.1% solution of Pluronic L35 (trade mark of BASF)

5) 0.1% solution of Pluronic L44 (trade mark of BASF)

6) 0.1% solution of Pluronic P65 (trade mark of BASF)

Inks suitable for printing systems of the present invention are described in the following Australian patent specifications, the disclosure of which are hereby incorporated by reference:

'Ink composition based on a microemulsion' (Filing no.: PN5223, filed on Sep. 6, 1995);

'Ink composition containing surfactant sol' (Filing no.: PN5224, filed on Sep. 6, 1995);

'Ink composition for DOD printers with Kraft point near the drop selection temperature sol' (Filing no.: PN6240, filed on Oct. 30, 1995);

'Dye and pigment in a microemulsion based ink' (Filing no.: PN6241, filed on Oct. 30, 1995);

Operation Using Reduction of Viscosity

As a second example, operation of an embodiment using thermal reduction of viscosity and proximity drop separation, in combination with hot melt ink, is as follows. Prior to operation of the printer, solid ink is melted in the reservoir 64. The reservoir, ink passage to the print head, ink channels 75, and print head 50 are maintained at a temperature at which the ink 100 is liquid, but exhibits a relatively high viscosity (for example, approximately 100 cP). The Ink 100 is retained in the nozzle by the surface tension of the ink. The ink 100 is formulated so that the viscosity of the ink reduces with increasing temperature. The ink pressure oscillates at a frequency which is an integral multiple of the drop ejection frequency from the nozzle. The ink pressure oscillation causes oscillations of the ink meniscus at the nozzle tips, but this oscillation is small due to the high ink viscosity. At the normal operating temperature, these oscillations are of insufficient amplitude to result in drop separation. When the heater 103 is energized, the ink forming the selected drop is heated, causing a reduction in viscosity to a value which is preferably less than 5 cP. The reduced viscosity results in the ink meniscus moving further during the high pressure part of the ink pressure cycle. The recording medium 51 is arranged sufficiently close to the print head 50 so that the selected drops contact the recording medium 51, but sufficiently far away that the unselected drops do not contact the recording medium 51. Upon contact with the recording medium 51, part of the selected drop freezes, and attaches to the recording medium. As the ink pressure falls, ink begins to move back into the nozzle. The body of ink separates from the ink which is frozen onto the recording medium. The meniscus of the ink 100 at the nozzle tip then returns to low amplitude oscillation. The viscosity of the ink increases to its quiescent level as remaining heat is dissipated to the bulk ink and print head. One ink drop is selected, separated and forms a spot on the recording medium 51 for each heat pulse. As the heat pulses are electrically controlled, drop on demand ink jet operation can be achieved.

Manufacturing of Print Heads

Manufacturing processes for monolithic print heads in accordance with the present invention are described in the following Australian patent specifications filed on Apr. 12, 1995, the disclosure of which are hereby incorporated by reference:

'A monolithic printing head' (Filing no.: PN2301);

'A manufacturing process for monolithic printing heads' (Filing no.: PN2302);

'A self-aligned heater design for print heads' (Filing no.: PN2303);

'Integrated four color print heads' (Filing no.: PN2304);

'Power requirement reduction in monolithic printing heads' (Filing no.: PN2305);

'A manufacturing process for monolithic print heads using anisotropic wet etching' (Filing no.: PN2306);

'Nozzle placement in monolithic drop-on-demand print heads' (Filing no.: PN2307);

'Heater structure for monolithic print heads' (Filing no.: PN2346);

'Power supply connection for monolithic print heads' (Filing no.: PN2347);

'External connections for Proximity print heads' (Filing no.: PN2348); and

'A self-aligned manufacturing process for monolithic print heads' (Filing no.: PN2349); and 'CMOS process compatible fabrication of print heads' (Filing no.: PN5222, Sep. 6, 1995).

Control of Print Heads

Means of providing page image data and controlling heater temperature in print heads of the present invention is described in the following Australian patent specifications filed on Apr. 12, 1995, the disclosure of which are hereby incorporated by reference:

'Integrated drive circuitry in print heads' (Filing no.: PN2295);

'A nozzle clearing procedure for Liquid Ink Fault Tolerant printing' (Filing no.: PN2294);

'Heater power compensation for temperature in printing systems' (Filing no.: PN2314);

'Heater power compensation for thermal lag in printing systems' (Filing no.: PN2315);

'Heater power compensation for print density in printing systems' (Filing no.: PN2316);

'Accurate control of temperature pulses in printing heads' (Filing no.: PN2317);

'Data distribution in monolithic print heads' (Filing no.: PN2318);

'Page image and fault tolerance routing device for printing systems' (Filing no.: PN2319); and 'A removable pressurized liquid ink cartridge for printers' (Filing no.: PN2320).

Image Processing for Print Heads

An objective of printing systems according to the invention is to attain a print quality which is equal to that which people are accustomed to in quality color publications printed using offset printing. This can be achieved using a print resolution of approximately 1,600 dpi. However, 1,600 dpi printing is difficult and expensive to achieve. Similar results can be achieved using 800 dpi printing, with 2 bits per pixel for cyan and magenta, and one bit per pixel for yellow and blacks This color model is herein called CC'MM'YK. Where high quality monochrome image printing is also required, two bits per pixel can also be used for black. This color model is herein called CC'MM'YKK'. Color models, halftoning, data compression, and real-time expansion systems suitable for use in systems of this invention and other printing systems are described in the following Australian patent specifications filed on Apr. 12, 1995, the disclosure of which are hereby incorporated by reference:

'Four level ink set for bi-level color printing' (Filing no.: PN2339);

'Compression system for page images' (Filing no.: PN2340);

'Real-time expansion apparatus for compressed page images' (Filing no.: PN2341); and 'High capacity compressed document image storage for digital color printers' (Filing no.: PN2342);

'Improving JPEG compression in the presence of text' (Filing no.: PN2343);

'An expansion and halftoning device for compressed page images' (Filing no.: PN2344); and 'Improvements in image halftoning' (Filing no.: PN2345).

Applications Using Print Heads According to this Invention

Printing apparatus and methods of this invention are suitable for a wide range of applications, including (but not limited to) the following: color and monochrome office printing, short run digital printing, high speed digital printing, process color printing, spot color printing, offset press supplemental printing, low cost printers using scanning print heads, high speed printers using pagewidth print heads, portable color and monochrome printers, color and monochrome copiers, color and monochrome facsimile machines, combined printer, facsimile and copying machines, label printing, large format plotters, photographic duplication, printers for digital photographic processing, portable printers incorporated into digital 'instant' cameras, video printing, printing of PhotoCD images, portable printers for 'Personal Digital Assistants', wallpaper printing, indoor sign printing, billboard printing, and fabric printing.

Printing systems based on this invention are described in the following Australian patent specifications filed on Apr. 12, 1995, the disclosure of which are hereby incorporated by reference:

'A high speed color office printer with a high capacity digital page image store' (Filing no.: PN2329);

'A short run digital color printer with a high capacity digital page image store' (Filing no.: PN2330);

'A digital color printing press using printing technology' (Filing no.: PN2331);

'A modular digital printing press' (Filing no.: PN2332);

'A high speed digital fabric printer' (Filing no.: PN2333);

'A color photograph copying system' (Filing no.: PN2334);

'A high speed color photocopier using a printing system' (Filing no.: PN2335);

'A portable color photocopier using printing technology' (Filing no.: PN2336);

'A photograph processing system using printing technology' (Filing no.: PN2337);

'A plain paper facsimile machine using a printing system' (Filing no.: PN2338);

'A PhotoCD system with integrated printer' (Filing no.: PN2293);

'A color plotter using printing technology' (Filing no.: PN2291);

'A notebook computer with integrated color printing system' (Filing no.: PN2292);

'A portable printer using a printing system' (Filing no.: PN2300);

'Fax machine with on-line database interrogation and customized magazine printing' (Filing no.: PN2299);

'Miniature portable color printer' (Filing no.: PN2298);

'A color video printer using a printing system' (Filing no.: PN2296); and

'An integrated printer, copier, scanner, and facsimile using a printing system' (Filing no.: PN2297)

Compensation of Print Heads for Environmental Conditions

It is desirable that drop on demand printing systems have consistent and predictable ink drop size and position. Unwanted variation in ink drop size and position causes variations in the optical density of the resultant print, reducing the perceived print quality. These variations should be kept to a small proportion of the nominal ink drop volume and pixel spacing respectively. Many environmental variables can be compensated to reduce their effect to insignificant levels. Active compensation of some factors can be achieved by varying the power applied to the nozzle heaters.

An optimum temperature profile for one print head embodiment involves an instantaneous raising of the active region of the nozzle tip to the ejection temperature, maintenance of this region at the ejection temperature for the duration of the pulse, and instantaneous cooling of the region to the ambient This optimum is not achievable due to the stored heat capacities and thermal conductivities of the various materials used in the fabrication of the nozzles in accordance with the invention. However, improved performance can be achieved by shaping the power pulse using curves which can be derived by iterative refinement of finite element simulation of the print head. The power applied to the heater can be varied in time by various techniques, including, but not limited to:

1) Varying the voltage applied to the heater
2) Modulating the width of a series of short pulses (PWM)
3) Modulating the frequency of a series of short pulses (PFM)

To obtain accurate results, a transient fluid dynamic simulation with free surface modeling is required, as convection in the ink, and ink flow, significantly affect on the temperature achieved with a specific power curve.

By the incorporation of appropriate digital circuitry on the print head substrate, it is practical to individually control the power applied to each nozzle. One way to achieve this is by 'broadcasting' a variety of different digital pulse trains across the print head chip, and selecting the appropriate pulse train for each nozzle using multiplexing circuits.

An example of the environmental factors which may be compensated for is listed in the table "Compensation for environmental factors". This table identifies which environmental factors are best compensated globally (for the entire print head), per chip (for each chip in a composite multi-chip print head), and per nozzle.

| Factor compensated | Scope | Sensing or user control method | Compensation mechanism |
|---|---|---|---|
| Ambient Temperature | Global | Temperature sensor mounted on print head | Power supply voltage or global PFM patterns |
| Power supply voltage fluctuation with number of active nozzles | Global | Predictive active nozzle count based on print data | Power supply voltage or global PFM patterns |

-continued

| Factor compensated | Scope | Sensing or user control method | Compensation mechanism |
|---|---|---|---|
| Local heat build-up with successive nozzle actuation | Per nozzle | Predictive active nozzle count based on print data | Selection of appropriate PFM pattern for each printed drop |
| Drop size control for multiple bits per pixel | Per nozzle | Image data | Selection of appropriate PFM pattern for each printed drop |
| Nozzle geometry variations between wafers | Per chip | Factory measurement, datafile supplied with print head | Global PFM patterns per print head chip |
| Heater resistivity variations between wafers | Per chip | Factory measurement, datafile supplied with print head | Global PFM patterns per print head chip |
| User image intensity adjustment | Global | User selection | Power supply voltage, electrostatic acceleration voltage, or ink pressure |
| Ink surface tension reduction method and threshold temperature | Global | Ink cartridge sensor or user selection | Global PFM patterns |
| Ink viscosity | Global | Ink cartridge sensor or user selection | Global PFM patterns and/or clock rate |
| Ink dye or pigment concentration | Global | Ink cartridge sensor or user selection | Global PFM patterns |
| Ink response time | Global | Ink cartridge sensor or user selection | Global PFM patterns |

Most applications will not require compensation for all of these variables. Some variables have a minor effect, and compensation is only necessary where very high image quality is required.

Print head drive circuits

Figure 4:
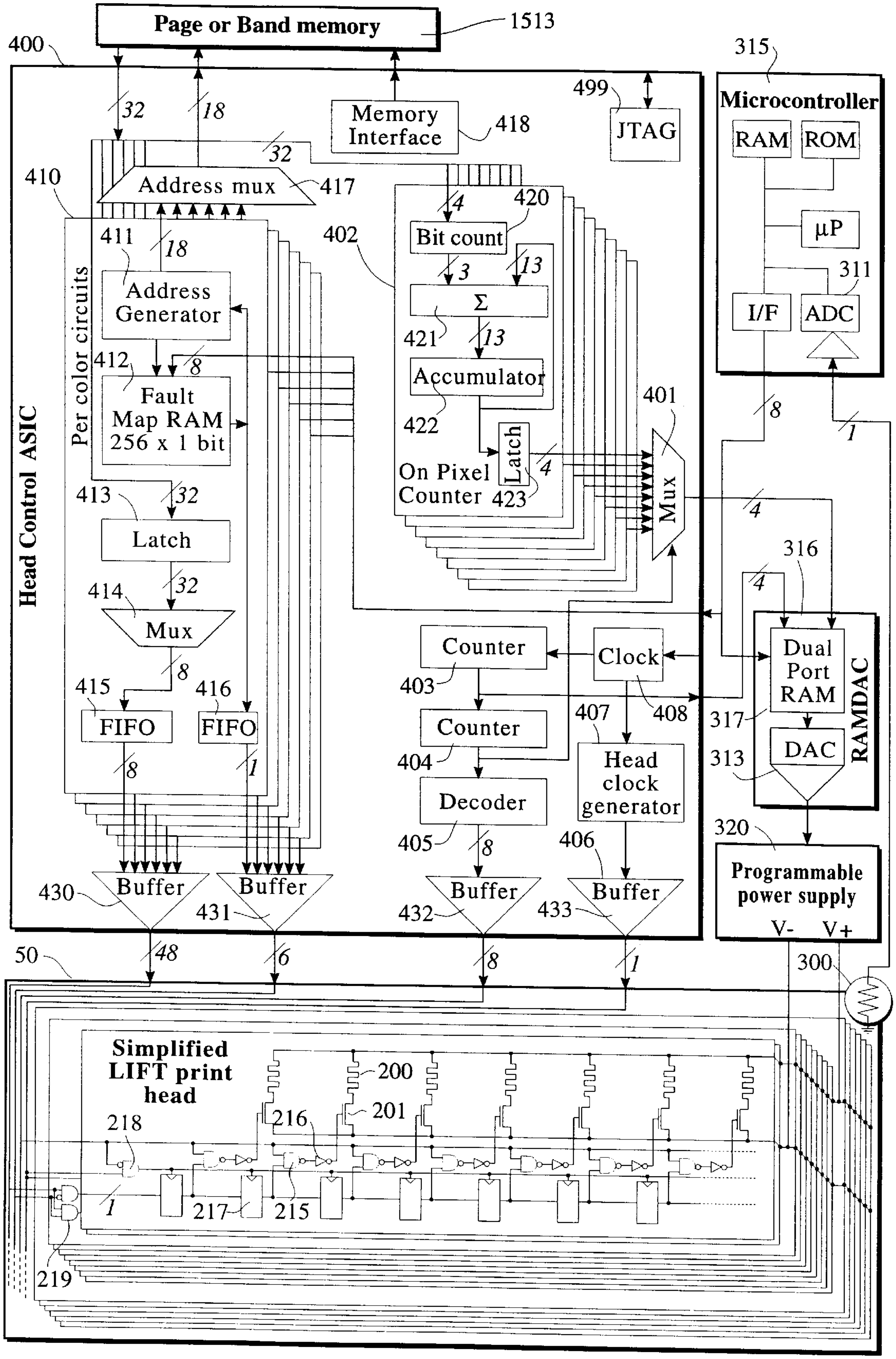
FIG. 4 shows a block schematic diagram of print head drive circuitry for practice of the invention.

FIG. 4 is a block schematic diagram showing electronic operation of an example head driver circuit in accordance with this invention. This control circuit uses analog modulation of the power supply voltage applied to the print head to achieve heater power modulation, and does not have individual control of the power applied to each nozzle. FIG. 4 shows a block diagram for a system using an 800 dpi pagewidth print head which prints process color using the CC'MM'YK color model. The print head 50 has a total of 79,488 nozzles, with 39,744 main nozzles and 39,744 redundant nozzles. The main and redundant nozzles are divided into six colors, and each color is divided into 8 drive phases. Each drive phase has a shift register which converts the serial data from a head control ASIC 400 into parallel data for enabling heater drive circuits. There is a total of 96 shift registers, each providing data for 828 nozzles. Each shift register is composed of 828 shift register stages 217, the outputs of which are logically anded with phase enable signal by a nand gate 215. The output of the nand gate 215 drives an inverting buffer 216, which in turn controls the drive transistor 201. The drive transistor 201 actuates the electrothermal heater 200, which may be a heater 103 as shown in FIG. 1(*b*). To maintain the shifted data valid during the enable pulse, the clock to the shift register is stopped the enable pulse is active by a clock stopper 218, which is shown as a single gate for clarity, but is preferably any of a range of well known glitch free clock control circuits. Stopping the clock of the shift register removes the requirement for a parallel data latch in the print head, but adds some complexity to the control circuits in the Head Control ASIC 400. Data is routed to either the main nozzles or the redundant nozzles by the data router 219 depending on the state of the appropriate signal of the fault status bus.

The print head shown in FIG. 4 is simplified, and does not show various means of improving manufacturing yield, such as block fault tolerance. Drive circuits for different configurations of print head can readily be derived from the apparatus disclosed herein.

Digital information representing patterns of dots to be printed on the recording medium is stored in the Page or Band memory 1513, which may be the same as the Image memory 72 in FIG. 1(*a*). Data in 32 bit words representing dots of one color is read from the Page or Band memory 1513 using addresses selected by the address mux 417 and control signals generated by the Memory Interface 418. These addresses are generated by Address generators 411, which forms part of the 'Per color circuits' 410, for which there is one for each of the six color components. The addresses are generated based on the positions of the nozzles in relation to the print medium. As the relative position of the nozzles may be different for different print heads, the Address generators 411 are preferably made programmable. The Address generators 411 normally generate the address corresponding to the position of the main nozzles. However, when faulty nozzles are present, locations of blocks of nozzles containing faults can be marked in the Fault Map RAM 412. The Fault Map RAM 412 is read as the page is printed. If the memory indicates a fault in the block of nozzles, the address is altered so that the Address generators 411 generate the address corresponding to the position of the redundant nozzles. Data read from the Page or Band memory 1513 is latched by the latch 413 and converted to four sequential bytes by the multiplexer 414. Timing of these bytes is adjusted to match that of data representing other colors by the FIFO 415. This data is then buffered by the buffer 430 to form the 48 bit main data bus to the print head 50. The data is buffered as the print head may be located a relatively long distance from the head control ASIC. Data from the Fault Map RAM 412 also forms the input to the FIFO 416. The timing of this data is matched to the data output of the FIFO 415, and buffered by the buffer 431 to form the fault status bus.

The programmable power supply 320 provides power for the head 50. The voltage of the power supply 320 is controlled by the DAC 313, which is part of a RAM and DAC combination (RAMDAC) 316. The RAMDAC 316 contains a dual port RAM 317. The contents of the dual port RAM 317 are programmed by the Microcontroller 315. Temperature is compensated by changing the contents of the dual port RAM 317. These values are calculated by the microcontroller 315 based on temperature sensed by a thermal sensor 300. The thermal sensor 300 signal connects to the Analog to Digital Converter (ADC) 311. The ADC 311 is preferably incorporated in the Microcontroller 315.

The Head Control ASIC 400 contains control circuits for thermal lag compensation and print density. Thermal lag compensation requires that the power supply voltage to the head 50 is a rapidly time-varying voltage which is synchronized with the enable pulse for the heater. This is achieved by programming the programmable power supply 320 to produce this voltage. An analog time varying programming voltage is produced by the DAC 313 based upon data read from the dual port RAM 317. The data is read according to an address produced by the counter 403. The counter 403 produces one complete cycle of addresses during the period of one enable pulse. This synchronization is ensured, as the counter 403 is clocked by the system clock 408, and the top count of the counter 403 is used to clock the enable counter 404. The count from the enable counter 404 is then decoded by the decoder 405 and buffered by the buffer 432 to produce the enable pulses for the head 50. The counter 403 may include a prescaler if the number of states in the count is less than the number of clock periods in one enable pulse. Sixteen voltage states are adequate to accurately compensate for the heater thermal lag. These sixteen states can be specified by using a four bit connection between the counter 403 and the dual port RAM 317. However, these sixteen states may not be linearly spaced in time. To allow non-linear timing of these states the counter 403 may also include a ROM or other device which causes the counter 403 to count in a non-linear fashion. Alternatively, fewer than sixteen states may be used.

For print density compensation, the printing density is detected by counting the number of pixels to which a drop is to be printed (‘on’ pixels) in each enable period. The ‘on’ pixels are counted by the On pixel counters 402. There is one On pixel counter 402 for each of the eight enable phases. The number of enable phases in a print head in accordance with the invention depend upon the specific design. Four, eight, and sixteen are convenient numbers, though there is no requirement that the number of enable phases is a power of two. The On Pixel Counters 402 can be composed of combinatorial logic pixel counters 420 which determine how many bits in a nibble of data are on. This number is then accumulated by the adder 421 and accumulator 422. A latch 423 holds the accumulated value valid for the duration of the enable pulse. The multiplexer 401 selects the output of the latch 423 which corresponds to the current enable phase, as determined by the enable counter 404. The output of the multiplexer 401 forms part of the address of the dual port RAM 317. An exact count of the number of ‘on’ pixels is not necessary, and the most significant four bits of this count are adequate.

Combining the four bits of thermal lag compensation address and the four bits of print density compensation address means that the dual port RAM 317 has an 8 bit address. This means that the dual port RAM 317 contains 256 numbers, which are in a two dimensional array. These two dimensions are time (for thermal lag compensation) and print density. A third dimension—temperature—can be included. As the ambient temperature of the head varies only slowly, the microcontroller 315 has sufficient time to calculate a matrix of 256 numbers compensating for thermal lag and print density at the current temperature. Periodically (for example, a few times a second), the microcontroller senses the current head temperature and calculates this matrix.

The clock to the print head 50 is generated from the system clock 408 by the Head clock generator 407, and buffered by the buffer 406. To facilitate testing of the Head control ASIC, JTAG test circuits 499 may be included.

The table “Comparison between Thermal ink jet and Present Invention” compares the aspects of printing in accordance with the present invention with thermal ink jet printing technology.

A direct comparison is made between the present invention and thermal ink jet technology because both are drop on demand systems which operate using thermal actuators and liquid ink. Although they may appear similar, the two technologies operate on different principles.

The thermal ink jet technologies all use the same fundamental operating principle. A thermal impulse caused by electrical resistance heating results in the explosive formation of a bubble in liquid ink. Rapid and consistent bubble formation can be achieved by superheating the ink, so that sufficient heat is transferred to the ink before bubble nucleation is complete. For water based ink, ink temperatures of approximately 280° C. to 400° C. are required. The bubble formation causes a pressure wave which forces a drop of ink from the aperture with high velocity. The bubble then collapses, drawing ink from the ink reservoir to re-fill the nozzle. Thermal inkjet printing has been highly successful commercially due to the high nozzle packing density, simple physical construction, and the use of well established integrated circuit manufacturing techniques. However, thermal ink jet printing technology faces significant technical problems including multi-part precision fabrication, device yield, image resolution, ‘pepper’ noise, printing speed, drive transistor power, waste power dissipation, satellite drop formation, thermal stress, differential thermal expansion, kogation, cavitation, rectified diffusion, and difficulties in ink formulation.

Thermal printing in accordance with the present invention has many of the advantages of thermal ink jet printing, but completely or substantially eliminates many of the inherent problems of thermal ink jet technology. Comparison between Thermal ink jet and Present Invention

| | Thermal Ink-Jet | Present Invention |
|---|---|---|
| Drop selection mechanism | Drop ejected by pressure wave caused by thermally induced bubble | Choice of surface tension or viscosity reduction mechanisms |
| Drop separation mechanism | Same as drop selection mechanism | Choice of proximity, electrostatic, magnetic, and other methods |

-continued

| | Thermal Ink-Jet | Present Invention |
|---|---|---|
| Basic ink carrier | Water | Water, microemulsion, alcohol, glycol, or hot melt |
| Head construction | Precision assembly of nozzle plate, ink channel, and substrate | Monolithic |
| Per copy printing cost | Very high due to limited print head life and expensive inks | Can be low due to permanent print heads and wide range of possible inks |
| Satellite drop formation | Significant problem which degrades image quality | No satellite drop formation |
| Operating ink temperature | 280° C. to 400° C. (high temperature limits dye use and ink formulation) | Approx. 70° C. (depends upon ink formulation) |
| Peak heater temperature | 400° C. to 1,000° C. (high temperature reduces device life) | Approx. 130° C. |
| Cavitation (heater erosion by bubble collapse) | Serious problem limiting head life | None (no bubbles are formed) |
| Kogation (coating of heater by ink ash) | Serious problem limiting head life and ink formulation | None (water based ink temperature does not exceed 100° C.) |
| Rectified diffusion (formation of ink bubbles due to pressure cycles) | Serious problem limiting ink formulation | Does not occur as the ink pressure does not go negative |
| Resonance | Serious problem limiting nozzle design and repetition rate | Very small effect as pressure waves are small |
| Practical resolution | Approx. 800 dpi max. | Approx. 1,600 dpi max. |
| Self-cooling operation | No (high energy required) | Yes: printed ink carries away drop selection energy |
| Drop ejection velocity | High (approx. 1 m/sec) | Low (approx. 1 m/sec) |
| Crosstalk | Serious problem requiring careful acoustic design, which limits nozzle refill rate. | Low velocities and pressures associated with drop ejection make crosstalk very small. |
| Operating thermal stress | Serious problem limiting print-head life. | Low: maximum temperature increase approx. 90° C. at centre of heater. |
| Manufacturing thermal stress | Serious problem limiting print-head size. | Same as standard CMOS manufacturing process. |
| Drop selection energy | Approx. 20 μJ | Approx. 270 nJ |
| Heater pulse period | Approx. 2–3 μs | Approx. 15–30 μs |
| Average heater pulse power | Approx. 8 Watts per heater. | Approx. 12 mW per heater. This is more than 500 times less than Thermal Ink-Jet. |
| Heater pulse voltage | Typically approx. 40 V. | Approx. 5 to 10 V. |
| Heater peak pulse current | Typically approx. 200 mA per heater. This requires bipolar or very large MOS drive transistors. | Approx. 4 mA per heater. This allows the use of small MOS drive transistors. |
| Fault tolerance | Not implemented. Not practical for edge shooter type. | Simple implementation results in better yield and reliability |
| Constraints on ink composition | Many constraints including kogation, nucleation, etc. | Temperature coefficient of surface tension or viscosity must be negative. |
| Ink pressure | Atmospheric pressure or less | Approx. 1.1 atm |
| Integrated drive circuitry | Bipolar circuitry usually required due to high drive current | CMOS, nMOS, or bipolar |
| Differential thermal expansion | Significant problem for large print heads | Monolithic construction reduces problem |
| Pagewidth print heads | Major problems with yield, cost, precision construction, head life, and power dissipation | High yield, low cost and long life due to fault tolerance. Self cooling due to low power dissipation. |

Yield and Fault Tolerance

In most cases, monolithic integrated circuits cannot be repaired if they are not completely functional when manufactured. The percentage of operational devices which are produced from a wafer run is known as the yield. Yield has a direct influence on manufacturing cost. A device with a yield of 5% is effectively ten times more expensive to manufacture than an identical device with a yield of 50%.

There are three major yield measurements:

1) Fab yield

2) Wafer sort yield

3) Final test yield

For large die, it is typically the wafer sort yield which is the most serious limitation on total yield. Full pagewidth color heads in accordance with this invention are very large in comparison with typical VLSI circuits. Good wafer sort yield is critical to the cost-effective manufacture of such heads.

Figure 5:
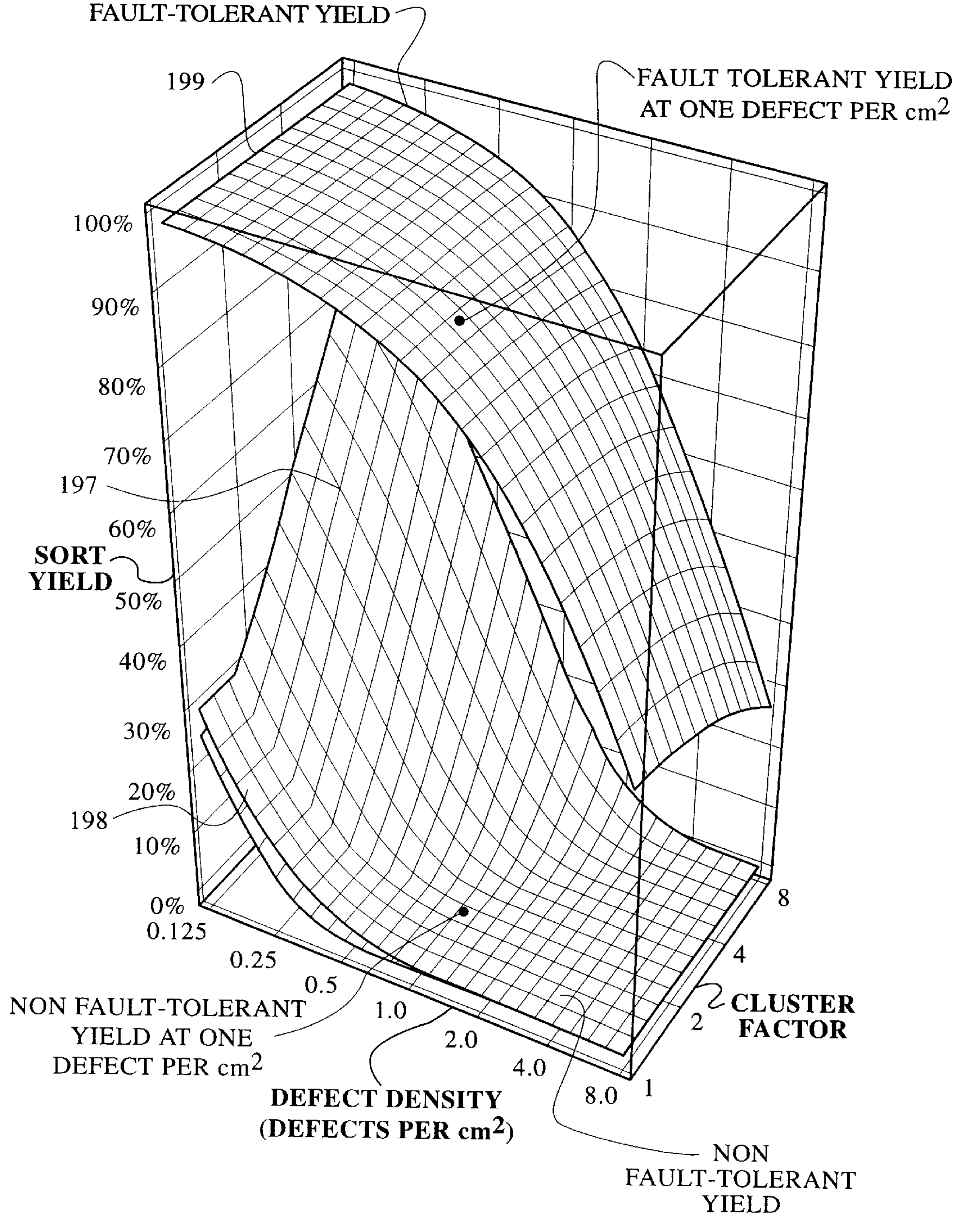
FIG. 5 shows projected manufacturing yields for an A4 page width color print head embodying features of the invention, with and without fault tolerance.

FIG. 5 is a graph of wafer sort yield versus defect density for a monolithic full width color A4 head embodiment of the invention. The head is 215 mm long by 5 mm wide. The non fault tolerant yield 198 is calculated according to Murphy's method, which is a widely used yield prediction method. With a defect density of one defect per square cm, Murphy's method predicts a yield less than 1%. This means that more than 99% of heads fabricated would have to be discarded. This low yield is highly undesirable, as the print head manufacturing cost becomes unacceptably high.

Murphy's method approximates the effect of an uneven distribution of defects. FIG. 5 also includes a graph of non fault tolerant yield 197 which explicitly models the clustering of defects by introducing a defect clustering factor. The defect clustering factor is not a controllable parameter in manufacturing, but is a characteristic of the manufacturing process. The defect clustering factor for manufacturing processes can be expected to be approximately 2, in which case yield projections closely match Murphy's method.

A solution to the problem of low yield is to incorporate fault tolerance by including redundant functional units on the chip which are used to replace faulty functional units.

In memory chips and most Wafer Scale Integration (WSI) devices, the physical location of redundant sub-units on the chip is not important. However, in printing heads the redundant sub-unit may contain one or more printing actuators. These must have a fixed spatial relationship to the page being printed. To be able to print a dot in the same position as a faulty actuator, redundant actuators must not be displaced in the non-scan direction. However, faulty actuators can be replaced with redundant actuators which are displaced in the scan direction. To ensure that the redundant actuator prints the dot in the same position as the faulty actuator, the data timing to the redundant actuator can be altered to compensate for the displacement in the scan direction.

To allow replacement of all nozzles, there must be a complete set of spare nozzles, which results in 100% redundancy. The requirement for 100% redundancy would normally more than double the chip area, dramatically reducing the primary yield before substituting redundant units, and thus eliminating most of the advantages of fault tolerance.

However, with print head embodiments according to this invention, the minimum physical dimensions of the head chip are determined by the width of the page being printed, the fragility of the head chip, and manufacturing constraints on fabrication of ink channels which supply ink to the back surface of the chip. The minimum practical size for a fill width, full color head for printing A4 size paper is approximately 215 mm×5 mm. This size allows the inclusion of 100% redundancy without significantly increasing chip area, when using 1.5 $\mu$m CMOS fabrication technology. Therefore, a high level of fault tolerance can be included without significantly decreasing primary yield.

When fault tolerance is included in a device, standard yield equations cannot be used. Instead, the mechanisms and degree of fault tolerance must be specifically analyzed and included in the yield equation. FIG. 5 shows the fault tolerant sort yield 199 for a full width color A4 head which includes various forms of fault tolerance, the modeling of which has been included in the yield equation. This graph shows projected yield as a function of both defect density and defect clustering. The yield projection shown in FIG. 5 indicates that thoroughly implemented fault tolerance can increase wafer sort yield from under 1% to more than 90% under identical manufacturing conditions. This can reduce the manufacturing cost by a factor of 100.

Fault tolerance is highly recommended to improve yield and reliability of print heads containing thousands of printing nozzles, and thereby make pagewidth printing heads practical. However, fault tolerance is not to be taken as an essential part of the present invention.

Fault tolerance in drop-on-demand printing systems is described in the following Australian patent specifications filed on Apr. 12, 1995, the disclosure of which are hereby incorporated by reference:

'Integrated fault tolerance in printing mechanisms' (Filing no.: PN2324);

'Block fault tolerance in integrated printing heads' (Filing no.: PN2325);

'Nozzle duplication for fault tolerance in integrated printing heads' (Filing no.: PN2326);

'Detection of faulty nozzles in printing heads' (Filing no.: PN2327); and

'Fault tolerance in high volume printing presses' (Filing no.: PN2328).

Printing System Embodiments

Figure 6:
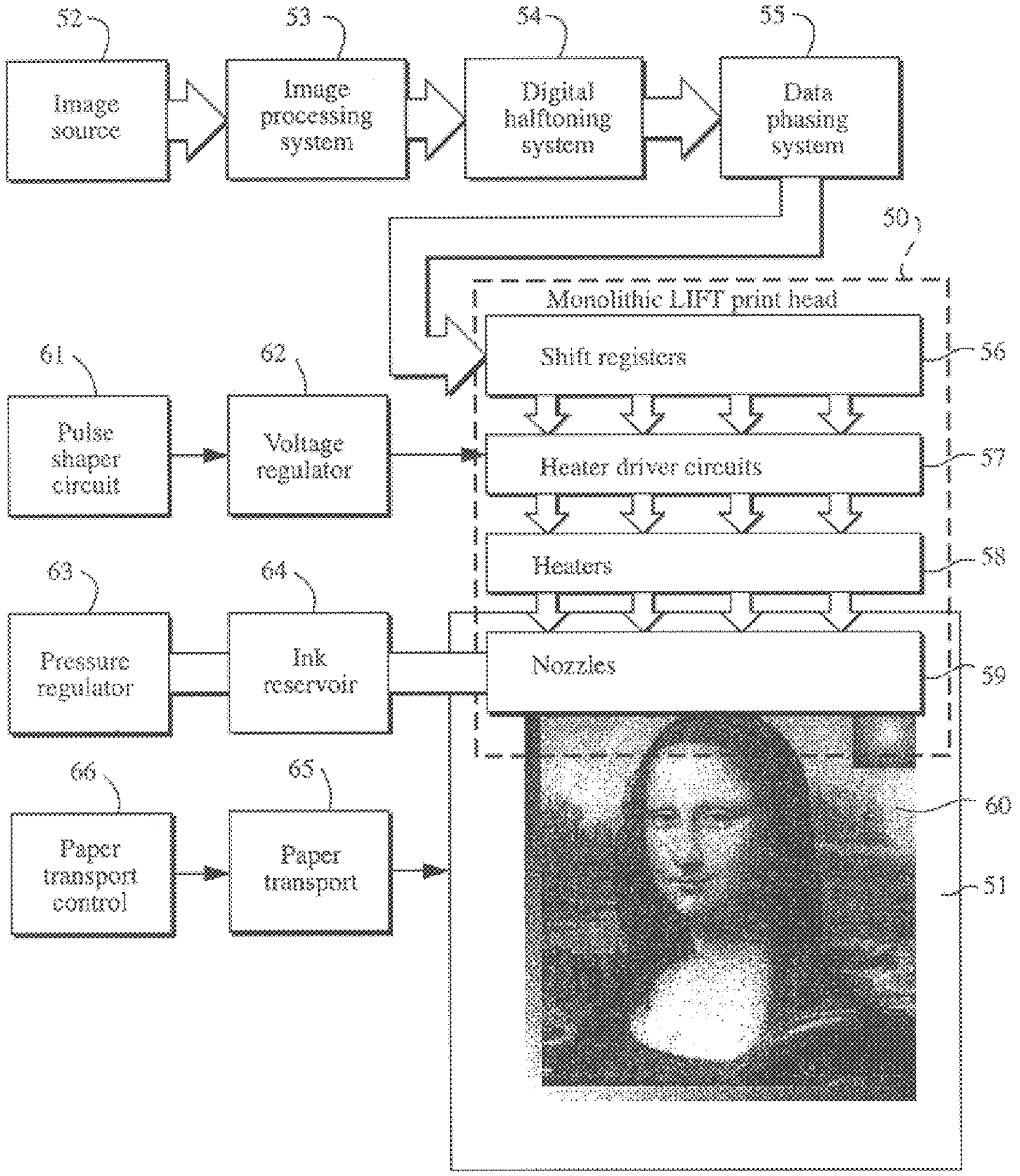
FIG. 6 shows a generalized block diagram of a printing system using a print head.

A schematic diagram of a digital electronic printing system using a print head of this invention is shown in FIG. 6. This shows a monolithic printing head 50 printing an image 60 composed of a multitude of ink drops onto a recording medium 51. This medium will typically be paper, but can also be overhead transparency film, cloth, or many other substantially flat surfaces which will accept ink drops. The image to be printed is provided by an image source 52, which may be any image type which can be converted into a two dimensional array of pixels. Typical image sources are image scanners, digitally stored images, images encoded in a page description language (PDL) such as Adobe Postscript, Adobe Postscript level 2, or Hewlett-Packard PCL 5, page images generated by a procedure-call based rasterized, such as Apple QuickDraw, Apple Quickdraw GX, or Microsoft GDI, or text in an electronic form such as ASCII. This image data is then converted by an image processing system 53 into a two dimensional array of pixels suitable for the particular printing system. This may be color or monochrome, and the data will typically have between 1 and 32 bits per pixel, depending upon the image source and the specifications of the printing system. The image processing system may be a raster image processor (RIP) if the source image is a page description, or may be a two dimensional image processing system if the source image is from a scanner.

If continuous tone images are required, then a halftoning system 54 is necessary. Suitable types of halftoning are based on dispersed dot ordered dither or error diffusion. Variations of these, commonly known a stochastic screening or frequency modulation screening are suitable. The halftoning system commonly used for offset printing—clustered dot ordered dither—is not recommended, as effective image resolution is unnecessarily wasted using this technique. The output of the halftoning system is a binary monochrome or color image at the resolution of the printing system according to the present invention.

The binary image is processed by a data phasing circuit 55 (which may be incorporated in a Head Control ASIC 400 as shown in FIG. 4) which provides the pixel data in the correct sequence to the data shift registers 56. Data sequencing is required to compensate for the nozzle arrangement and the movement of the paper. When the data has been loaded into the shift registers 56, it is presented in parallel to the heater driver circuits 57. At the correct time, the driver circuits 57 will electronically connect the corresponding heaters 58 with the voltage pulse generated by the pulse shaper circuit 61 and the voltage regulator 62. The heaters 58 heat the tip of the nozzles 59, affecting the physical characteristics of the ink. Ink drops 60 escape from the nozzles in a pattern which corresponds to the digital impulses which have been applied to the heater driver circuits. The pressure of the ink in the ink reservoir 64 is regulated by the pressure regulator 63. Selected drops of ink drops 60 are separated from the body of ink by the chosen drop separation means, and contact the recording medium 51. During printing, the recording medium 51 is continually moved relative to the print head 50 by the paper transport system 65. If the print head 50 is the full width of the print region of the recording medium 51, it is only necessary to move the recording medium 51 in one direction, and the print head 50 can remain fixed. If a smaller print head 50 is used, it is necessary to implement a raster scan system. This is typically achieved by scanning the print head 50 along the short dimension of the recording medium 51, while moving the recording medium 51 along its long dimension.

Multiple nozzles in a single monolithic print head

It is desirable that a new printing system intended for use in equipment such as office printers or photocopiers is able to print quickly. A printing speed of 60 A4 pages per minute (one page per second) will generally be adequate for many applications. However, achieving an electronically controlled print speed of 60 pages per minute is not simple.

The minimum time taken to print a page is equal to the number of dot positions on the page times the time required to print a dot, divided by the number of dots of each color which can be printed simultaneously.

The image quality that can be obtained is affected by the total number of ink dots which can be used to create an image. For full color magazine quality printing using dispersed dot digital halftoning, approximately 800 dots per inch (31.5 dots per mm) are required. The spacing between dots on the paper is 31.75 $\mu$m.

A standard A4 page is 210 mm times 297 mm. At 31.5 dots per mm, 61,886,632 dots are required for a monochrome full bleed A4 page. High quality process color printing requires four colors—cyan, magenta, yellow, and black. Therefore, the total number of dots required is 247,546,528. While this can be reduced somewhat by not allowing printing in a small margin at the edge of the paper, the total number of dots required is still very large. If the time taken to print a dot is 144 ms, and only one nozzle per color is provided, then it will take more than two hours to print a single page.

To achieve high speed, high quality printing with my printing system described above, printing heads with many small nozzles are preferred. The printing of a 800 dpi color A4 page in one second can be achieved if the printing head is the full width of the paper. The printing head can be stationary, and the paper can travel past it in the one second period. A four color 800 dpi printing head 210 mm wide requires 26,460 nozzles.

Such a print head may contain 26,460 active nozzles, and 26,460 redundant (spare) nozzles, giving a total of 52,920 nozzles. There are 6,615 active nozzles for each of the cyan, magenta, yellow, and black process colors.

Print heads with large numbers of nozzles can be manufactured at low cost. This can be achieved by using semiconductor manufacturing processes to simultaneously fabricate many thousands of nozzles in a silicon wafer. To eliminate problems with mechanical alignment and differential thermal expansion that would occur if the print head were to be manufactured in several parts and assembled, the head can be manufactured from a single piece of silicon. Nozzles and ink channels are etched into the silicon. Heater elements are formed by evaporation of resistive materials, and subsequent photolithography using standard semiconductor manufacturing processes.

To reduce the large number of connections that would be required on a print head with thousands of nozzles, data distribution circuits and drive circuits can also be integrated on the print head.

Figure 7:
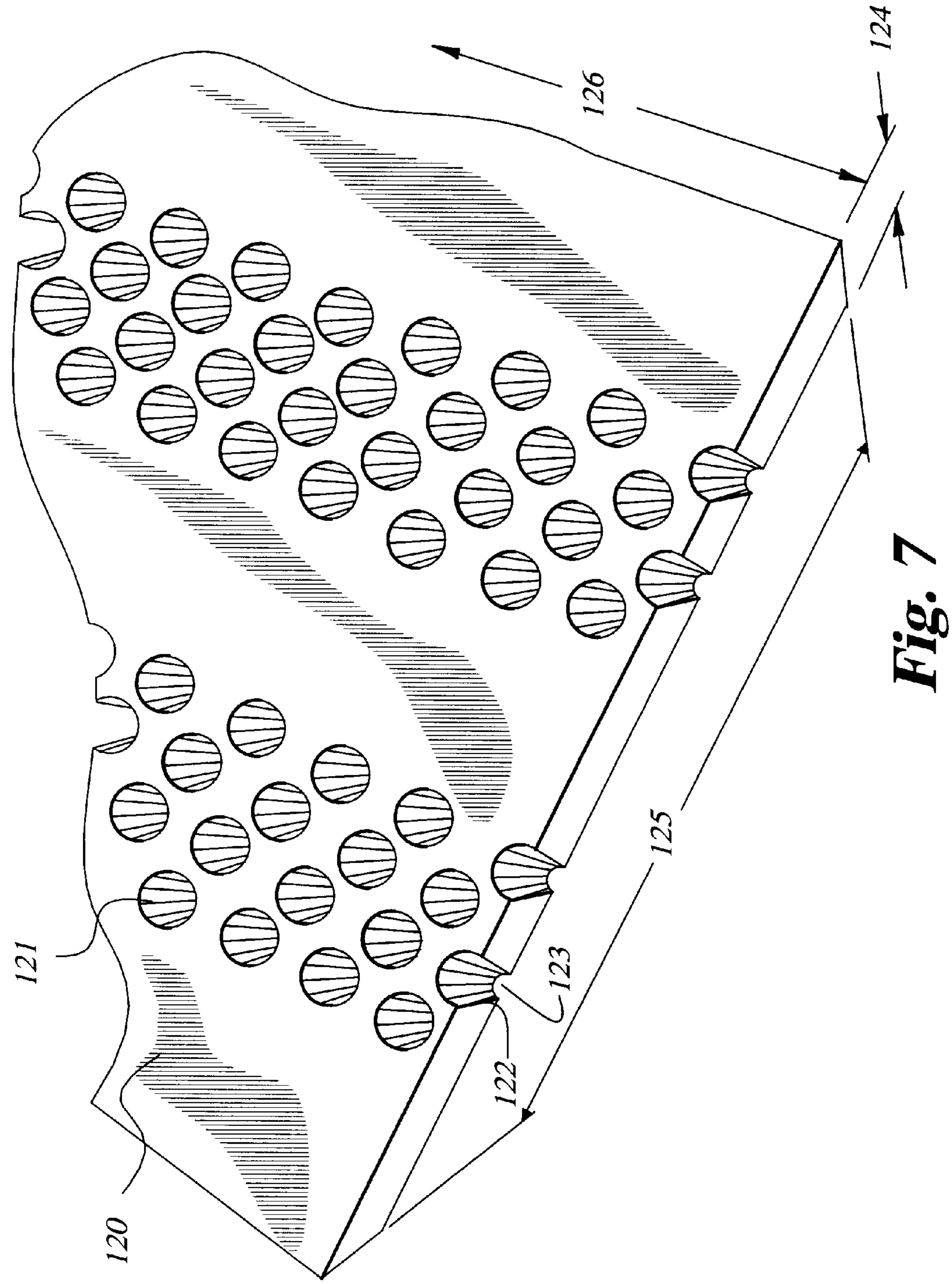
FIG. 7 shows a single silicon substrate with a multitude of nozzles etched in it.
Figure 8A:
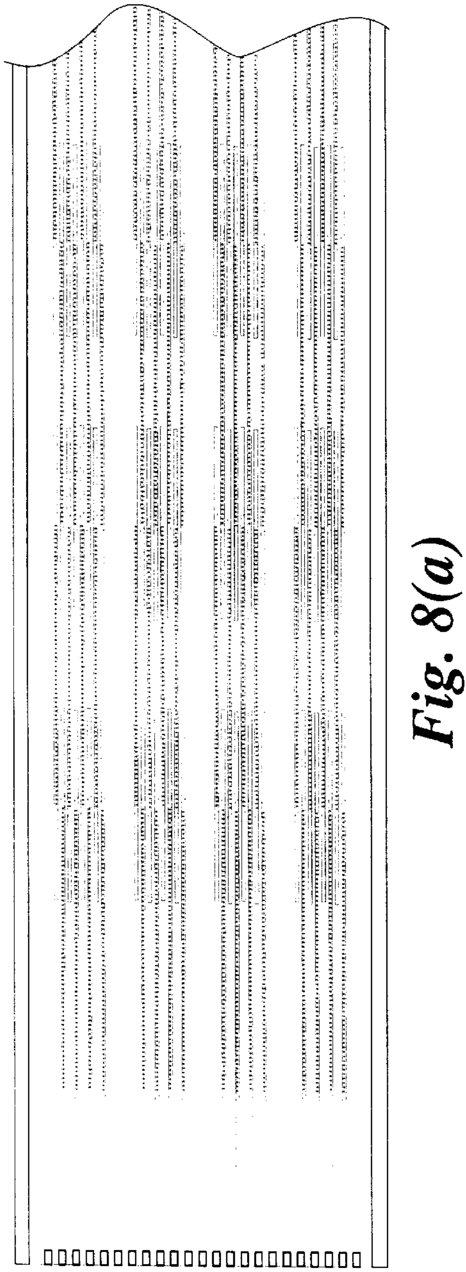
FIGS. 8(*a*) to 8(*d*) show example nozzle layouts and dimensions for a small section of a print head.
Figure 8B:
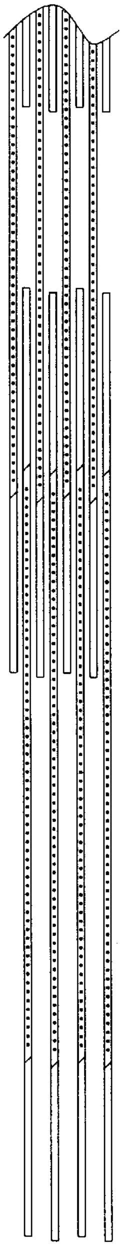
Figure 8C:
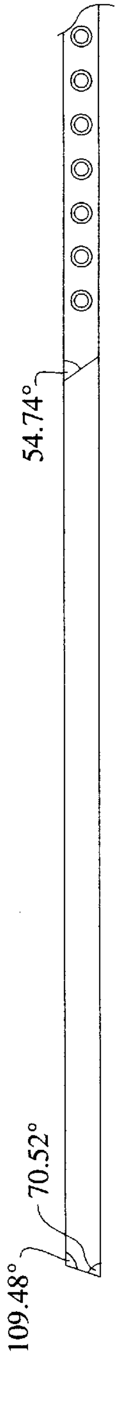
Figure 8D:
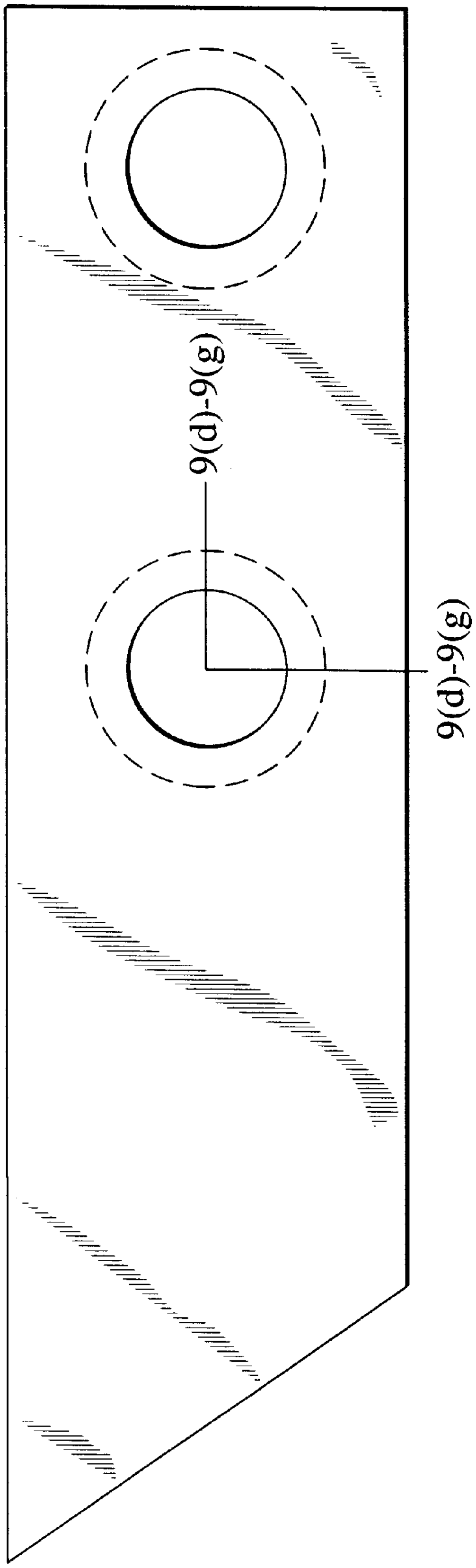
Figure 9A:
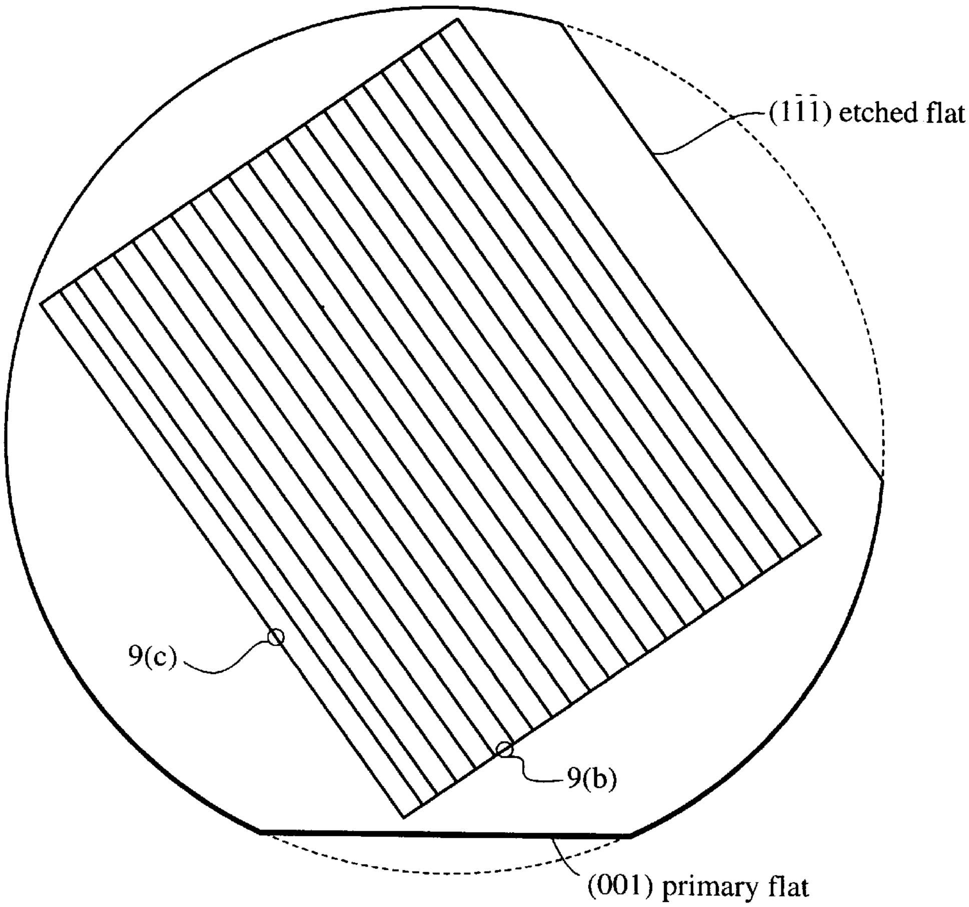
FIGS. 9(*a*) to 9(*o*) show simplified manufacturing steps in accordance with the present invention.
Figure 9B:
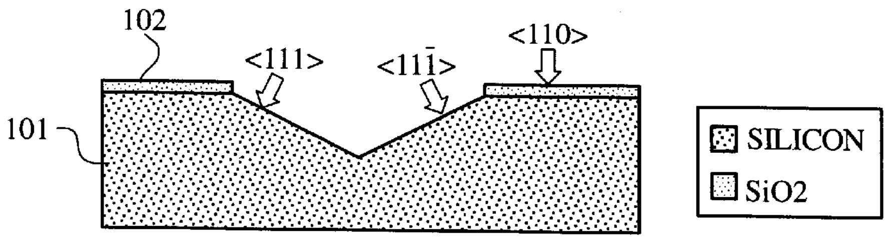
Figure 9C:
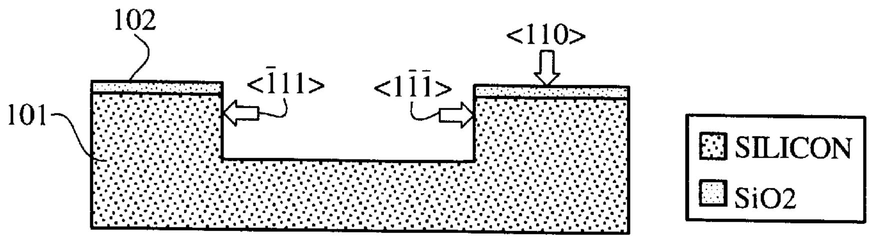
Figure 9D:
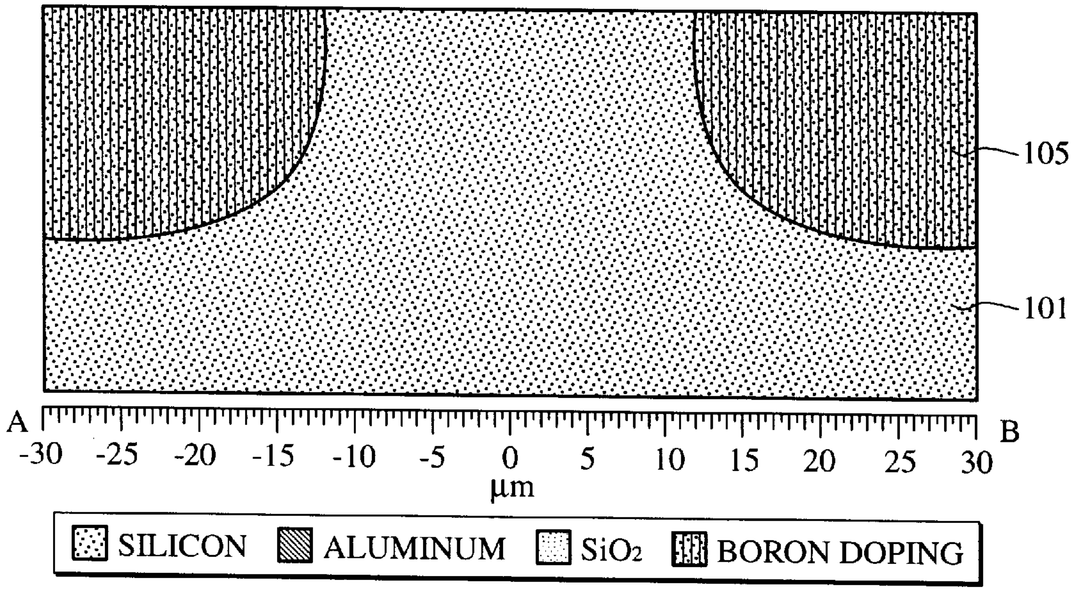
Figure 9E:
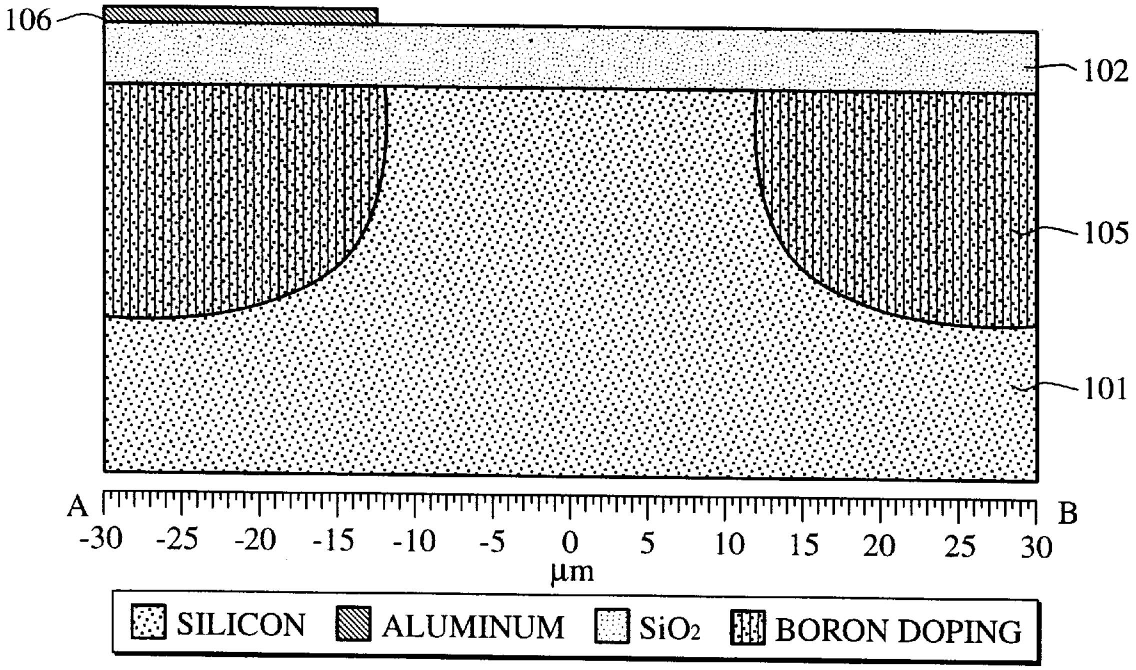
Figure 9F:
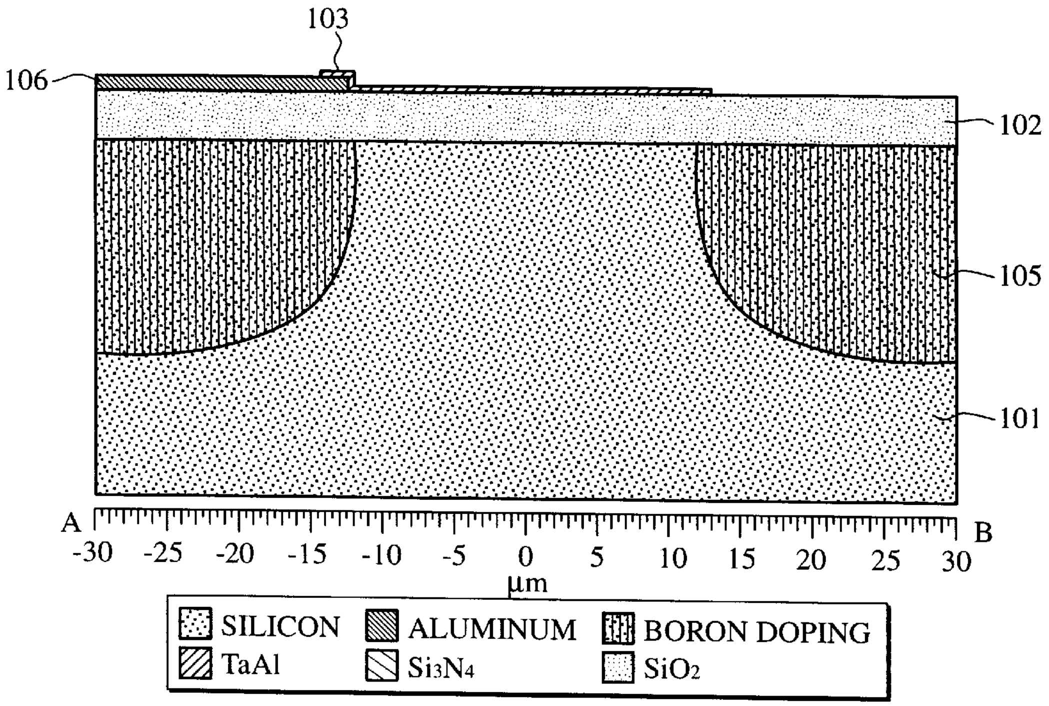
Figure 9G:
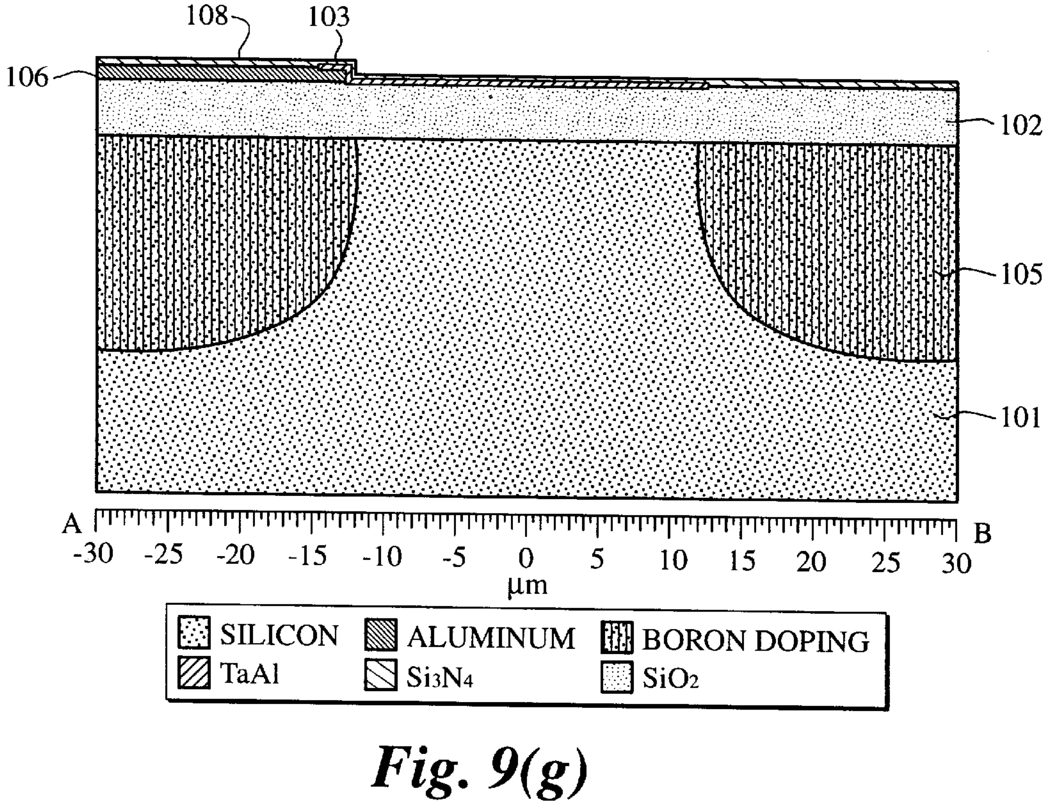
Figure 9H:
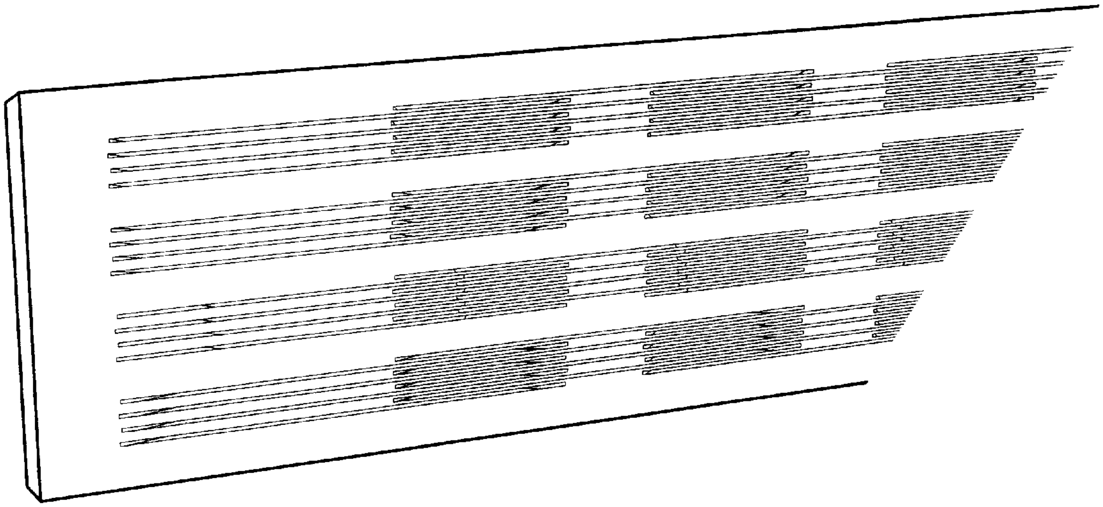
Figure 9I:
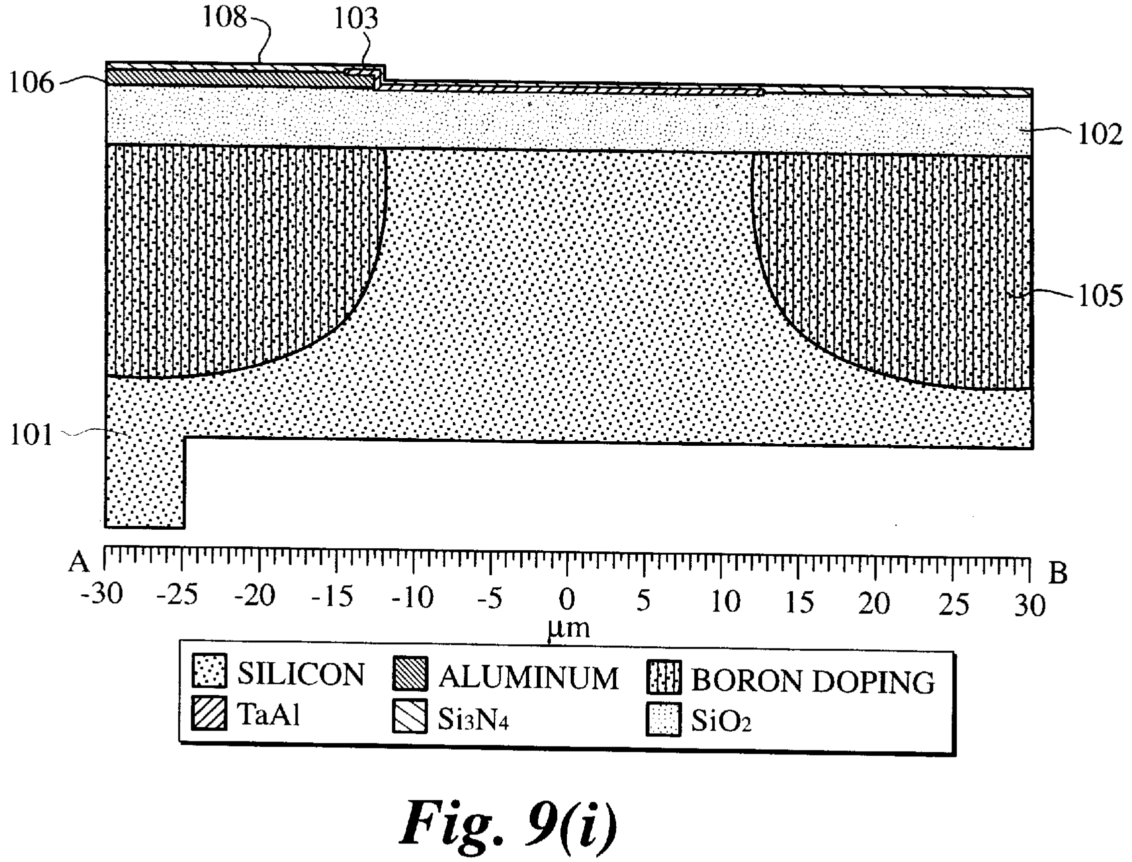
Figure 9J:
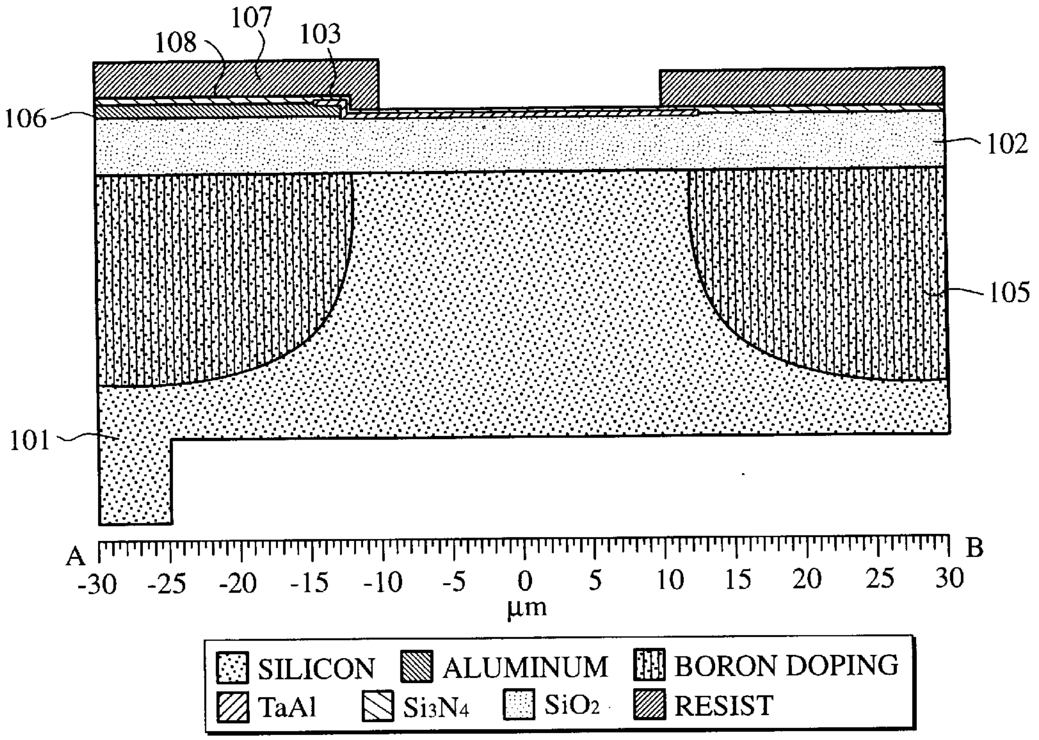
Figure 9K:
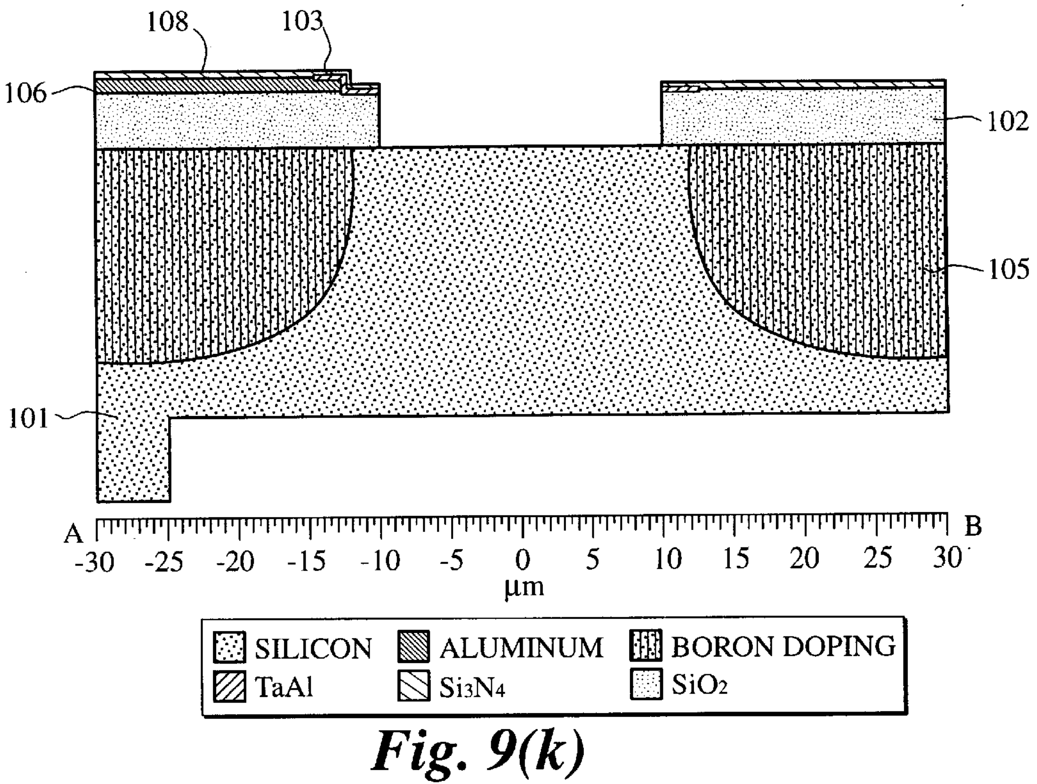
Figure 9L:
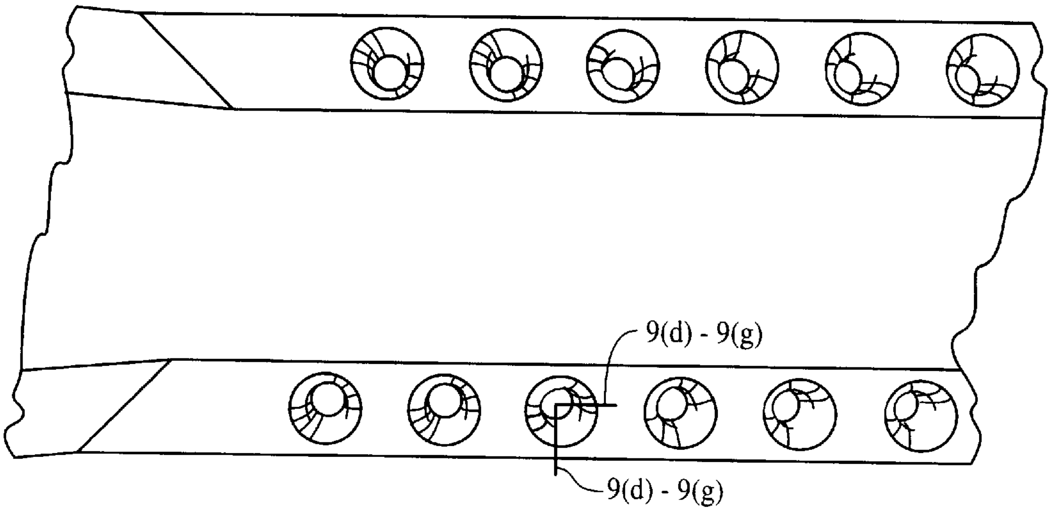
Figure 9M:
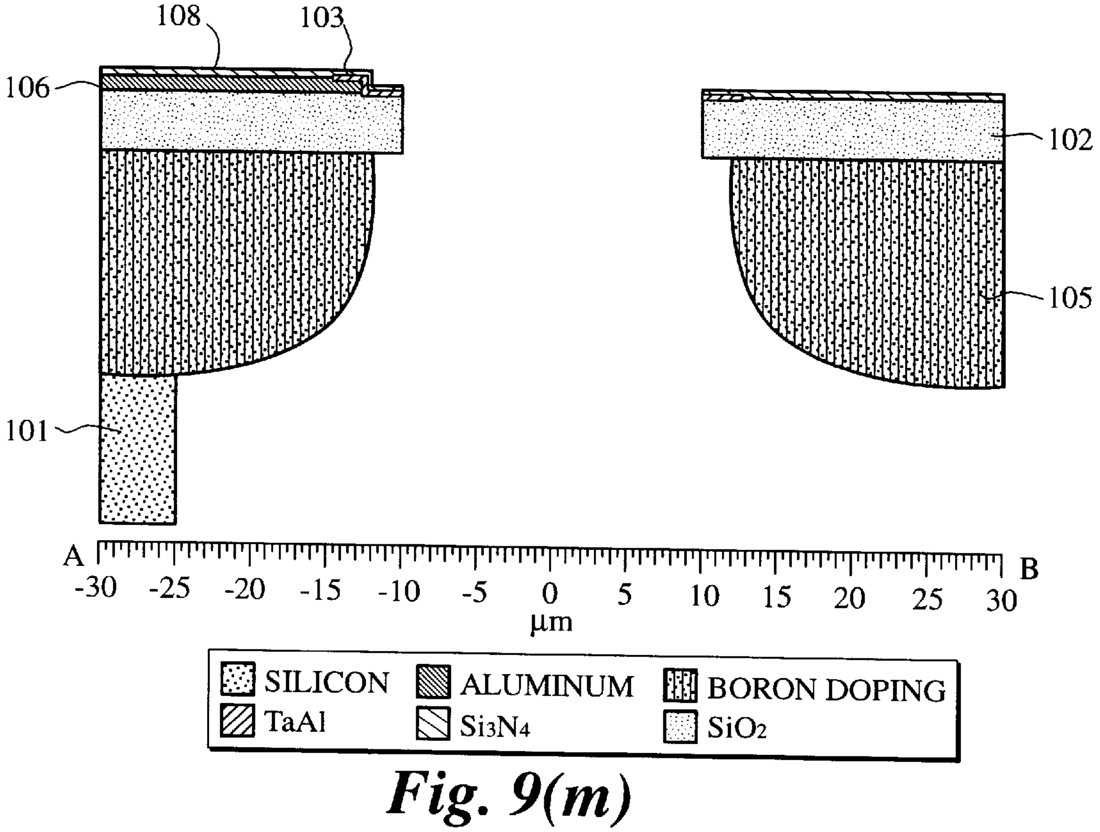
Figure 9N:
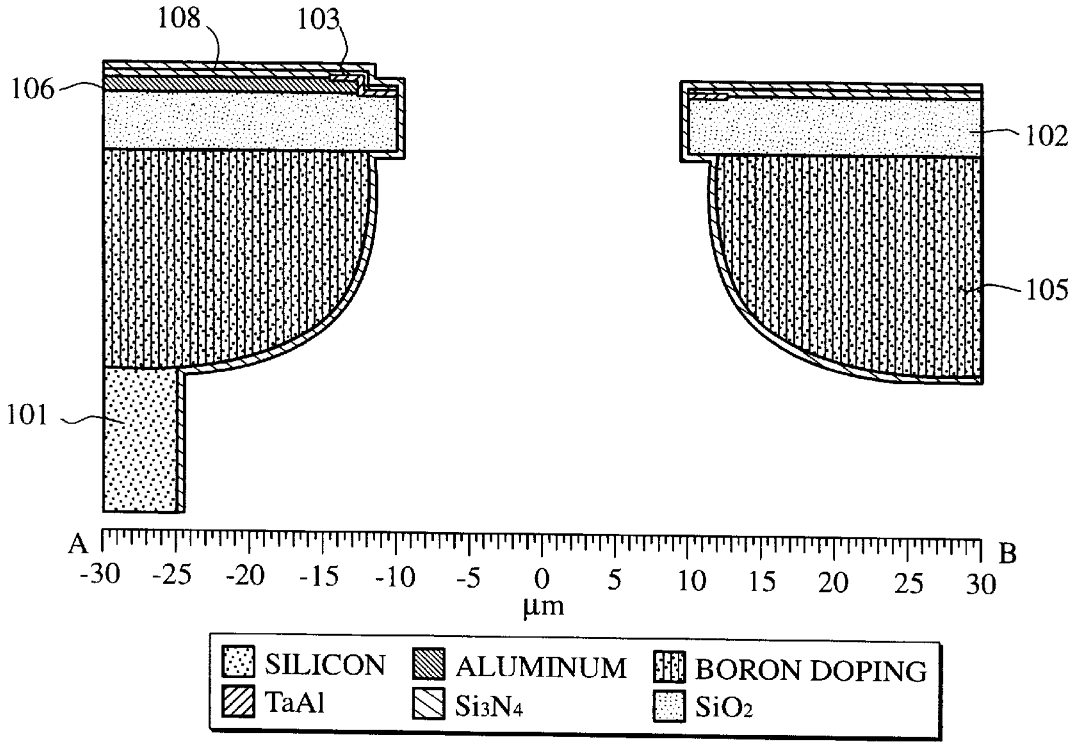
Figure 9O:
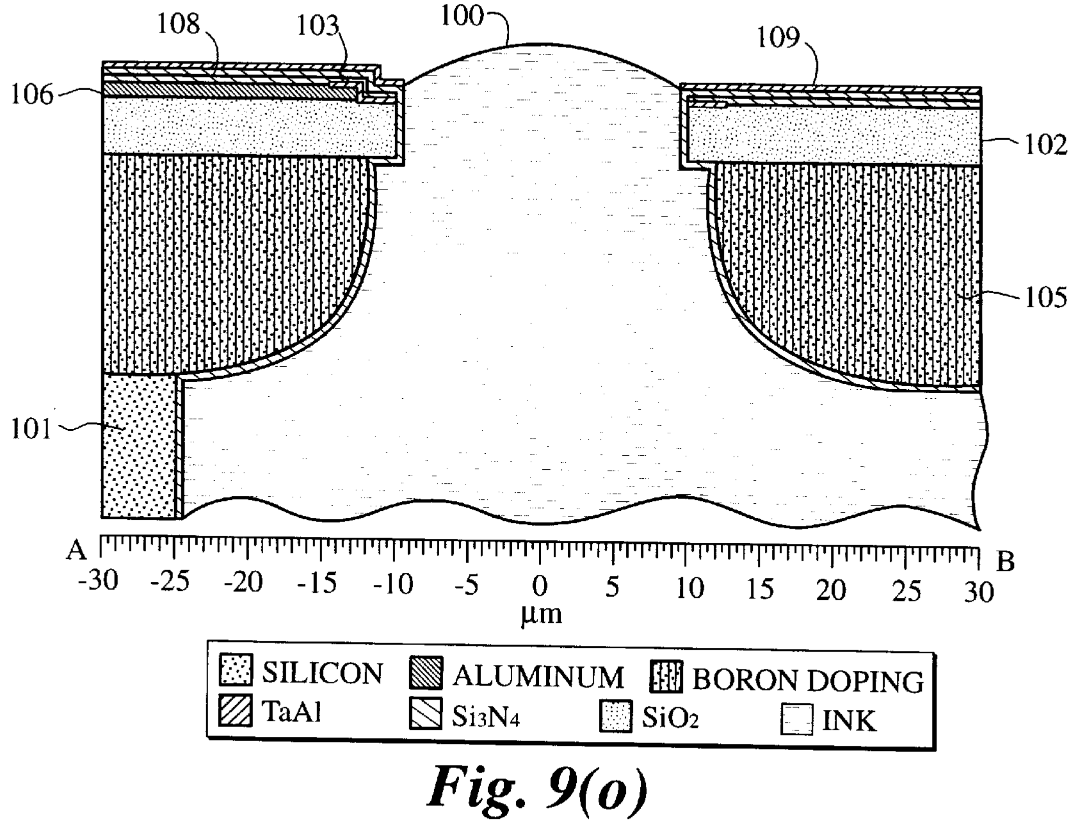
Figure 10A:
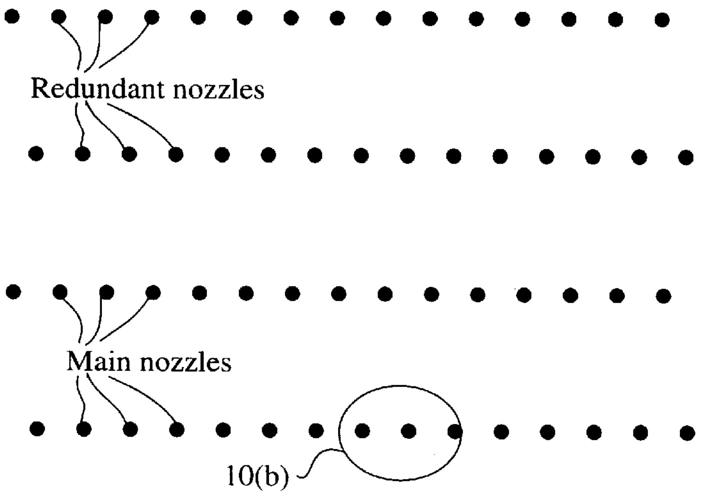
FIG. 10(*a*) shows an arrangement of nozzles for a small part of one color of a print head.
Figure 10B:
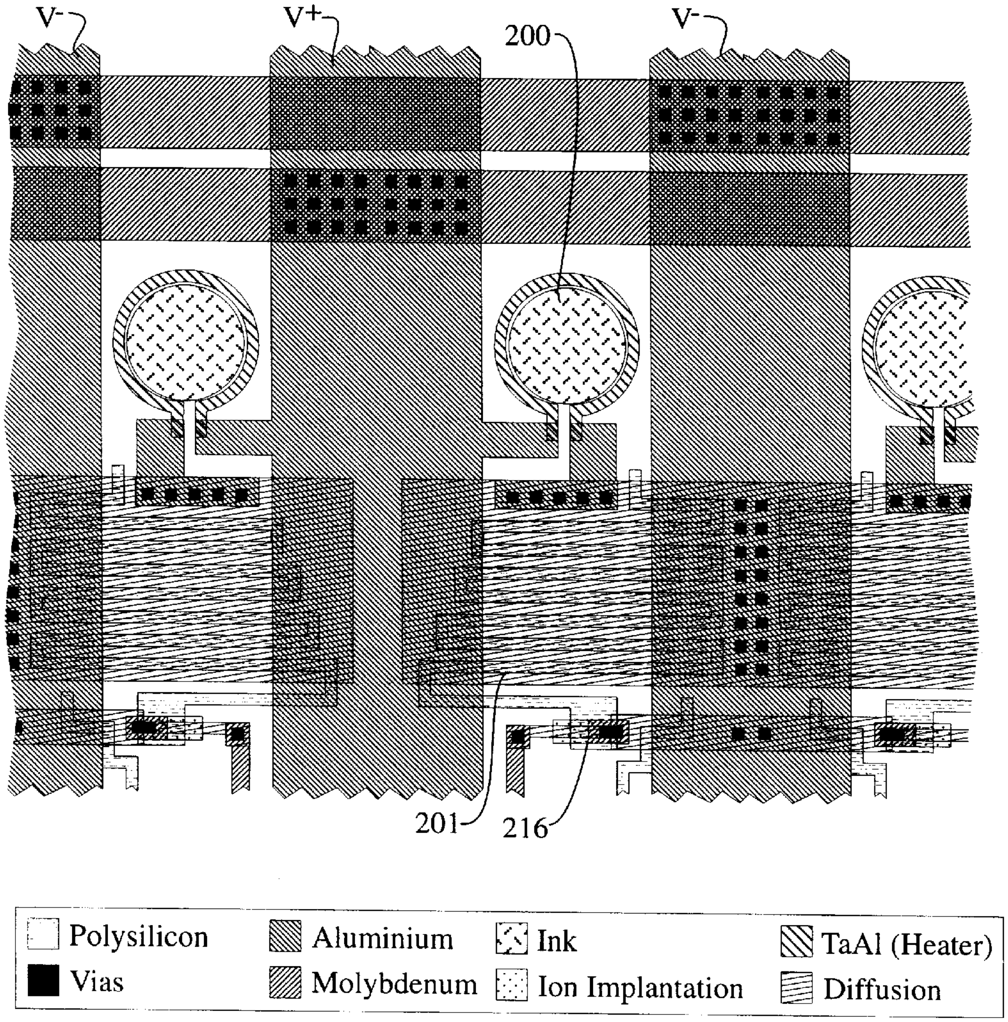
Figure 11A:
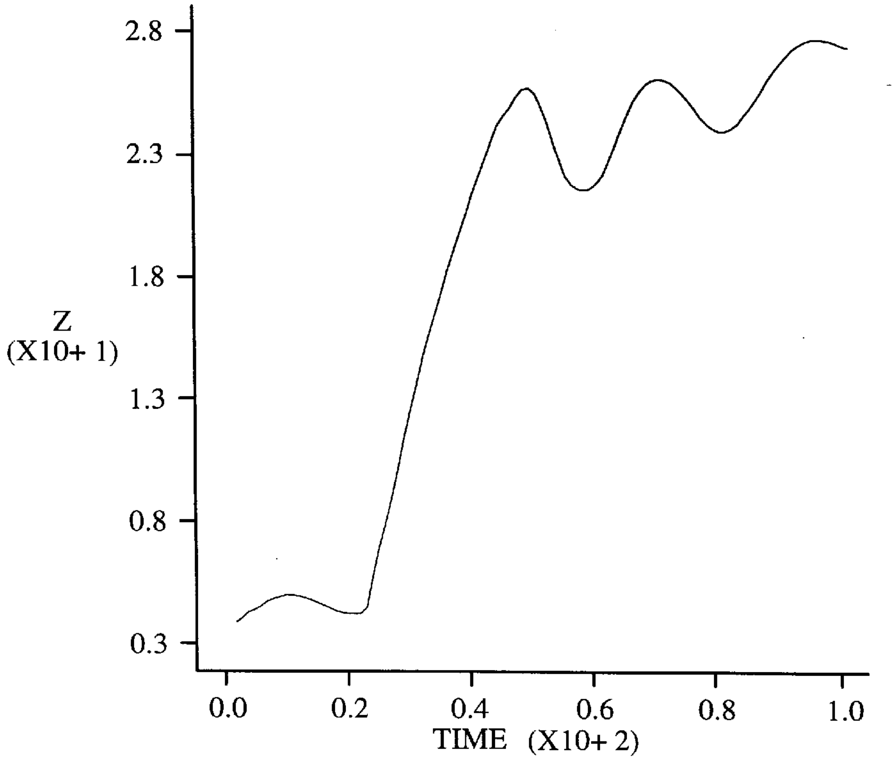
FIGS. 11(*a*), 11(*c*), 11(*e*), 11(*g*), and 11(*i*) are graphs of the position of the centre of the meniscus versus time for various nozzle barrel geometries.
Figure 11B:
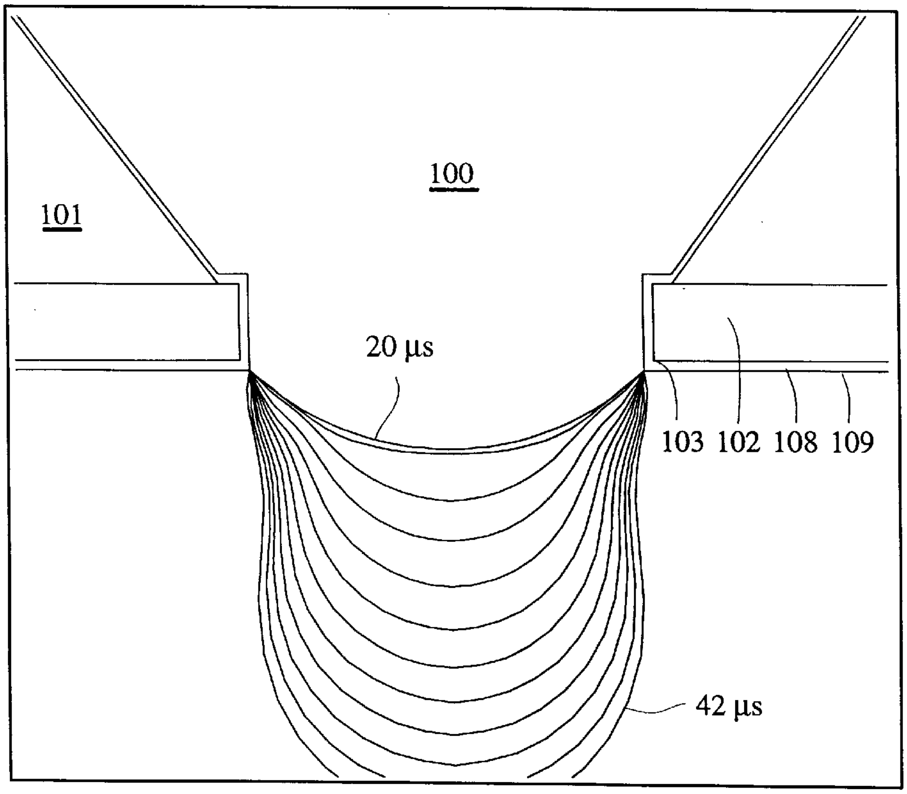
Figure 11C:
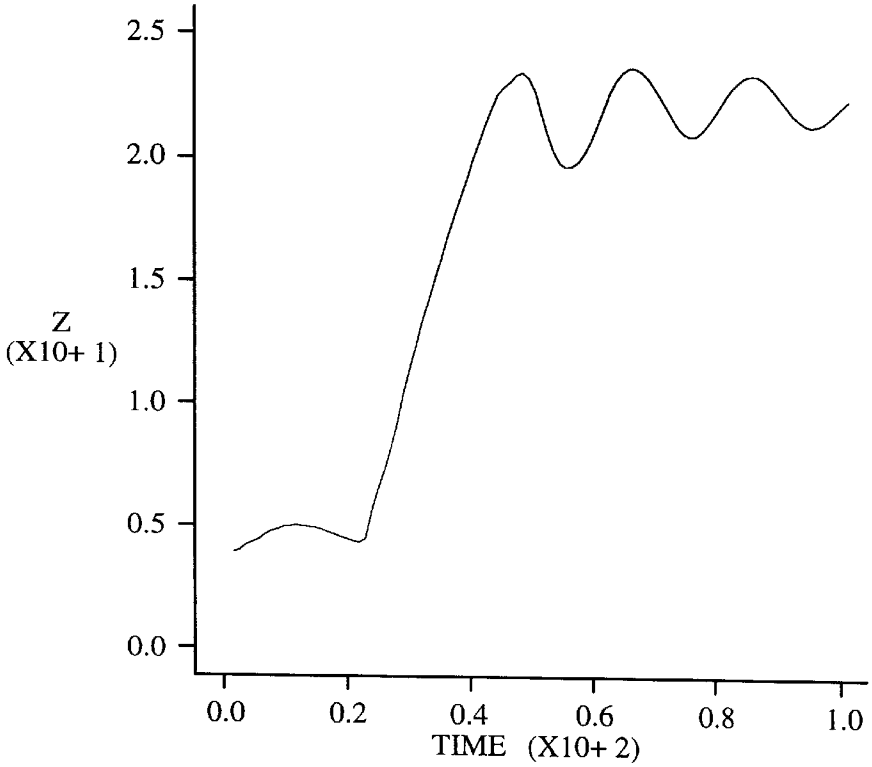
Figure 11D:
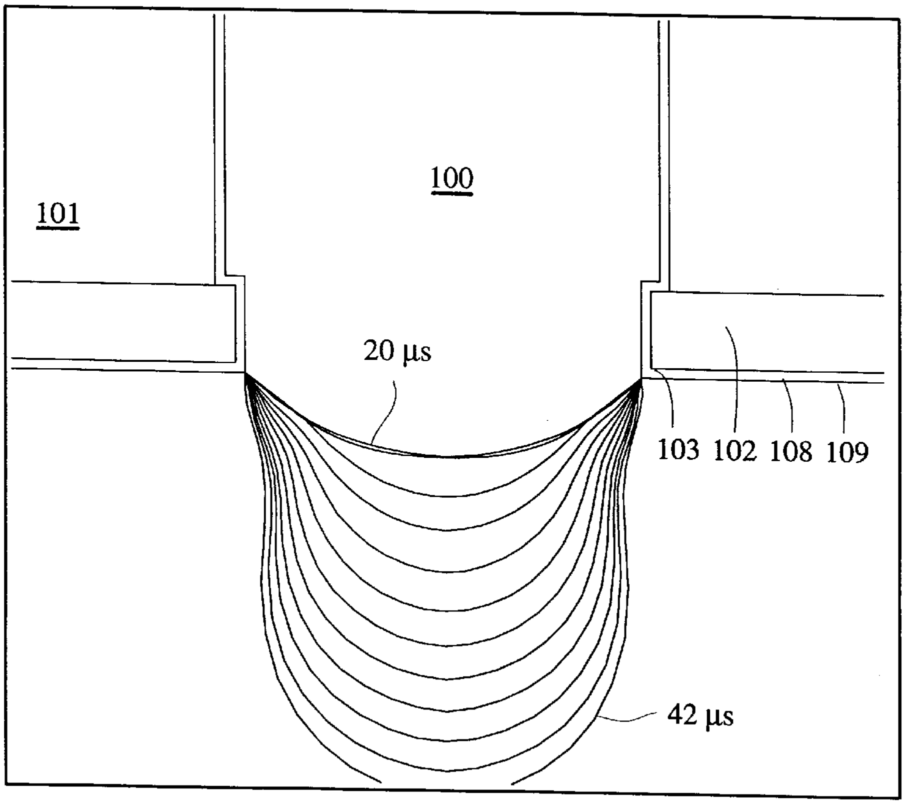
Figure 11E:
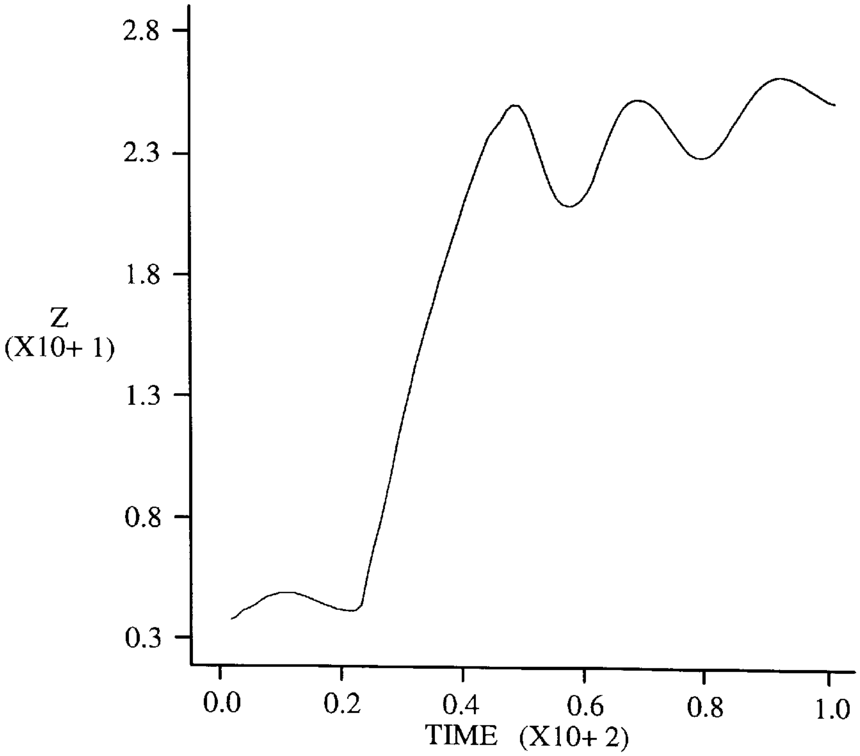
Figure 11F:
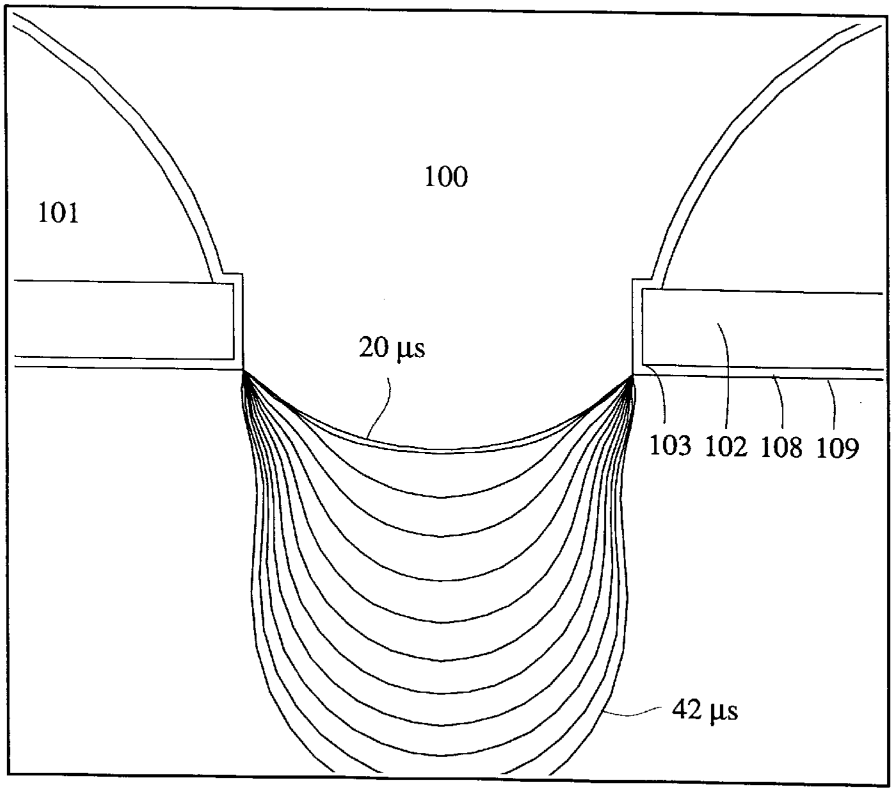
Figure 11G:
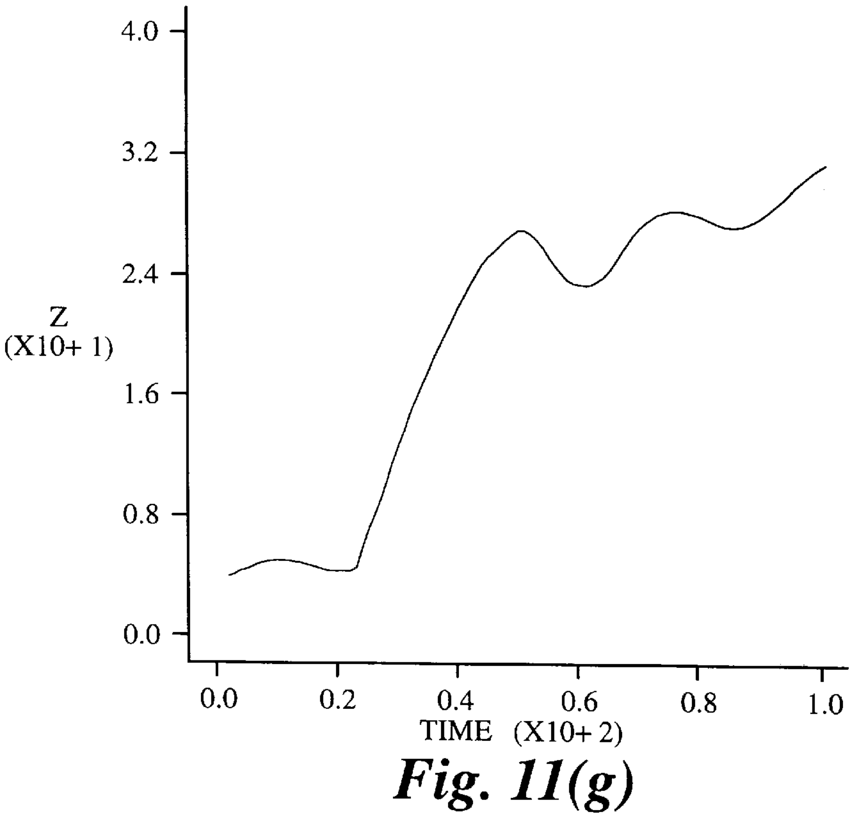
Figure 11H:
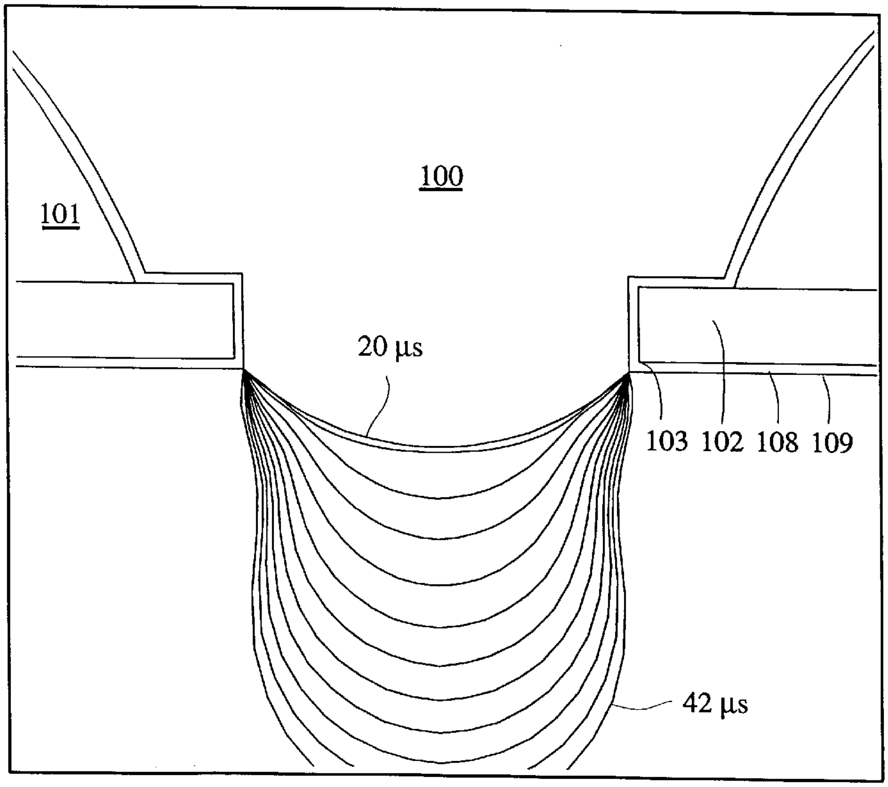
Figure 11I:
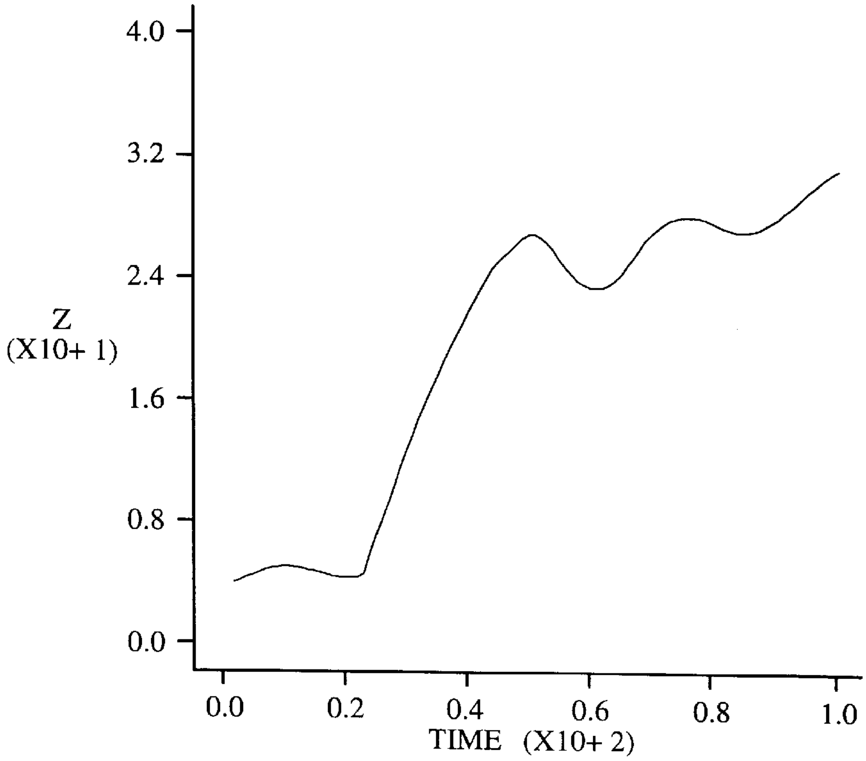
Figure 11J:
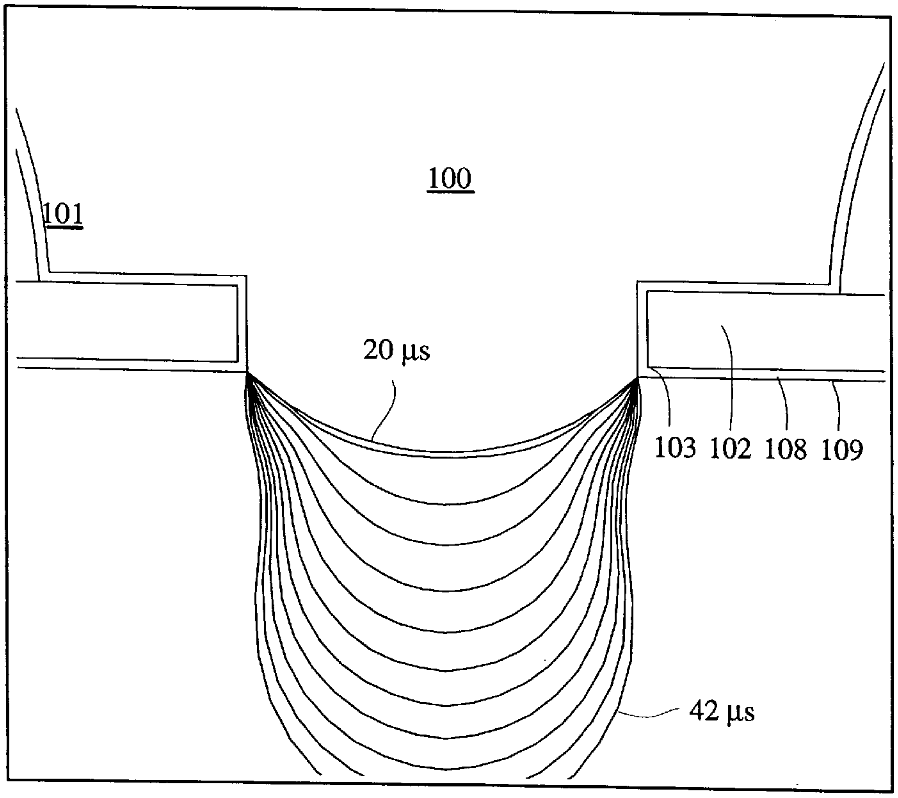

FIG. 7 is a simplified view of a portion of a print head, seen from the back surface of the chip, and cut through some of the nozzles. The substrate 120 can be made from a single silicon crystal. Nozzles 121 are fabricated in the substrate, e.g., by semiconductor photolithography and chemical wet etch or plasma etching processes. Ink enters the nozzle at the top surface of the head, passes through the substrate, and leaves via the nozzle tip 123. Planar fabrication of the heaters and the drive circuitry is on the underside of the wafer; that is, the print head is shown 'upside down' in relation the surface upon which active circuitry is fabricated. The substrate thickness 124 can be that of a standard silicon wafer, approximately 650 $\mu$m. The head width 125 is related to the number of colors, the arrangement of nozzles, the spacing between the nozzles, and the head area required for drive circuitry and interconnections. For a monochrome head, an appropriate width would be approximately 2 mm. For a process color head, an appropriate width would be approximately 5 mm. For a CC'MM'YK color print head, the appropriate head width is approximately 8 mm. The length of the head 126 depends upon the application. Very low cost applications may use short heads, which must be scanned over a page. High speed applications can use fixed page-width monolithic or multi-chip print heads. A typical range of lengths for print heads is between 1 cm and 21 cm, though print heads longer than 21 cm are appropriate for high volume paper or fabric printing.

Self-aligned print head manufacturing using anisotropic wet etches

The manufacture of monolithic printing heads is similar to standard silicon integrated circuit manufacture. However, the normal process flow are modified in several ways. This is essential to form the nozzles, the barrels for the nozzles, the heaters, and the nozzle tips. There are many different semiconductor processes upon which monolithic head production can be based. For each of these semiconductor processes, there are many different ways the basic process can be modified to form the necessary structures.

To reduce the cost of establishing factories to produce heads, it is desirable to base the production on a simple process. It is also desirable to use a set of design rules which is as coarse as practical. This is because equipment to produce fine line widths is more expensive, and requires a cleaner environment to achieve equivalent yields.

To minimize the capital cost of small volume manufacturing runs it is desirable that the additional processing steps needed to form the nozzles can be achieved with low capital investment. This patent describes a manufacturing process where nozzle formation is achieved mainly using anisotropic wet etch processes. As a result, expensive plasma etching equipment is not required.

The process described herein is based on standard semiconductor manufacturing processes, and can use equipment designed for 1.5 μm line widths. The use of lithographic equipment which is essentially obsolete (at the time of writing, the latest production IC manufacturing equipment is capable of 0.25 μm line widths) can substantially reduce the cost of establishing factories for the production of heads.

It is also not necessary to use a low power, high speed process such as VLSI CMOS. The speeds required are moderate, and the power consumption is dominated by the heater power required for the ink jet nozzles. Therefore, a simple technology such as NMOS is adequate. However, CMOS is likely to be the most practical production solution, as there is a significant amount of idle CMOS manufacturing capability available with line widths between 1 μm and 2 μM.

Suitable basic manufacturing processes

The manufacturing steps required for fabricating nozzles can be incorporated into many different semiconductor processing systems. For example, it is possible to manufacture print heads by modifying the following technologies:

1) nMOS
2) pMOS
3) CMOS
4) Bipolar
5) ECL
6) Various gallium arsenide processes
7) Thin Film Transistors (TFT) on glass substrates
8) Micromechanical fabrication without active semiconductor circuits The choice of the base technology is largely independent of the ability to fabricate nozzles. The method of incorporation of nozzle manufacturing steps into semiconductor processing procedures which have not yet been invented is also likely to be obvious to those skilled in the art. The simplest fabrication process is to manufacture the nozzles using silicon micromechanical processing, without fabricating active semiconductor devices on the same wafer. However, this approach is not practical for heads with large numbers of nozzles, as at least one external connection to the head is required for each nozzle. For large heads, it is highly advantageous to fabricate drive transistors and data distribution circuits on the same chip as the nozzles.

CMOS is currently the most popular integrated circuit process. At present, many CMOS processes are in commercial use, with line widths as small as 0.35 μm being in common use. CMOS offers the following advantages for the fabrication of heads:

1) Well known and well characterized production process.
2) Quiescent current is almost zero
3) High reliability
4) High noise immunity
5) Wide power supply operating range
6) Reduced electromigration in metal lines
7) Simpler circuit design of shift registers and fault tolerance logic
8) The substrate can be grounded from the front side of the wafer.

CMOS has, however, some disadvantages over nMOS and other technologies in the fabrication of heads which include integrated drive circuitry. These include:

1) A large number of processing steps are required to simultaneously manufacture high quality NMOS and PMOS devices on the same chip.
2) CMOS is susceptible to latchup. This is of particular concern due to the high currents at a voltage typically greater than Vdd that are required for the heater circuits.
3) Like other MOS technologies, CMOS is susceptible to electrostatic discharge damage. This can be minimized by including protection circuits at the inputs, and by careful handling.

There is no absolute 'best' base manufacturing process which is applicable to all possible configurations of printing head. Instead, the manufacturing steps which are specific to the nozzles should be incorporated into the manufacturer's preferred process. In most cases, there will need to be minor alterations to the specific details of nozzle manufacturing steps to be compatible with the existing process flow, equipment used, preferred photoresists, and preferred chemical processes. These modifications are obvious to those skilled in the art, and can be made without departing from the scope of the invention.

Layout example

FIG. 8(*a*) shows an example layout for a section of an 800 dpi four color head. The nozzle pitch for 800 dpi printing is 31.75 μm. FIG. 8(*a*) shows four rows of nozzles, for cyan, magenta, yellow, and black inks. Each of these four rows contains four parallel ink channels. The ink channels are etched almost through the wafer and each contains 64 nozzles. Two ink channels are for the main nozzles, and two ink channels are for the redundant nozzles. The nozzles are spaced by two pixel widths (63.5 μm) along each ink channel. The nozzles in one of the two main ink channels for each color are offset by one pixel width (31.75 μm) from the nozzles in the other main ink channel. The redundant nozzles are arranged in an identical manner, but offset in the print direction. The ink channels do not extend the entire length of the print region of the print head, as this would mechanically weaken the print head too much. Instead, ink channels containing 64 nozzles are staggered in the print direction. Using a staggered array of nozzles such as this requires that the data be provided to drive the nozzles in such a manner as to compensate for the nozzle offsets. This can be achieved by digital circuitry which reads the page image from memory in the appropriate order and supplies the data to the print head.

Rectangular regions 100 μm wide and 200 μm long are shown along the short edge chip layout. These are bonding pads for data, clocks, and logic power and ground. The $V^+$ and $V^-$ bonding pads extend along the entire two long edges of the chip, and are 200 μm wide.

FIG. 8(*b*) is a detail enlargement of the ink channels and nozzles for one color of the print head shown in FIG. 8(*a*). The distance 4,064 mm is 64 times the nozzle spacing in a channel (63.5 μm). The distance 8,128 μm is 128 times the nozzle spacing in a channel. The distance 6790.6 μm is 4064 μm plus 2*(1260 μm+(50 μm/tan 70.52°)+(50 μm/tan 54.74°)+50 μm tolerance). The 50 μm tolerance is required because the wafer thickness may vary by as much as 25 μm.

FIG. 8(*c*) is a detail enlargement of the end of a single ink channel. The angles shown are due to the anisotropic etching process, and result from the orientation of the {111} crystallographic planes. The distance from full wafer thickness to the point at the bottom of the ink channel is 1260 μm. This results from a (111) crystallographic plane which is at an angle of $\tan^{-1}(0.5)=26.57°$ to the wafer surface. To achieve a required etch depth of 630 μm, an extra length of 1260 μm must be provided at the ends of the slot to be etched.

FIG. 8(*d*) is a detail enlargement of two of the nozzles shown in FIG. 8(*c*). The nozzle radius is 10 μm, therefore the nozzle diameter is 20 μm. The nozzle barrel is shown as a dotted line. The nozzle barrel does not have a well defined radius, as it is formed by a boron diffusion etch stop for KOH etching. The distance from the edge of the nozzle to the edge of the ink channel is 15 μm. This is because the surface of the wafer is typically not perfectly aligned to the (110) crystallographic plane, but may vary by as much as ±1°. A 1° tilt of the {111} crystallographic planes will result in the bottom of the ink channels being displaced 630 μm*tan 1°=11 μm from the backface mask location.

The line from A to B in FIG. 8(*d*) is the line through which the cross section diagrams of FIG. 9 are taken. This line includes a heater connection on the "A" side, and goes through a 'normal' section of the heater on the "B" side.

Alignment to crystallographic planes

The manufacturing process described herein uses the crystallographic planes inherent in the single crystal silicon wafer to control etching. The orientation of the masking procedures to the {111} planes must be precisely controlled. The orientation of the primary flats on a silicon wafer are normally only accurate to within ±1° of the appropriate crystal plane. It is essential that this angular tolerance be taken into account in the design of the mask and manufacturing processes. For example, if a groove is to be etched along the long edges of a 215 mm print head, then a 1° error in the alignment of the wafer to the {111} planes controlling the etch rates will result in a 3,752 μm error in the width of the groove, given sufficient etch time. An alignment error of ±0.1° or less is required. This can be achieved by etching a test groove in an area of the wafer which is unused. The groove should be long, and aligned to a (111) plane using the primary flat to align the wafer. The test groove is then over-etched using a solution of 500 grams of KOH per liter of water at 50° C. to expose the {111} planes. This solution etches silicon approximately 400 times faster in <100> directions than <111> directions. Subsequent angular alignment can be made optically to this groove. Alternatively, the wafer can be etched clean through at the groove, which may extend to the edges of the wafer. This will produce another flat on the wafer, aligned with high accuracy to the chosen (111) plane. This flat can then be used for mechanical angular alignment.

The surface orientation of the wafer is also only accurate to ±1°. However, since the wafer thickness is only approximately 650 μm, a ±1° error in alignment of the surface contributes a maximum of 11.3 μm of positional inaccuracy when etching through the entire wafer thickness. This is accommodated in the design of the etch masks.

Manufacturing process summary

In general, the invention provides a manufacturing process for integrated printing heads. The print head integrates many nozzles into a single monolithic silicon structure. Semiconductor processing methods such as photolithography and chemical etching are used to simultaneously fabricate a multitude of nozzles into the monolithic head. The nozzles are etched through the silicon substrate, allowing two dimensional arrays of nozzles for color printing. The manufacturing process can be based on existing CMOS, nMOS and bipolar semiconductor manufacturing processes, allowing fabrication in existing semiconductor fabrication facilities. Drive transistors, shift registers, and fault tolerance circuitry can be fabricated on the same wafer as the nozzles.

The manufacturing process uses anisotropic wet etching using KOH on a (110) wafer to form ink channels with vertical side-walls. Nozzle barrels are formed using the same etching process, using boron as an etch stop. The etching follows the crystallographic planes of the silicon, which result in highly accurate and consistent etch angles using simple etching equipment. Wafer alignment to the (110) crystallographic plane is only required to be to the standard ±1°.

The manufacturing process has major advantages in not requiring long plasma etch times, as all long etch processes use wet etchants. This allows batch processing of the wafers using low cost etching baths. Also, individual etching time adjustments for each wafer are not required, as the manufacturing process has considerable tolerance of variations in etch rates and wafer thickness. Wafer thickness variations of 25 μm are accommodated, and the process can be designed for greater wafer thickness variation if required.

A summary of the preferred manufacturing method is shown in FIG. 9(*a*) to FIG. 9(*k*). This comprises the following major steps:

1) The first manufacturing step is the delivery of the wafers. Silicon wafers are highly recommended over other materials such as gallium arsenide, due to the availability of large, high quality wafers at low cost, the strength of silicon as a substrate, and the general maturity of fabrication processes and equipment.

The example manufacturing process described herein uses n-type wafers with (110) crystallographic orientation. The wafers should not be mechanically or laser gettered, as this will affect back surface etching processes. 150 mm (6") wafers manufactured to standard Semiconductor Equipment and Materials Institute (SEMI) specifications allow 25 mm total thickness variation. The process described herein accommodates this thickness variation during the etching process, so standard tolerance wafers can be used. At the time of writing, 200 mm (8") wafers are in use, and international standards are being set for 300 mm (12") silicon wafers. 300 mm wafers are especially useful for manufacturing heads, as pagewidth A4 (also US letter) print heads can be fabricated as a single chip on these wafers.

FIG. 9(*a*) shows a (110) n-type 300 mm wafer. The wafer shows 22 A4 print heads of 210 mm print length. Each print head chip is 215 mm long×8 mm wide. These print heads can be used for US letter or A4 size printing, or as components in multi-chip print heads for A3 printing, sheet fed or web fed digital printing presses, and cloth printing. The boundary of each chip is etched with a deep groove. This groove can be etched before or after the fabrication of the active devices, depending upon process flow for the active devices. However, it is recommended that the grooves be etched after most fabrication steps are complete to avoid problems with resist edge beading at the grooves.

FIG. 9(*b*) shows a cross section of the boundary groove along the short edges of the chip. Crystallographic planes of the {111} family control the etch direction, resulting in a slope of 26.56° in the groove.

FIG. 9(*c*) shows a cross section of the boundary groove along the long edges of the chip. Crystallographic planes of the {111} family control the etch direction, resulting in vertical sidewalls in the groove.

The grooves are preferred for proximity print heads, and are formed so that the electrical connections to the print head do not protrude beyond the surface of the chip. The etching of these grooves is best performed after the fabrication of the active devices on the chip, and is described in steps 5) and 6) below.

2) A boron etch stop is then diffused into the silicon. The etch stop is required only in the regions of the bottoms of the ink channels, and is masked from the nozzles by an oversize mask. Boron is diffused to a concentration of $10^{20}$ atoms per cubic centimeter, to a depth of 15 μm to 20 μm. FIG. 9(*d*) shows a cross section of wafer in the region of a nozzle tip after the boron doping stage.

3) The active devices are then fabricated using a prior art integrated circuit fabrication process with double layer metal. The prior art process may be nMOS, pMOS, CMOS, Bipolar, or other process. In general, the active circuits can be fabricated using unmodified processes. However, some processes will need modification to allow for the large currents which may flow though a head. As a large head may have in excess of 28 Amperes flowing through the heater circuits when fully energized, it is essential to prevent electromigration. Molybdenum can be used instead of aluminum for first level metal, as it is resistant to electromigration. However, as molybdenum requires sputtering, care must be taken not to damage underlying MOS or CMOS structures. The preferred method of preventing electromigration is the provision of very wide aluminum traces which form a grid over the surface of the print head. This approach does not require modification of the manufacturing process, but must be considered in the mask pattern design. The prior-art manufacturing process proceeds unaltered up to the stage of application of the inter-level dielectric.

4) Apply the inter-level dielectric. This can be 3 μm of CVD $SiO_2$.

5) Mask and etch the $SiO_2$ at the borders of the chips. A region of approximately 200 μm inside the edge of the chips is etched. This is the bonding pad region. V grooves are etched in the bonding region. When the wafer is diced, these grooves are sawed lengthwise, resulting in a chip with beveled edges. The bonding pads are formed on these bevels, allowing the chip to be bonded without bonding wires or TAB bonding extending above the chip front surface. This is important for close proximity printing, as the print head must be in close proximity (approximately 20 μm) to the recording medium or transfer roller. Conventional bonding methods would interfere with this proximity.

6) Etch the bonding pad grooves. The etch can be performed by an anisotropic wet etch, which etches the [100] crystallographic direction preferentially to the [111] direction. A solution of 440 grams of potassium hydroxide (KOH) per liter of water can be used for a very high preferential etch rate (approximately 400:1).

FIG. 9(*b*) shows a cross section of V groove at the short edge of the heads after this etching step.

FIG. 9(*c*) shows a cross section of the boundary groove along the long edges of the chip. Crystallographic planes of the {111} family control the etch direction, resulting in vertical sidewalls in the groove.

A 0.5 μm layer of CVD $SiO_2$ should be applied after etching the V grooves to insulate the bonding pads from the substrate.

7) Etch the inter-metal vias. In some cases, this step may be able to be combined with the etching of the $SiO_2$ to form the mask for V groove etching. As the inter-metal $SiO_2$ is much thicker than normal, tapering of the via sidewalls is recommended.

8) Application of second level metal. As with the first level metal, electromigration must be taken into account. Electromigration can be minimized by using large line-widths for all high current traces, and by using an aluminum alloy containing 2% copper. Molybdenum is not recommended due to the difficulty in bonding to molybdenum thin films. The step coverage of the second level metal is important, as the inter-level oxide is thicker than normal. Also, the vertical sidewalls of the $V^-$ and $V^+$ grooves along the long edges of the chips must be coated. Adequate step coverage is possible by using low pressure evaporation. Via step coverage can be improved by placing vias only to areas where the first level metal covers field oxide. The preferred process is the deposition by low pressure evaporation of 1 mm of 98% aluminum, 2% copper.

9) Mask and etch second level metal. Special attention to masking and etching of the bonding pads is required if the print head is to be used for close proximity printing, as they are fabricated in the V grooves. This introduces two problems: the resist thickness will be greater in the bottom of the V grooves, and the mask will be out of focus. This does not pose a problem for the long edges of the chip, as these are dedicated to the $V^+$ and $V^-$ power rails, and are not patterned. Bonding pads fabricated on the short edges of the chip should be separated by at least 100 μm. No active circuitry or fine geometry lines should be located in the V grooves. FIG. 9(*e*) shows a cross section of the wafer in the region of a nozzle after this step.

10) Form the heater. The heater material (for example 0.05 μm of TaAl alloy, or refractory materials such as $HfB_2$ or $ZrB_2$) can be applied by low pressure evaporation or sputtering. As the heater is planar, masking and etching is straightforward. The heater is masked as a disk rather than an annulus. The centre of the disk is later etched during the nozzle formation step. This is to ensure excellent alignment between the heater and the nozzle. Heater radius should be controlled to finer tolerance than is generally available in a 1.5 μm process, and the use of a stepper for 0.5 μm process is recommended. FIG. 9(*f*) shows a cross section of the wafer in the region of a nozzle after this step.

11) Apply a protective coating of $Si_3N_4$. This is applied to the front face of the wafer only, and should be at least 0.1 μm thick to protect the front face of the wafer from attack by the long wet-etch of the back face of the wafer. FIG. 9(*g*) shows a cross section of the wafer in the region of a nozzle after this step.

12) Mask the back surface of the wafer. $Si_3N_4$ is used as a mask, as resist is attacked by the wet etching solution, and the etch rate of $SiO_2$ is too high (approx. 20 Å/minute) for effective use as a mask. The etch rate of $Si_3N_4$ is approximately 14 Å/hour. Apply a 0.5 μm layer of $Si_3N_4$, to the back surface of the wafer, followed by spin coating with 0.5 μm of resist. Expose and develop the resist on the back surface of the wafer using a mask of the ink channels. Alignment is taken from the front surface of the wafer by modified alignment optics of the lithography equipment. Alignment of this step is not critical, and can be performed to an accuracy of approximately ±4 μm. The $Si_3N_4$ is then etched and the resist is stripped.

13) Etch the ink channels. This is performed by a wet etch of the silicon using a solution of potassium hydroxide in water. The advantage of a wet etch over an anisotropic plasma etch is very low equipment cost, combined with highly accurate etch angles determined by crystallographic planes. The etchant exposes the {111} planes. Four of these planes are oriented at an angle of 90° to the wafer surface. The ink channels are oriented parallel to two of these parallel planes so that the {111} planes define the vertical sidewalls of the ink channels. A further two {111} planes are oriented at an angle of 26.56° to the wafer surface in the plane of the ink channels, and limit the etch depth of the ink channels. For this reason, the ink channel mask must be made longer than the required channel length, so that the full etch depth is attained where required in the ink channel. Etch the wafer in a 50% solution of KOH in water at 80° C. The etch rate is approximately 0.8 μm/minute, and an etch depth of 620 μm is required, so the etch duration should be around 12.9 hours. The exact time is not critical, due to the boron etch stop. The etch at this stage is a bulk silicon etch which should stop shortly before the boron etch stop is reached. The main purpose of this etching step is to reduce the silicon thickness in the ink channels, so that the etch step which defines the nozzle barrels using the boron etch stop is much shorter, and does not significantly etch the $SiO_2$ at the nozzle tip. FIG. 9(*h*) is a perspective view of some of the ink channels after etching. This view is from the back surface of the wafer. FIG. 9(*i*) shows a cross section of the wafer in the region of a nozzle after this step. The ink channel etched into the silicon from the rear of the wafer appears asymmetrical because the line A to B is not straight: at the A side the cross section is perpendicular to the ink channel, and at the B side the cross section runs along the ink channel. The $Si_3N_4$ masking layer should not be stripped.

14) Mask the nozzle tip using resist. This must be performed accurately, as the alignment of the nozzle tip to the heater, and the radius of the nozzle tip, both affect drop ejection performance. These parameters should be controlled to an accuracy of better than 0.5 μm, and preferably better than 0.3 μm. FIG. 9(*j*) shows a cross section of the wafer in the region of a nozzle after this step.

15) Etch the nozzle tip. The first step is the etching of the $Si_3N_4$ layer. The second step is etching the heater. As the heater is very thin, a wet etch can be used. The third step is the etching of the $SiO_2$ forming the nozzle tip. This should be etched with an anisotropic etch, for example an RIE etch using $CF_4$—$H_2$ gas mixture. The etch is down to silicon in the nozzle region. The resist is then stripped. FIG. 9(*k*) shows a cross section of the wafer in the region of a nozzle after this step.

16) Etch the nozzle barrels. This is also performed by a wet etch of the silicon using KOH. Etching proceeds from both sides of the wafer at the same time, with etching from the rear occurring through the ink channels, and etching from the front occurring through the nozzle tip. Approximately 20 μm of silicon thickness must be etched, 10 μm from each side. However, as the boron etch stop controls the geometry of the final nozzle barrel, etch time is not critical, and should be substantially longer than the minimum etch time to accommodate 25 μm variations in wafer thickness and variable etch rates. Etch the wafer in a 50% solution of KOH in water at 80° C. for 1 hour. FIG. 9(*l*) is a perspective view of some of the nozzle barrels in two of the ink channels after this step. This view is from the back surface of the wafer, looking down into two adjacent ink channels. The circular apertures are the nozzle tips. The arrangement is for a 800 dpi printer with 31.75 μm pixel spacing. The nozzles in each channel are spaced at 63.5 μm, and are offset between the two channels by 31.75 μm. The diameter of the nozzle tip is 20 μm. The line A to B is the line of the cross sections in FIG. 9., as shown in FIG. 8(*d*). FIG. 9(*m*) shows a cross section of the wafer in the region of a nozzle after this step.

17) Form the passivation layer. As the monolithic head is in contact with heated water based ink during operation, effective passivation is essential. A 0.5 μm conformal layer of $Si_3N_4$ applied by PECVD can be used. Use $SH_4$ at 200 sccm and $NH_3$ at 2000 sccm, pressure of 1.6 torr, temperature of 250° C., at 46 watts for 50 minutes. FIG. 9(*n*) shows a cross section of the wafer in the region of a nozzle after this step.

18) A hydrophobic surface coating may be applied at this stage, if the coating chosen can survive the subsequent processing steps. Otherwise, the hydrophobic coating should be applied after TAB bonding. There are many hydrophobic coatings which may be used, and many methods which may be used to apply them. By way of illustration, one such suitable coating is fluorinated diamond-like carbon (F*DLC), an amorphous carbon film with the outer surface substantially saturated with fluorine. A method of applying such a film using plasma enhanced chemical vapor deposition (PECVD) equipment is described in U.S. Pat. No. 5,073,785. It is not essential to apply a separate hydrophobic layer. Instead, the exposed dielectric layer can be treated with a hydrophobizing agent. For example, if $SiO_2$ is used as the passivation layer in place of $Si_3N_4$, the device can be treated with dimethyldichlorosilane to make the exposed $SiO_2$ hydrophobic. This will affect the entire nozzle, unless the regions which are to remain hydrophilic are masked, as dimethyldichlorosilane fumes will affect any exposed $SiO_2$.

The application of a hydrophobic layer is required if the ink is water based, or based on some other polar solvent. If the ink is wax based or uses a non-polar solvent, then the front surface of the head should be lipophobic. In summary, the front surface of the head should be fabricated or treated in such a manner as to repel the ink used. When using the physical device configuration disclosed herein, the hydrophobic layer need not be limited to the front surface of the device. The entire device may be coated with a hydrophobic layer (or lipophobic layer is non-polar ink is used) without significantly affecting the performance of the device. If the entire device is treated with an ink repellent layer, then the nozzle radius should be taken as the inside radius of the nozzle tip, instead of the outside radius.

19) Bond, package and test. The bonding, packaging, and testing processes can use standard manufacturing techniques. Bonding pads must be opened out from the $Si_3N_4$ passivation layer. Although the bonding pads are fabricated at an angle in the V groove, no special care is required to mask them, as the entire V groove area can be stripped of $Si_3N_4$. After the bonding pads have been opened, the resist must be stripped, and the wafer cleaned. Then wafer testing can proceed. Then the wafer is diced. The wafers should be sawed instead of scribed and snapped, to prevent breakage of long heads, and because the wafer is weakened along the nozzle rows. The diced wafers (chips) are then mounted in the ink channels. For color heads, the separate ink channels are sealed to the chip at this stage. After mounting, the chip is bonded, and dry device tests performed. The device is then be connected to the ink supply, ink pressure is applied, and functional testing can be performed. FIG. 9(0) shows a cross section of the wafer in the region of a nozzle after this step.

In FIG. 9(*a*) to FIG. 9(*o*), 100 is ink, 101 is silicon, 102 is CVD $SiO_2$,103 is the heater material, 105 is boron doped silicon, 106 is the second layer metal interconnect (aluminum), 107 is resist, 108 is silicon nitride ($Si_3N_4$) and 109 is the hydrophobic surface coating.

Alternative fabrication processes

Many other manufacturing processes are possible. The above manufacturing process is not the simplest process that can be employed, and is not the lowest cost practical process. However, the above process has the advantage of fabrication of high performance data distribution devices and drive transistors on the same wafer as the nozzles. The process is also readily scalable, and 1 mm line widths can be used if desired.

The use of 1 μm line widths (or even finer geometries) allows more circuitry to be integrated on the wafer, and allows a reduction in either the size or the on resistance (or both) of the drive transistors. The smaller device geometries can be used in the following, or a combination of the following, ways:

1) To reduce the width of the monolithic head
2) To increase the yield of the head, by incorporating more sophisticated fault tolerance circuitry
3) To increase the number of nozzles on the head without increasing chip area.
4) To increase the resolution of the print head by more closely spacing the nozzles in terms of the linear dimensions.
5) To incorporate more of the total system circuitry on the chip. For example, data phasing circuits can be incorporated on chip, and the head can be supplied with a standard memory interface, via which it acquires the printing data by direct memory access.

It is possible to alter the nozzle formation processes in many ways. For example, it is possible to create the heater using a self-aligned vertical technique instead of the planar heater formation described herein.

The process described herein is a preferred process for production of printing heads as it allows high resolution, full color heads to incorporate drive circuitry, data distribution circuitry, and fault tolerance, and can be manufactured with relatively low cost extensions to standard CMOS production processes. Many simpler head manufacturing processes can be derived. In particular, heads which do not include active circuitry may be manufactured using much simpler processes.

An example of a small portion of a print head incorporating nMOS drive circuitry is shown is FIG. 11.

FIG. 11(*a*) shows a possible nozzle placement for a small section of one color of an 800 dpi print head. There are four rows of nozzles shown, spaced at 6 pixel widths (190.5 μm). Two of the rows are for main nozzles, and two of the rows are for redundant nozzles. The nozzles in each row are spaced at two pixel widths (63.5 μm), and offset from the adjacent row by one pixel width (31.75 μm).

FIG. 11(*b*) is a detail enlargement of a small section of FIG. 11(*a*), showing three nozzles in one row. The diagram shows the nozzle 200, drive transistor 201, and inverting buffer 216. FIG. 11(*b*) shows wide vertical aluminum leads carrying the $V^+$ and $V^-$ power supplies.

The arrangement shown is only one of many possible arrangements, and other arrangements can be readily derived without departing from the scope of the invention.

Fluid dynamic simulations of nozzle barrel variations

Using the manufacturing process disclosed herein, the nozzle tip radius, shape and thickness can be accurately and reproducible defined. However, the geometric accuracy of the region directly behind the nozzle tip, herein called the nozzle barrel, is not so accurately formed. This is because the degree of silicon removed by etching in this region depends upon the local concentration of diffused boron used as an etch stop. It is difficult to control the exact concentration profile of boron, and therefore the shape of the nozzle barrel. However, this inaccuracy is of little significance.

Simulations of wide variations of nozzle barrel shape and dimensions show that these variations have little affect on the performance of print head nozzles. Fluid dynamic simulations of print head nozzles have been performed assuming manufacture of the nozzles by various techniques, and with various resulting geometries. These simulations maintain all parameters other than nozzle barrel geometry constant.

The main effect of variation in nozzle barrel geometry is a small change in the amount of viscous drag exerted on the ink by the nozzle barrel interior surface. The drop size resulting from a given heat pulse is slightly larger for wider nozzle barrels. Another affect of nozzle barrel variations is a change to the thermal resistance from the nozzle heater region to the bulk substrate. This has a small affect on the rate of temperature rise with successive nozzle actuations. If too much silicon is removed from the nozzle barrel regions, the maximum rate of nozzle actuation may decrease.

FIGS. 11(*a*) to 11(*j*) show summarized results of fluid dynamic simulations performed using the FIDAP simulation software. In each case the simulation is over a duration of 100 μs, in 0.1 μs steps. The nozzle tip is cylindrical, with a radius of 10 μm. The ink pressure is 7.7 kPa, and the ambient temperature is 30° C. At the beginning of the simulation the ink meniscus is near its quiescent position, and all velocities are zero. A time varying power pulse is applied to the heater, starting at 20 μs, for a duration of 18 μs. The pulse starts at 20 μs to allow time for the ink meniscus to reach the quiescent position before the drop selection pulse. The barrel geometries for the various figures are as follows:

1) The nozzle barrel modeled in FIG. 11(*a*) and 11(*b*) is a shape resulting from anisotropic etching of (100) silicon using a wet etch process. The walls of the nozzle barrel are defined by {111} crystallographic planes, and form a truncated pyramid. In this simulation, the nozzle barrel is modeled as a truncated cone, as the model is axisymmetric.
2) The nozzle barrel modeled in figure 11(*c*) and 11(*d*) is a shape resulting from anisotropic etching of silicon using plasma etching.
3) The nozzle barrel modeled in FIG. 11(*e*) and 11(*f*) is a shape resulting from etching of silicon using potassium hydroxide wet etching with etching controlled by a diffused boron etch stop. The silicon up to 1 μm away from the nozzle tip is protected from etching by high boron concentrations.
4) The nozzle barrel modeled in FIG. 11(*g*) and 11(*h*) is a shape resulting from etching of silicon using potassium hydroxide wet etching with etching controlled by a diffused boron etch stop. The silicon up to 5 μm away from the nozzle tip is protected from etching by high boron concentrations.
5) The nozzle barrel modeled in FIG. 11(*i*) and 11(*j*) is a shape resulting from etching of silicon using potassium hydroxide wet etching with etching controlled by a diffused boron etch stop. The silicon up to 10 μm away from the nozzle tip is protected from etching by high boron concentrations.

Only the drop selection process is modeled in these simulations. The drop separation process may be proximity, electrostatic, or other means. Separation of the selected drop from unselected drops relies upon a physical difference in meniscus position between the selected drop and the unselected drops. An axial difference of 15 $\mu$m between the position of the centre of the meniscus before and after the drop selection pulse is adequate for drop separation.

FIGS. 11(*a*), 11(*c*), 11(*e*), 11(*g*), and 11(*i*) are graphs of the position of the centre of the meniscus versus time for various barrel geometries. The vertical axis is in units of 10 $\mu$m, and the horizontal axis is in units of 100 $\mu$s. Visual comparison of these graphs should take into account the variation of vertical scale between the graphs. The important characteristic is the attainment of a meniscus position of approximately 20 $\mu$m, at which point the drop separation means (not simulated in these simulations) can ensure that selected drops are separated from the body of ink and transferred to the recording medium. Oscillations of the meniscus after the drop selection pulse is removed are due to the initial non-spherical nature of the exuded drop: the drop oscillates between an initial prolate form, through a spherical form, to an oblate form, and back again. These variations are unimportant, as the drop separation means becomes the dominant determining factor of ink meniscus position after drop selection.

FIGS. 11(*b*), 11(*d*), 11(*f*), 11(*h*), and 11(*j*) are plots of the meniscus shape at various instants for various nozzle barrel geometries. The meniscus positions are shown at 2 $\mu$s intervals from the start of the drop selection pulse at 20 $\mu$s to 4 $\mu$s after the end of the 18 $\mu$s pulse, at 42 $\mu$s. In FIGS. 11(*b*), 11(*d*), 11(*f*), 11(*h*), and 11(*j*)), 100 is ink, 101 is the silicon substrate, 102 is $SiO_2$, 103 marks the position of one side of the annular heater, 108 is a $Si_3N_4$ passivation layer and 109 is a hydrophobic surface coating. Although the plots are labeled 'Temperature contour plot', there are no temperature contours shown.

It can be seen from the simulation results shown in FIG. 11 that the nozzle barrel geometry can vary significantly while having no significant affect on the drop selection process. This shows that the degree of control over diffused boron concentrations required to manufacture nozzles using the manufacturing method disclosed herein is well within the capabilities of modem semiconductor processes and equipment.

The foregoing describes a number of preferred embodiments of the present invention. Modifications, obvious to those skilled in the art, can be made thereto without departing from the scope of the invention.

I claim:

1. A process for manufacturing a thermally activated drop on demand printing head comprising the steps of:

(a) doping a print head substrate with an etch stopping material in a manner defining a plurality of undoped nozzle regions; and (b) etching said substrate to form a plurality of nozzle passages defined by the doped substrate material.

2. A drop on demand print head manufactured by the process of claim 1, said print head further comprising a silicon substrate having a plurality of spaced nozzle passages defined at last in part by surrounding substrate material having an etch stopping material doped therein.

3. The invention defined in claim 2 further comprising at least one anisotropically etched ink channel formed in a backside of said substrate, connecting and connecting to said nozzle passages.

4. The invention defined in claim 3 a dielectric layer formed on a frontside of said substrate and having a plurality of nozzle tip positions formed therethrough respectively in communication with said passages.

5. The invention defined in claim 4 further comprising a plurality of annular heater elements respectively deposited on said dielectric layer, spaced from said substrate and in coaxial alignment around respective nozzle tip portions.

6. The invention defined in claim 2 wherein the print head comprises:

(a) a plurality of drop-emitter nozzles;

(b) a body of ink associated with said nozzles;

(c) a pressurizing device adapted to subject ink in said body of ink to a pressure of at least 2% above ambient pressure, at least during drop selection and separation to form a meniscus with an air/ink interface;

(d) drop selection apparatus operable upon the air/ink interface to select predetermined nozzles and to generate a difference in meniscus position between ink in selected and non-selected nozzles; and (e) drop separation apparatus adapted to cause ink from selected nozzles to separate as drops from the body of ink, while allowing ink to be retained in non-selected nozzles.

7. The invention defined in claim 2 wherein the print head comprises:

(a) a plurality of drop-emitter nozzles;

(b) a body of ink associated with said nozzles, said body of ink forming a meniscus with an air/ink interface at each nozzle;

(c) drop selection apparatus operable upon the air/ink interface to select predetermined nozzles and to generate a difference in meniscus position between ink in selected and non-selected nozzles; and (d) drop separation apparatus adapted to cause ink from selected nozzles to separate as drops from the body of ink, while allowing ink to be retained in non-selected nozzles, said drop selection apparatus being capable of producing said difference in meniscus position in the absence of said drop separation apparatus.

8. The invention defined in claim 2 wherein the print head comprises:

(a) a plurality of drop-emitter nozzles;

(b) a body of ink associated with said nozzles, said body of ink forming a meniscus with an air/ink interface at each nozzle and said ink exhibiting a surface tension decrease of at least 10 mN/m over a 30° C. temperature range;

(c) drop selection apparatus operable upon the air/ink interface to select predetermined nozzles and to generate a difference in meniscus position between ink in selected and non-selected nozzles; and (d) drop separation apparatus adapted to cause ink from selected nozzles to separate as drops from the body of ink, while allowing ink to be retained in non-selected nozzles.

9. A process for manufacturing a thermally activated drop on demand printing head said process including the following process steps;

(a) doping a print head substrate with an etch stopping material;

(b) forming a surface layer on the front surface of said substrate;

(c) anisotropically etching one or more ink channels from the back surface of said substrate;

(d) etching a plurality of nozzle tip holes through said surface layer; and (e) etching a plurality of barrel holes which provide communicable passage between said ink channels and said nozzle tip holes, whereupon the radius of said barrel holes is determined in part by the implanted pattern of said etch stop material.

10. A process as claimed in claim 9 wherein said substrate is composed of single crystal silicon.

11. A process as claimed in claim 9 wherein said substrate is a single crystal silicon wafer of (110) crystallographic orientation.

12. A process as claimed in claim 9 wherein said surface layer is composed of silicon dioxide.

13. A process as claimed in claim 9 wherein said nozzle tip hole is fabricated with a radius less than 50 microns.

14. A process as claimed in claim 9 wherein said substrate is composed of single crystal silicon, and said ink channels are etched exposing (111) crystallographic planes of said substrate.

15. A process as claimed in claim 9 wherein the etchant used for said anisotropic etching includes potassium hydroxide.

16. A process as claimed in claim 9 wherein said substrate is composed of single crystal silicon and said etch stop comprises boron doping of said substrate.

17. A process as claimed in claim 1 further comprising fabricating drive circuitry on the same substrate as the nozzles.

* * * * *